US006958206B2

(12) United States Patent
Tsuchimura et al.

(10) Patent No.: US 6,958,206 B2
(45) Date of Patent: Oct. 25, 2005

(54) IMAGE RECORDING MATERIAL AND LITHOGRAPHIC PRINTING PLATE PRECURSOR

(75) Inventors: Tomotaka Tsuchimura, Shizuoka (JP); Ippei Nakamura, Shizuoka (JP); Tadahiro Sorori, Shizuoka (JP); Akihiro Endo, Shizuoka (JP); Tomoo Murakami, Shizuoka (JP)

(73) Assignee: Fuji Photo Film Co., Ltd., Kanagawa (JP)

( * ) Notice: Subject to any disclaimer, the term of this patent is extended or adjusted under 35 U.S.C. 154(b) by 24 days.

(21) Appl. No.: 10/359,711

(22) Filed: Feb. 7, 2003

(65) Prior Publication Data

US 2003/0207203 A1 Nov. 6, 2003

(30) Foreign Application Priority Data

| | | |
|---|---|---|
| Feb. 8, 2002 | (JP) | P.2002-032904 |
| Sep. 27, 2002 | (JP) | P.2002-283417 |
| Nov. 15, 2002 | (JP) | P.2002-332267 |
| Jan. 8, 2003 | (JP) | P.2003-001923 |

(51) Int. Cl.[7] .................. G03F 7/039

(52) U.S. Cl. .................. 430/270.1; 430/302; 430/494; 430/944; 430/945

(58) Field of Search .................. 430/138.1, 270.1, 430/281.1, 286.1, 302, 434, 494, 945

(56) References Cited

U.S. PATENT DOCUMENTS

| | | | | | |
|---|---|---|---|---|---|
| 6,117,613 | A | * | 9/2000 | Kawauchi et al. | 430/270.1 |
| 6,124,425 | A | | 9/2000 | Nguyen | |
| 2003/0165775 | A1 | * | 9/2003 | Endo et al. | 430/278.1 |
| 2003/0203313 | A1 | * | 10/2003 | Goto | 430/281.1 |

FOREIGN PATENT DOCUMENTS

| | | | | | |
|---|---|---|---|---|---|
| EP | 0 901 902 | A2 | * | 3/1999 | B41C/1/10 |
| EP | 0 950 516 | A1 | * | 10/1999 | B41C/1/10 |
| EP | 0 950 517 | B1 | | 10/2001 | |
| EP | 0 950 514 | B1 | | 11/2001 | |
| JP | 2000-35666 | A | | 2/2000 | |

* cited by examiner

*Primary Examiner*—Barbara L. Gilliam
(74) *Attorney, Agent, or Firm*—Sughrue Mion, PLLC

(57) ABSTRACT

An image recording material comprising (a) an infrared ray absorber and (b) a polymer to lower a dynamic coefficient of friction to from 0.38 to 0.60, which can undergo image formation upon exposure with infrared laser; or a long-chain alkyl group-containing polymer having a reduction rate of coefficient of friction to a base polymer of from 0.5 to 0.97, the polymer being a copolymer of a long-chain alkyl group-containing monomer having 6 or more carbon atoms and a hydrophilic monomer.

1 Claim, No Drawings

IMAGE RECORDING MATERIAL AND LITHOGRAPHIC PRINTING PLATE PRECURSOR

FIELD OF THE INVENTION

The present invention relates to an image recording material (element) and a lithographic printing plate precursor. In particular, the invention relates to an image recording material for infrared laser for so-called direct plate-making that makes it possible to undergo plate-making directly from digital signals of computers, and to a lithographic printing plate precursor using the image recording material.

BACKGROUND OF THE INVENTION

In recent years, the development of laser is remarkable. Particularly, with respect to solid lasers and semi-conductor lasers having a light emission region from near infrared rays to infrared rays, those having a high output and a small size become readily available. As an exposure light source during the plate-making directly from digital data from computers are very useful these lasers.

A positive-working lithographic printing plate precursor for infrared laser contains an alkaline aqueous solution-soluble binder resin and an infrared ray absorbing dye for absorbing light to generate heat (light-heat converting substance) and so on as essential components. In an unexposed area (image portion), the infrared ray absorbing dye and so on function as a dissolution inhibitor to substantially lower the solubility of the binder resin by the mutual action with the binder resin; and in an exposed area (non-image portion), the mutual action between the infrared ray absorbing dye and so on and the binder resin becomes weak by the generated heat, and the infrared ray absorbing dye and so on are dissolved in an alkaline developing solution, to form a lithographic printing plate.

However, in such a positive-working lithographic printing plate precursor for infrared laser, even in the case where the surface state slightly changes by, for example, touch on the surface thereof during the treatment, the unexposed area (image portion) is dissolved to form scars during the development, resulting in problems such as deterioration in printing resistance and poor ink acceptability.

Further, in the case of a negative-working lithographic printing plate precursor for infrared laser, there was a problem such that the scratch resistance of the recording layer in an unexposed state before curing is insufficient.

As means for solving the above-described problems, for example, U.S. Pat. No. 6,124,425 discloses examples of an alkali-soluble resin having an infrared ray absorbing functional group in the side chains thereof for the purpose of simply achieving the film strength (image strength). That is, it is intended to enhance the film strength by introducing a partial structure having a light-heat converting function into an alkali-soluble resin to reduce the components in the material. However, since the alkali-soluble resin is a polymer compound having a molecular weight of 5,000 or more, not only the adhesiveness to the support increases, but also the solubility in the processing agent during the development is insufficient. In particular, in the case where the alkali-soluble resin is used as a positive-working lithographic printing plate material, the solubility of the non-image portion is low, and the recording layer that should be removed is not sufficiently removed but becomes a residul film, resulting in a problem that the non-image portion is likely stained.

Further, it is known in JP-A-2000-35666(the term "JP-A" as used herein means an "unexamined published Japanese patent application") that the addition of a low-molecular weight wax enhances the surface slipperiness and realizes superior scratch resistance. However, since the wax has a low molecular weight, there are problems such as transfer of the wax to a protective paper (laminated paper) or the back surface of the support during the lamination of a lithographic printing plate precursor, and transfer of the wax to rollers during the manufacture of a lithographic printing plate precursor, leading to unstable factors during the manufacture or conveying.

Moreover, European Patent Nos. 950,514 and 950,517 propose examples of realizing the slipperiness by the addition of a polysiloxane-based surfactant. However, for the possibility of generation of scum and difficulty in controlling the slipperiness such as causing excessive slipping, there were unstable factors during the manufacture or conveying, too.

In addition, it may be considered to provide a protective layer on the recording layer. However, for example, in the case of providing a general protective layer using an aqueous resin, especially when used under a high humidity condition, the protective layer adheres to the support and hardly peels apart therefrom, resulting in lowering in the workability. In any means, the productivity was poor.

For these reasons, it has been demanded to realize a lithographic printing plate precursor that does not lower the workability, does not affect the image-forming properties, and can inhibit scars of the recording layer.

SUMMARY OF THE INVENTION

Accordingly, an object of the invention is to solve the foregoing problems and to provide an image recording material for the preparation of a lithographic printing plate having a wide latitude of development and scratch resistance and containing a slipping material and/or a surface protrusion (a scratch resistance-improving material) that is free from transfer to rollers and a protective paper (laminated paper) and the surface of a substrate during the manufacture or conveying, and a lithographic printing plate precursor using the image recoding material.

In order to achieve the foregoing object, the present inventor made extensive and intensive investigations. As a result, it has been found that the object can be achieved by using as a recording layer an image recording material containing a polymer to lower a dynamic (kinetic) coefficient of friction to from 0.38 to 0.60, leading to accomplishment of the invention. Specifically, the invention is as follows.

1. An image recording material comprising (a) an infrared ray absorber and (b) a polymer to lower a dynamic coefficient of friction to from 0.38 to 0.60, which can undergo image formation upon exposure with infrared laser.
2. A lithographic printing plate precursor comprising a support and a recording layer thereon, the recording layer containing (a) an infrared ray absorber, (c) a water-insoluble and alkali-soluble resin, and (d) a polymer having a structural unit represented by the following formula (IV), whose solubility in an alkaline aqueous solution increases upon exposure with infrared laser.

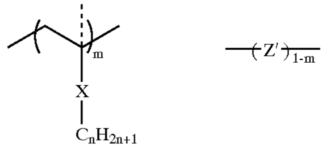

(IV)

In the formula (IV), the bond represented by the broken line means that a methyl group or a hydrogen atom is present in the end terminal thereof. Z' represents a monovalent hydrophilic group. Specific examples of Z' will be given below, but it should not be construed that the invention is limited thereto.

Examples of Z' include an acyloxy group having from 1 to 50 carbon atoms, an alkoxycarbonyloxy group having from 2 to 50 carbon atoms, an aryloxycarbonyloxy group having from 7 to 50 carbon atoms, a carbamoyloxy group having from 1 to 50 carbon atoms, a carbonamide group having from 1 to 50 carbon atoms, a carbamoyl group having from 1 to 50 carbon atoms, a sulfamoyl group having from 0 to 50 carbon atoms, an alkoxy group having from 1 to 2,000 carbon atoms, an aryloxy group having from 6 to 2,000 carbon atoms, an aryloxycarbonyl group having from 7 to 50 carbon atoms, an alkoxycarbonyl group having from 2 to 20 carbon atoms, an N-acylsulfamoyl group having from 1 to 50 carbon atoms, an N-sulfamoylcarbamoyl group having from 1 to 50 carbon atoms, an alkylsulfonyl group having from 1 to 50 carbon atoms (such as methanesulfonyl, octylsulfonyl, 2-methoxyethylsulfonyl, and 2-hexyldecylsulfonyl), an arylsulfonyl group having from 6 to 50 carbon atoms (such as benzenesulfonyl, p-toluenesulfonyl, and 4-phenylsulfonylphenylsulfonyl), an alkoxycarbonylamino group having from 2 to 50 carbon atoms, an aryloxycarbonylamino group having from 7 to 50 carbon atoms, an amino group having from 0 to 50 carbon atoms, an onium group having from 3 to 50 carbon atoms (such as ammonium, sulfonium, diazonium, iodonium, and iminium), a hydroxyl group, a sulfo group, a mercapto group, an alkylsulfinyl group having from 1 to 50 carbon atoms, an arylsulfinyl group having from 6 to 50 carbon atoms, an alkylthio group having from 1 to 50 carbon atoms, an arylthio group having from 6 to 50 carbon atoms, a ureido group having from 1 to 50 carbon atoms, an alkylsiloxy group having from 1 to 2,000 carbon atoms, an arylsiloxy group having from 6 to 2,000 carbon atoms, a phenol group (—Ar—OH), a sulfonamide group ($—SO_2NH—R$), a substituted sulfonamide-based acid group (hereinafter referred to as "active imido group") [such as $—SO_2NHCOR$, $—SO_2NHSO_2R$, and $—CONHSO_2R$], a carboxyl group ($—CO_2H$), a sulfonic acid group ($—SO_3H$), and a phosphoric acid group ($—OPO_3H_2$). These substituents may further be substituted. Examples of the substituents are those as enumerated herein.

In the formula (IV), X represents a divalent connecting (linking) group.

Examples of the divalent connecting group represented by X include a linear, branched, chain or cyclic alkylene group having from 1 to 20 carbon atoms; a linear, branched, chain or cyclic alkenylene group having from 2 to 20 carbon atoms; an alkynylene group having from 2 to 20 carbon atoms, an arylene group (monocyclic or heterocyclic ring) having from 6 to 20 carbon atoms; —OC(═O)—; —OC(═O)Ar—; —OC(═O)O—; —OC(═O)OAr—; —C(═O)NR—; —C(═O)NAr—; $—SO_2NR—$; $—SO_2NAr—$; —O— (alkylene oxy or polyalkylene oxy); —OAr— (arylene oxy or polyarylene oxy); —C(═O)O—; —C(═O)O—Ar—; —C(═O)Ar—; —C(═O)—; $—SO_2O—$; $—SO_2OAr—$; $—OSO_2—$; $—OSO_2Ar—$; $—NRSO_2—$; $—NArSO_2—$; —NRC(═O)—; —NArC(═O)—; —NRC(═O)O—; —NArC(═O)O—; —OC(═O)NR—; —OC(═O)NAr—; —NAr—; —NR—; $—N^+RR'—$; $—N^+RAr—$; $—N^+ArAr'$-; —S—; —SAr—; —ArS—; a heterocyclic group (such as 3- to 12-membered monocyclic or fused rings containing as a hetero atom at least one of nitrogen, oxygen, and sulfur); —OC(═S)—; —OC(═S)Ar—; —C(═S)O—; —O(═S)OAr—; —C(═S)OAr—; —C(═O)S—; —C(═O)SAr—; —ArC(═O)—; —ArC(═O)NR—; —ArC(═O)NAr—; —ArC(═O)O—; —ArC(═O)O—; —ArC(═O)S—; —ArC(═S)O—; —ArO—; and —ArNR—, wherein R and R' each represents a linear, branched, chain or cyclic alkyl group, an alkenyl group, or an alkynyl group; and Ar and Ar' each represents an aryl group.

The connecting group may be formed by combining two or more of the connecting groups as enumerated above. As the connecting group are preferable an arylene group (monocyclic or heterocyclic ring) having from 6 to 20 carbon atoms; —C(═O)NR—; —C(═O)NAr—; —O— (alkylene oxy or polyalkylene oxy); —OAr— (arylene oxy or polyarylene oxy); —C(═O)O—; —C(═O)O—Ar—; —C(═O)—; —C(═O)Ar—; —S—; —SAr—; —ArS—; —ArC(═O)—; —ArC(═O)O—; —ArC(═O)O—; —ArO—; and —ArNR—, and more preferable an arylene group (monocyclic or heterocyclic ring) having from 6 to 20 carbon atoms; —C(═O)NR—; —C(═O)NAr—; —O— (alkylene oxy or polyalkylene oxy); —OAr— (arylene oxy or polyarylene oxy); —C(═O)O—; —C(═O)O—Ar—; —SAr—; —ArS—; —ArC(═O)—; —ArC(═O)O—; —ArC(═O)O—; —ArO—; and —ArNR—.

The connecting group may have a substituent. Examples of the substituent include a linear, branched, chain or cyclic alkylene group having from 1 to 20 carbon atoms; a linear, branched, chain or cyclic alkenylene group having from 2 to 20 carbon atoms; an alkynylene group having from 2 to 20 carbon atoms; an arylene group having from 6 to 20 carbon atoms; an acyloxy group having from 1 to 20 carbon atoms; an alkoxycarbonyloxy group having from 2 to 20 carbon atoms; an aryloxycarbonyloxy group having from 7 to 20 carbon atoms; a carbamoyloxy group having from 1 to 20 carbon atoms; a carbonamide group having from 1 to 20 carbon atoms; a sulfonamide group having from 1 to 20 carbon atoms; a carbamoyl group having from 1 to 20 carbon atoms; a sulfamoyl group having from 0 to 20 carbon atoms; an alkoxy group having from 1 to 20 carbon atoms; an aryloxy group having from 6 to 20 carbon atoms; an aryloxycarbonyl group having from 7 to 20 carbon atoms; an alkoxycarbonyl group having from 2 to 20 carbon atoms; an N-acylsulfamoyl group having from 1 to 20 carbon atoms; an N-sulfamoylcarbamoyl group having from 1 to 20 carbon atoms; an alkylsulfonyl group having from 1 to 20 carbon atoms; an arylsulfonyl group having from 6 to 20 carbon atoms; an alkoxycarbonylamino group having from 2 to 20 carbon atoms; an aryloxycarbonylamino group having from 7 to 20 carbon atoms; an amino group having from 0 to 20 carbon atoms; an imino group having from 1 to 20 carbon atoms; an ammonio group having from 3 to 20 carbon atoms; a carboxyl group; a sulfo group; an oxy group; a mercapto group; an alkylsulfinyl group having from 1 to 20 carbon atoms; an arylsulfinyl group from 6 to 20 carbon atoms; an alkylthio group having from 1 to 20 carbon atoms; an arylthio group having from 6 to 20 carbon atoms; a ureido group having from 1 to 20 carbon atoms; a heterocyclic group having from 2 to 20 carbon atoms; an acyl group having from 1 to 20 carbon atoms; a sulfamoylamino group having from 0 to 20 carbon atoms; a silyl group having from 2 to 20 carbon atoms; a hydroxyl group; a halogen atom (such as a fluorine atom, a chlorine atom, and a bromine atom); a cyano group; and a nitro group.

From the viewpoints of the effect for improving the scratch resistance and influence against the solubility, m is preferably satisfactory with the relation of $0.2 \leqq m \leqq 0.95$, more preferably $0.25 \leqq m \leqq 0.85$, and most preferably $0.30 \leqq m \leqq 0.60$. n represents an integer of from 6 to 40, preferably from 10 to 30, and more preferably from 12 to 20.

As the hydrophilic group represented by Z' in the formula (IV), a skeleton having a hydroxyl group, a (poly)alkylene oxide group having from 1 to 2,000 carbon atoms, a (poly) arylene oxide group having from 6 to 2,000 carbon atoms, a phenol group, a sulfonamide group, an active imido group, a carboxyl group, or a sulfonic acid group is preferable from the viewpoint of thoroughly ensuring the solubility in the alkaline developing solution; a skeleton having a phenol group, a sulfonamide group, an active imido group, a carboxyl group, or a sulfonic acid group is more preferably from the viewpoint of the sensitivity; and a skeleton having a carboxyl group is most preferable. As X in the formula (IV), —C(═O)— is most preferable.

In addition, in order to achieve the foregoing object, the present inventor made extensive and intensive investigations. As a result, it has been found that the object can be achieved by using as a recording layer a heat mode image recording material containing a long-chain alkyl group-containing polymer having a reduction rate of coefficient of friction to the base polymer of from 0.5 to 0.97, the polymer being a copolymer of a long-chain alkyl group-containing monomer having 6 or more carbon atoms and a hydrophilic monomer, leading to accomplishment of the invention. Specifically, a second aspect of the invention is as follows.

3. An image recording material capable of undergoing image formation upon exposure with infrared laser, which comprises (a) an infrared ray absorber, (b) a base polymer and (c) a long-chain alkyl group-containing polymer having a reduction rate of coefficient of friction to the base polymer of from 0.5 to 0.97, and being a copolymer of a long-chain alkyl group-containing monomer having 6 or more carbon atoms and a hydrophilic monomer.
4. A lithographic printing plate precursor comprising a support having provided thereon a recording layer capable of undergoing image formation upon exposure with infrared laser, the recording layer containing (a) an infrared ray absorber, (b) a base polymer and (c) a long-chain alkyl group-containing polymer having a reduction rate of coefficient of friction to the base polymer of from 0.5 to 0.97, and being a copolymer of a long-chain alkyl group-containing monomer having 6 or more carbon atoms and a hydrophilic monomer.

According to the invention, an image recording material for infrared laser for so-called direct plate-making that makes it possible to undergo plate-making directly from digital signals of computers is obtained, and a lithographic printing plate having a wide latitude of development and scratch resistance and containing a scratch resistance-improving material that is free from transfer to rollers and a protective paper (laminated paper) and the surface of a substrate during the manufacture or conveying can be provided.

Though the action mechanism that the image recording material of the invention has scratch resistance and slipperiness has not been clarified yet, it is estimated that the polymer to lower a coefficient of friction is in the outermost surface layer of the image recording layer to lower the surface energy, thereby realizing proper slipperiness, so that resistance to scratch such as scars is realized, and it inhibits the transfer properties to rollers and laminated papers during the manufacture or conveying because of its high molecular weight.

The present inventors made extensive and intensive investigations. As a result, it has been found that the above-described problems can be solved by forming fine protrusions made of a long-chain alkyl group-containing polymer on the surface of a recording layer of an image recording material, leading to accomplishment of a third aspect of the invention.

That is, an image recording material according to the third aspect of the invention comprises a support having provided thereon a recording layer capable of undergoing image formation upon exposure with infrared rays, the recording layer containing a long-chain alkyl group-containing polymer and an infrared ray absorber, with fine protrusions comprising the long-chain alkyl group-containing polymer being present on the surface of the recording layer.

Further, a process of producing an image recording material according to the third aspect of the invention comprises applying a coating solution for recording layer on a support and drying it, wherein the coating solution for recording layer contains a long-chain alkyl group-containing polymer, a high-molecular compound incompatible with the long-chain alkyl group-containing polymer, and an infrared ray absorber; and in the drying step of the recording layer, the long-chain alkyl group-containing polymer and the high-molecular compound in the coating solution for recording layer cause phase separation, and the long-chain alkyl group-containing polymer takes a state of fine particles by self coagulation, to form fine protrusions on the surface of the recording layer.

The recording layer of the image recording material according to the third aspect of the invention is characterized in that it is provided by dissolving the constitutional components of the image recording material containing a long-chain alkyl group-containing polymer and a high-molecular compound incompatible with the long-chain alkyl group-containing polymer in a coating solvent, applying the solution on a support, and then drying it. Thus, it may be considered that as the coating solvent is removed in the drying step, phase separation caused by incompatibility which both of the long-chain alkyl group-containing polymer and the high-molecular compound originally possess occurs therebetween, the long-chain alkyl group-containing polymer causes self coagulation in the recording layer to form fine particles, and fine protrusions made of the fine particles are formed on the surface of the recording layer.

In the invention, it may be considered that since the fine protrusions lower a frictional force, stresses to scratches or mars are relieved. Further, it is assumed that since the fine protrusions give rise to pseudo effects as in the case where the recording layer is made thick, and in an apparent thickness of the recording layer, a thickness from the interface of the support to the tip portion of the fine particles is an effective thickness, the scratch resistance is enhanced and that since the recording sensitivity depends on the thickness of the recording layer from the interface of the support to the valley bottom between the protrusions, there is no possibility that the sensitivity decreases.

In addition, especially in a positive-working lithographic printing plate precursor, it may be considered that when such a compound having an extremely high molecular weight is intermixed in the recording layer, not only in an image portion, a high film strength and resistance to development are revealed, but also in a non-image portion, since the dissolution and elimination of the recording layer by a developing solution become easy because of a thin effective thickness of the recording layer, a superior latitude of development is obtained.

DETAILED DESCRIPTION OF THE INVENTION

The image recording material according to the invention comprises a polymer to lower a dynamic coefficient of friction to from 0.38 to 0.60 and an infrared ray absorber. When a polymer to lower the dynamic coefficient of friction to less than 0.38 is used, the slipperiness is too high so that it is impossible to stably manufacture a lithographic printing plate precursor using the image recording material. Further, during conveying of lithographic printing plate precursors, the precursors cause slipping so that they are likely damaged, and hence, such is not preferred. On the other hand, when the dynamic coefficient of friction exceeds 0.60, the effect for improving the scratch resistance by slipperiness is not obtained.

The image recording material according to the invention comprises an infrared ray absorber and a long-chain alkyl group-containing polymer having a reduction rate of coefficient of friction to the base polymer of from 0.5 to 0.97, the polymer being a copolymer of a long-chain alkyl group-containing monomer having 6 or more carbon atoms and a hydrophilic monomer. The foregoing reduction rate of coefficient of friction is preferably from 0.60 to 0.95, and more preferably from 0.65 to 0.92. When the reduction rate of coefficient of friction falls within the above-specified range, an image recording material for the preparation of good lithographic printing plate precursors having a wide latitude of development and scratch resistance and free from transfer to rollers, a protective paper (laminated paper), or the back surface of a support during the manufacture or conveying can be provided. When the reduction rate of coefficient of friction exceeds the above-specified range, the effect for improving the scratch resistance by slipperiness is not obtained, and mars are likely generated. On the other hand, when it is lower than the lower limit, the slipperiness is in excess so that the handling during the manufacture or conveying becomes worse.

The dynamic coefficient of friction ($\mu$k) as referred to herein is a dynamic coefficient of friction to stainless steel as measured in a manner such that the surface of the recording layer of the lithographic printing plate precursor is brought into contact with the stainless steel according to the standards, ASTM D1894.

In the invention, the reduction rate of coefficient of friction of the long-chain alkyl group-containing polymer to the base polymer is a value obtained by dividing a coefficient of friction of a mixture of a base polymer (polymer as a standard in the measurement of coefficient of friction) having 10% by weight of a copolymer of a long-chain alkyl group-containing monomer and a hydrophilic monomer added thereto by a coefficient of friction of the base polymer. That is, this value means a reduction rate of the coefficient of friction of the base polymer by the addition of the copolymer.

As the base polymer to be used for the measurement of the coefficient of friction, are preferable polymers that are mainly used in the image recording material. Concretely, phenol resins, acrylic resins, amide resins, and sulfonamide resins are enumerated, with phenol resins being particularly preferred.

The image recording material according to the third aspect of the invention comprises a support having provided thereon a recording layer capable of undergoing image formation upon exposure with infrared rays, the recording layer containing a long-chain alkyl group-containing polymer and an infrared ray absorber, with fine protrusions comprising the long-chain alkyl group-containing polymer being present on the surface of the recording layer.

In the third aspect of the invention, the recording layer is characterized by containing a long-chain alkyl group-containing polymer that causes phase separation from a high-molecular compound (such as phenol resins) contained in the recording layer during application and formation of the recording layer, to form protrusions on the uppermost surface.

As described below in detail by referring to the production process, the long-chain alkyl group-containing polymer has a characteristic feature that though it is dissolved in a coating solvent together with other high-molecular compound in a coating solution for recording layer but after the application, it causes phase separation from other component in the drying step with the removal of the solvent and also causes self coagulation to form protrusions on the uppermost surface. Accordingly, the fine protrusions made of the long-chain alkyl group-containing polymer are different in both of the production process and physical properties from conventional surface protrusions formed by adding a dispersion of fine particles of, e.g., inorganic particles, metal particles, or organic particles to a coating solution. Especially, there is an advantage that the former fine particles (fine protrusions) are superior in adhesiveness to the high-molecular compound constituting the matrix.

In the invention, the fine protrusions present on the surface of the recording material of the image recording material can be easily confirmed by microscopic observation of the surface of the recording layer.

The fine particles forming the surface protrusions preferably have a mean particle size of from 0.01 $\mu$m to 10 $\mu$m, more preferably from 0.03 $\mu$m to 5 $\mu$m, and most preferably from 0.05 $\mu$m to 1 $\mu$m. When the mean particle size of the fine particles is less than 0.01 $\mu$m, the formation of irregularities on the surface of the recording layer is insufficient so that the effect for enhancing the scratch resistance may not be obtained. On the other hand, when protrusions exceeding 10 $\mu$m are present, the resolution of the print and the adhesiveness to an undercoat layer may possibly be lowered. Further, the particles present in the vicinity of the surface are likely taken off by an external stress, thereby possibly deteriorating the uniformity.

As a method of measuring the mean particle size of the surface protrusions, there is generally a method in which the particle size of the fine particles present on the surface is measured by observation by an optical microscope, an electron microscope, etc., and an average value thereof is then calculated. That is, the mean particle size of the fine particles as referred to herein means an average value of the particle sizes as optically measured for plural fine particles made of the long-chain alkyl group-containing polymer, which protrude on the surface of the recording layer.

Further, the fine protrusions present on the surface of the recording layer preferably have a height of from 5.0 nm to 1,000 nm, more preferably from 10 nm to 800 nm, and most preferably from 20 nm to 500 nm.

As a method of measuring the height of the surface protrusions, are enumerated a method in which the height of the protrusions is measured by electron microscopic observation of the cross-sections thereof and a method in which the height of the protrusions is measured using an atomic force microscope (AFM).

In the invention, examples of factors to control the particle size and height of the fine protrusions made of the long-chain alkyl group-containing polymer present on the surface of the recording layer include polarity of the long-chain alkyl group-containing polymer, polarity of the high-molecular compound to be used jointly, addition amounts of the long-chain alkyl group-containing polymer and the high-molecular compound, kind of the coating solvent, other additives contained in the recording layer, and drying conditions (such as temperature, time, humidity, and pressure).

For example, when a difference between the polarity of the long-chain alkyl group-containing polymer and the polarity of the incompatible high-molecular compound to be used jointly is large, the particle size of the fine protrusions becomes large. Further, when the drying temperature is increased to shorten the time necessary for the drying, the particle size of the fine protrusions becomes small.

The image recording material according to the invention can be used in a recording layer of a positive-working lithographic printing plate precursor as a positive-working image recording material containing a water-insoluble and alkali-soluble resin or an acid-decomposable compound, whose solubility in an alkaline aqueous solution increases upon exposure with infrared laser. Also, the image recording material according to the invention can be used in a recording layer of a negative-working lithographic printing plate precursor as a negative-working image recording material containing a heat crosslinkable component or a thermally polymerizable component, which causes crosslinking or polymerization upon exposure with infrared laser to becomes insoluble in a developing solution.

The respective components constituting the image recording material according to the invention and the lithographic printing plate precursor using the image recording material according to the invention will be hereunder described in turn.

[Image Recording Material]

(Polymer to Lower the Dynamic Coefficient of Friction to from 0.38 to 0.60)

In the invention, as the polymer that can be used for lowering the dynamic coefficient of friction to from 0.38 to 0.60 are enumerated polymers having a long-chain alkyl group having 6 or more carbon atoms (hereinafter simply referred to as "long-chain alkyl group"), polyphenylene polymers, and urethane polymers. Of these are preferable long-chain alkyl group-containing polymers. As the long-chain alkyl group-containing polymer are preferable polymers obtained by copolymerization of a combination of a long-chain alkyl group-containing monomer having 4 or more carbon atoms and at least one monomer (hereinafter referred to as "long-chain group-containing copolymer").

(Copolymer of Long-Chain Alkyl Group-Containing Monomer and Hydrophilic Monomer)

As the long-chain alkyl group-containing polymer that is suitably used for reducing the coefficient of friction of the base polymer in the invention to a rate of from 0.5 to 0.97, are preferable polymers obtained by copolymerizing a combination of at least one long-chain alkyl group-containing monomer having 6 or more carbon atoms, and preferably 12 or more carbon atoms and at least one hydrophilic monomer.

Each of the constructions of the image recording material will be described below in detail.

First of all, the long-chain alkyl group-containing polymer that is a characteristic component in the recording layer of the image recording material will be described.

[Long-Chain Alkyl Group-Containing Polymer]

As the long-chain alkyl group-containing polymer that is used in the formation of the surface protrusion, are preferable high-molecular compounds obtained by polymerizing at least one monomer containing a long-chain alkyl group having 6 or more carbon atoms, and preferably 12 or more carbon atoms.

As the long-chain alkyl group-containing monomer, are preferable compounds having an addition polymerizable, ethylenically unsaturated group within the molecule. From the standpoints of solvent solubility, an effect for improving the scratch resistance in the case of preparing lithographic printing precursors, and influences against the surface coating properties and image-forming properties, acrylate-based, methacrylate-based, acrylamide-based, methacrylamide-based, styrene-based, vinyl-based, vinyl ether-based, maleic acid-based, and fumaric acid-based monomers, each having a long-chain alkyl group, are preferred.

From the viewpoint of enhancement in slipperiness, a composition molar ratio of the long-chain alkyl group-containing monomer is preferably 10 mole % or more, more preferably 20 mole % or more, and most preferably 30 mole % or more.

As the long-chain alkyl group-containing monomer having 6 or more carbon atoms, a compound having an addition polymerizable, ethylenically unsaturated group within the molecule thereof is preferable. From the standpoints of solvent solubility, an effect for improving the scratch resistance in the case of preparing the image recording material, and less influences against the surface coating properties and image-forming properties, acrylate-based, methacrylate-based, acrylamide-based, methacrylamide-based, styrene-based, vinyl-based, vinyl ether-based, maleic acid-based, and fumaric acid-based monomers, each having a long-chain alkyl group, are preferred. Of these are more preferable long-chain alkyl acrylates, long-chain alkyl methacrylates, long-chain alkyl group-containing vinyl ethers, and long-chain alkyl group-containing styrenes.

Further, the number, n of carbon atoms of the long-chain alkyl group is preferably 6 or more, more preferably 8 or more, and most preferably 12 or more and 20 or less.

More concretely, monomers represented by the following formula (2) are preferred as the long-chain alkyl group-containing monomer.

(2)

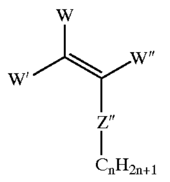

In the formula (2), n represents an integer of from 6 to 40; Z" represents a divalent connecting group; and W, W', and W" each represents a monovalent organic group.

Examples of the divalent connecting group represented by Z" include a linear, branched, chain or cyclic alkylene group having from 1 to 20 carbon atoms; a linear, branched, chain or cyclic alkenylene group having from 2 to 20 carbon atoms; an Ikynylene group having from 2 to 20 carbon atoms, an arylene group (monocyclic or heterocyclic ring) having from 6 to 20 carbon atoms; —OC(═O)—; —OC(═O)Ar—; —OC(═O)O—; —OC(═O)OAr—; —C(═O)NR—; —C(═O)NAr—; $—SO_2NR—$; $—SO_2NAr—$; —O— (alkylene oxy or polyalkylene oxy); —OAr— (arylene oxy or polyarylene oxy); —C(═O)O—; —C(═O)

O—Ar—; —C(=O)Ar—; —C(=O)—; —$SO_2$O—; —$SO_2$OAr—; —$OSO_2$—; —$OSO_2$Ar—; —$NRSO_2$—; —$NArSO_2$—; —NRC(=O)—; —NArC(=O)—; —NRC(=O)O—; —NArC(=O)O—; —OC(=O)NR—; —OC(=O)NAr—; —NAr—; —NR—; —$N^+$RR'—; —$N^+$RAr—; —$N^+$ArAr'-; —S—; —; —ArS—; a heterocyclic group (such as 3- to 12-membered monocyclic or fused rings containing as a hetero atom at least one of nitrogen, oxygen, and sulfur); —OC(=S)—; —OC(=S)Ar—; —C(=S)O—; —O(=S)OAr—; —C(=S)OAr—; —C(=O)S—; —C(=O)SAr—; —ArC(=O)—; —ArC(=O)NR—; —ArC(=O)NAr—; —ArC(=O)O—; —ArC(=O)O—; —ArC(=O)S—; —ArC(=S)O—; —ArO—; and —ArNR—, wherein R and R' each represents a linear, branched, chain or cyclic alkyl group, an alkenyl group, or an alkynyl group; and Ar and Ar' each represents an aryl group.

The connecting group may be formed by combining two or more of the connecting groups as enumerated above. As the connecting group are preferable an arylene group (monocyclic or heterocyclic ring) having from 6 to 20 carbon atoms; —C(=O)NR—; —C(=O)NAr—; —O— (alkylene oxy or polyalkylene oxy); —OAr— (arylene oxy or polyarylene oxy); —C(=O)O—; —C(=O)O—Ar—; —C(=O)—; —C(=O)Ar—; —S—; —SAr—; —ArS—; —ArC(=O)—; —ArC(=O)O—; —ArC(=O)O—; —ArO—; and —ArNR—, and more preferable an arylene group (monocyclic or heterocyclic ring) having from 6 to 20 carbon atoms; —C(=O)NR—; —C(=O)NAr—; —O— (alkylene oxy or polyalkylene oxy); —OAr— (arylene oxy or polyarylene oxy); —C(=O)O—; —C(=O)O—Ar—; —SAr—; —ArS—; —ArC(=O)—; —ArC(=O)O—; —ArC(=O)O—; —ArO—; and —ArNR—.

The connecting group may have a substituent. Examples of the substituent include a linear, branched, chain or cyclic alkylene group having from 1 to 20 carbon atoms; a linear, branched, chain or cyclic alkenylene group having from 2 to 20 carbon atoms; an alkynylene group having from 2 to 20 carbon atoms; an arylene group having from 6 to 20 carbon atoms; an acyloxy group having from 1 to 20 carbon atoms; an alkoxycarbonyloxy group having from 2 to 20 carbon atoms; an aryloxycarbonyloxy group having from 7 to 20 carbon atoms; a carbamoyloxy group having from 1 to 20 carbon atoms; a carbonamide group having from 1 to 20 carbon atoms; a sulfonamide group having from 1 to 20 carbon atoms; a carbamoyl group having from 1 to 20 carbon atoms; a sulfamoyl group having from 0 to 20 carbon atoms; an alkoxy group having from 1 to 20 carbon atoms; an aryloxy group having from 6 to 20 carbon atoms; an aryloxycarbonyl group having from 7 to 20 carbon atoms; an alkoxycarbonyl group having from 2 to 20 carbon atoms; an N-acylsulfamoyl group having from 1 to 20 carbon atoms; an N-sulfamoylcarbamoyl group having from 1 to 20 carbon atoms; an alkylsulfonyl group having from 1 to 20 carbon atoms; an arylsulfonyl group having from 6 to 20 carbon atoms; an alkoxycarbonylamino group having from 2 to 20 carbon atoms; an aryloxycarbonylamino group having from 7 to 20 carbon atoms; an amino group having from 0 to 20 carbon atoms; an imino group having from 1 to 20 carbon atoms; an ammonio group having from 3 to 20 carbon atoms; a carboxyl group; a sulfo group; an oxy group; a mercapto group; an alkylsulfinyl group having from 1 to 20 carbon atoms; an arylsulfinyl group from 6 to 20 carbon atoms; an alkylthio group having from 1 to 20 carbon atoms; an arylthio group having from 6 to 20 carbon atoms; a ureido group having from 1 to 20 carbon atoms; a heterocyclic group having from 2 to 20 carbon atoms; an acyl group having from 1 to 20 carbon atoms; a sulfamoylamino group having from 0 to 20 carbon atoms; a silyl group having from 2 to 20 carbon atoms; a hydroxyl group; a halogen atom (such as a fluorine atom, a chlorine atom, and a bromine atom); a cyano group; and a nitro group.

Further, examples of W, W', and W" are those enumerated below. However, it should not be construed that the invention is limited thereto.

That is, examples of W, W', and W" include a hydrogen atom; a linear, branched, chain or cyclic alkyl group having from 1 to 20 carbon atoms (such as methyl, ethyl, propyl, heptafluoropropyl, isopropyl, butyl, t-butyl, t-pentyl, cyclopentyl, cyclohexyl, octyl, 2-ethylhexyl, and dodecyl); a linear, branched, chain or cyclic alkenyl group having from 2 to 20 carbon atoms (such as vinyl, 1-methylvinyl, and cyclohexen-1-yl); an alkynyl group having from 2 to 20 carbon atoms (such as ethynyl and 1-propynyl); an aryl group having from 6 to 20 carbon atoms (such as phenyl, naphthyl, and anthryl); an acyloxy group having from 1 to 20 carbon atoms (such as acetoxy, tetradecanoyloxy, and benzoyloxy); an alkoxycarbonyloxy group having from 2 to 20 carbon atoms (such as a methoxycarbonyloxy group and a 2-methoxyethoxycarbonyloxy group); an aryloxycarbonyloxy group having from 7 to 20 carbon atoms (such as a phenoxycarbonyloxy group); a carbamoyloxy group having from 1 to 20 carbon atoms (such as N,N-dimethylcarbamoyloxy); a carbonamide group having from 1 to 20 carbon atoms (such as foramide, N-methylacetamide, acetamide, N-methylformamide, and benzamide); a sulfonamide group having from 1 to 20 carbon atoms (such as methanesulfonamide, dedecanesulfonamide, benzenesulfonamide, and p-toluenesulfonamide); a carbamoyl group having from 1 to 20 carbon atoms (such as N-methylcarbamoyl, N,N-diethyl-carbamoyl, and N-mesylcarbamoyl); a sulfamoyl group having from 0 to 20 carbon atoms (such as N-butylsulfamoyl, N,N-diethylsulfamoyl, and N-methyl-N-(4-methoxyphenyl)-sulfamoyl); an alkoxy group having from 1 to 20 carbon atoms (such as methoxy, propoxy, isopropoxy, octyloxy, t-octyloxy, dodecyloxy, 2-(2,4-di-t-pentylphenoxy)ethoxy, and a polyalkyleneoxy); an aryloxy group having from 6 to 50 carbon atoms (such as phenoxy, 4-methoxyphenoxy, and naphthoxy); an aryloxycarbonyl group having from 7 to 20 carbon atoms (such as phenoxycarbonyl and naphthoxycarbonyl); an alkoxycarbonyl group having from 2 to 20 carbon atoms (such as methoxycarbonyl and t-butoxycarbonyl); an N-acylsulfamoyl group having from 1 to 20 carbon atoms (such as N-tetradecanoylsulfamoyl and N-benzoylsulfamoyl); an N-sulfamoylcarbamoyl group having from 1 to 20 carbon atoms (such as N-methanesulfonylcarbamoyl); and an alkylsulfonyl group having from 1 to 20 carbon atoms (such as methanesulfonyl, octylsulfonyl, 2-methoxyethylsulfonyl, and 2-hexyldecylsulfonyl); an arylsulfonyl group having from 6 to 20 carbon atoms (such as benzenesulfonyl, p-toluenesulfonyl, and 4-phenylsulfonylphenylsulfonyl); an alkoxycarbonylamino group having from 2 to 20 carbon atoms (such as ethoxycarbonylamino); an aryloxycarbonylamino group having from 7 to 20 carbon atoms (such as phenoxycarbonylamino and naphthoxycarbonylamino); an amino group having from 0 to 20 carbon atoms (such as amino, methylamino, diethylamino, diisopropylamino, anilino, and morpholino); an ammonio group having from 3 to 20 carbon atoms (such as a trimethylammonio group and a dimethylbenzylammonio group); a cyano group; a nitro group; a carboxyl group; a hydroxyl group; a sulfo group; a mercapto group; an alkylsulfinyl group having from 1 to 20 carbon atoms (such as methanesulfinyl and octanesulfinyl); an arylsulfinyl group having from 6 to 20 carbon atoms (such as benzenesulfinyl, 4-chlorophenylsulfinyl, and p-toluenesulfinyl); an alkylthio group having from 1 to 20 carbon atoms (such as methylthio, octylthio, and cyclohexylthio); an arylthio group having from 6 to 20 carbon atoms (such as phenylthio and naphthylthio); a ureido group having from 1 to 20 carbon atoms (such as 3-methylureido, 3,3-dimethylureido, and 1,3-diphenylureido); a heterocyclic group having from 2 to 20 carbon atoms (such as 3- to 12-membered monocyclic or fused rings containing as a hetero atom at least one of nitrogen, oxygen, and sulfur (such as 2-furyl, 2-pyranyl, 2-pyridyl, 2-thienyl, 2-imidazolyl, morpholino, 2-quninolyl, 2-benzimidazolyl, 2-benzothiazolyl, and 2-benzoxazolyl)); an acyl group having from 1 to 20 carbon atoms (such as acetyl, benzoyl, and trifluoroacetyl); a sulfamoylamino group (such as N-butylsulfamoylamino and N-phenylsulfamoylamino); a silyl group having from 3 to 20 carbon atoms (such as trimethylsilyl, dimethyl-t-butylsilyl, and triphenylsilyl); an azo group; and a halogen atom (such as a fluorine atom, a chlorine atom, and a bromine atom). Each of these substituents may further have a substituent. Examples of the substituent are those as numerated above.

Further, W, W', and W" may be taken together to form a ring. As the ring are enumerated an aliphatic ring, an aromatic ring, a heterocyclic ring.

Specific examples of the compound represented by the formula (2) will be given below, but it should not be construed that the invention is limited thereto. Incidentally, in the following specific examples, n represents an integer of from 4 to 40.

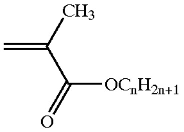
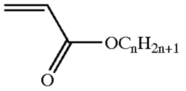
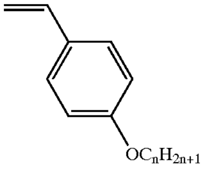
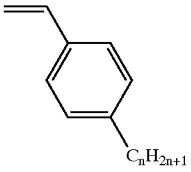
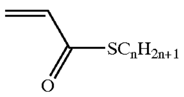
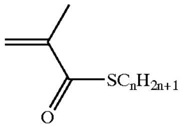
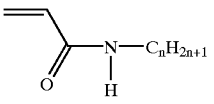
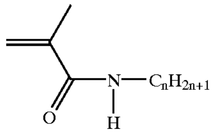
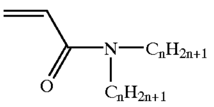
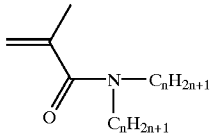
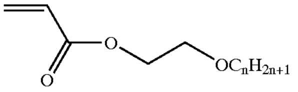

-continued

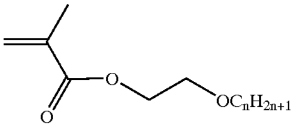
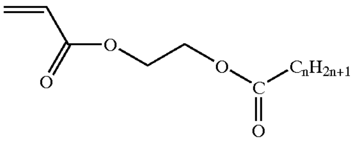
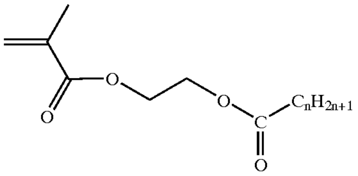
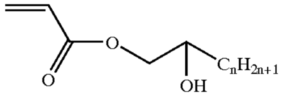
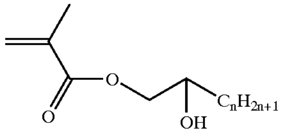
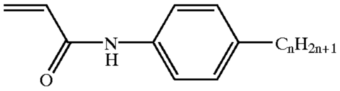
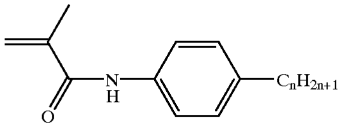
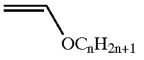
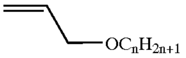
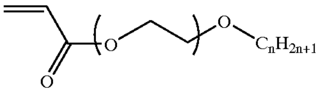
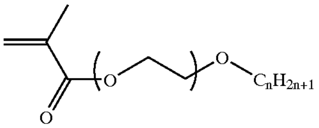
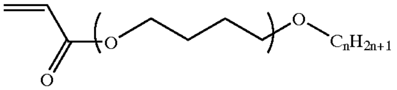
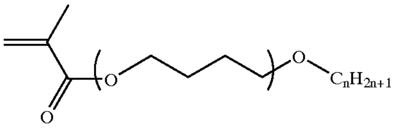
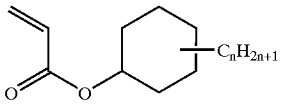
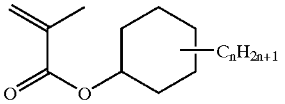
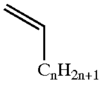
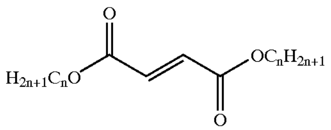

-continued

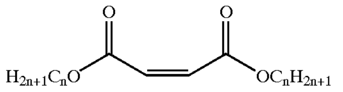

As the copolymerization component of the long-chain alkyl group-containing monomer, a hydrophilic monomer is preferable from the viewpoints of solubility in an alkaline developing solution and sensitivity.

As the hydrophilic monomer, are preferable compounds represented by the following formula (II) from the viewpoints of the solubility in an alkaline developing solution and sensitivity.

(II)

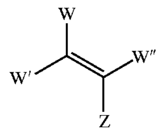

In the formula (II), Z represents a monovalent hydrophilic group; and W, W', and W" each represents a monovalent organic group.

In the formula (II), specific examples of Z will be given below, but it should not be construed that the invention is limited thereto.

Examples include an acyloxy group having from 1 to 20 carbon atoms, an alkoxycarbonyloxy group having from 2 to 20 carbon atoms, an aryloxycarbonyloxy group having from 7 to 20 carbon atoms, a carbamoyloxy group having from 1 to 20 carbon atoms, a carbonamide group having from 1 to 20 carbon atoms, a carbamoyl group having from 1 to 20 carbon atoms, a sulfamoyl group having from 0 to 20 carbon atoms, an alkoxy group having from 1 to 2,000 carbon atoms, an aryloxy group having from 6 to 2,000 carbon atoms, an aryloxycarbonyl group having from 7 to 20 carbon atoms, an alkoxycarbonyl group having from 2 to 20 carbon atoms, an N-acylsulfamoyl group having from 1 to 20 carbon atoms, an N-sulfamoylcarbamoyl group having from 1 to 20 carbon atoms, an alkylsulfonyl group having from 1 to 20 carbon atoms (such as methanesulfonyl, octylsulfonyl, 2-methoxyethylsulfonyl, and 2-hexyldecylsulfonyl), an arylsulfonyl group having from 6 to 20 carbon atoms (such as benzenesulfonyl, p-toluenesulfonyl, and 4-phenylsulfonylphenylsulfonyl), an alkoxycarbonylamino group having from 2 to 20 carbon atoms, an aryloxycarbonylamino group having from 7 to 20 carbon atoms, an amino group having from 0 to 20 carbon atoms, an onium group having from 3 to 20 carbon atoms (such as ammonium, sulfonium, diazonium, iodonium, and iminium), a hydroxyl group, a sulfo group, a mercapto group, an alkylsulfinyl group having from 1 to 20 carbon atoms, an arylsulfinyl group having from 6 to 20 carbon atoms, an alkylthio group having from 1 to 20 carbon atoms, an arylthio group having from 6 to 20 carbon atoms, a ureido group having from 1 to 20 carbon atoms, an alkylsiloxy group having from 1 to 2,000 carbon atoms, an arylsiloxy group having from 6 to 2,000 carbon atoms, a phenol group (—Ar—OH), a sulfonamide group ($—SO_2NH—R$), a substituted sulfonamide-based acid group (hereinafter referred to as "active imido group") [such as $—SO_2NHCOR$, $—SO_2NHSO_2R$, and $—CONHSO_2R$], a carboxyl group ($—CO_2H$), a sulfonic acid group ($—SO_3H$), and a phosphoric acid group ($—OPO_3H_2$). These substituents may further be substituted. Examples of the substituents are those as enumerated herein.

In the formula (II), the monovalent organic group represented by W, W' and W" is synonymous with the monovalent organic group represented by Y, Y' and Y" in the formula (I).

As the hydrophilic monomer of the formula (II), a monomer having an acid group having a pKa of 12 or less is preferable from the viewpoints of solubility in an alkaline developing solution and sensitivity.

As the monomer having an acid group having a pKa of 12 or less, monomers having an acid group as enumerated in (1) to (6) below are preferable from the viewpoints of solubility in an alkaline developing solution and sensitivity.

(1) Phenol group (—Ar—OH)

(2) Sulfonamide group ($—SO_2NH—R$)

(3) Active imido group ($—SO_2NHCOR$, $—SO_2NHSO_2R$, $—CONHSO_2R$)

(4) Carboxyl group ($—CO_2H$)

(5) Sulfonic acid group ($—SO_3H$)

(6) Phosphoric acid group ($—OPO_3H_2$)

In (1) to (6) as above, Ar represents an optionally substituted divalent aryl connecting group, and R represents an optionally substituted hydrocarbon group.

As the monomer having the phenol group as in (1) are enumerated acrylamides, methacrylamides, acrylic esters, methacrylic esters, and hydroxystyrenes each having a phenol group.

As the monomer having the sulfonamide group as in (2) are enumerated compounds having at least one sulfonamide group having the foregoing structure and at least one polymerizable unsaturated group in the molecule thereof. Among them are preferable low-molecular weight compounds having an acryloyl group, an allyl group or a hydroxyl group and the sulfonamide group in the molecule thereof. Examples include the compounds represented by the following formulae (i) to (v).

(i)

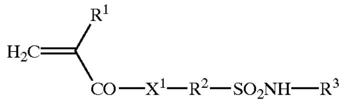

(ii)

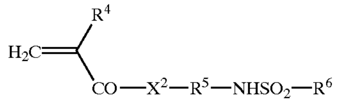

(iii)

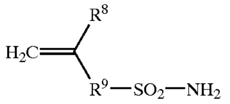

(iv)

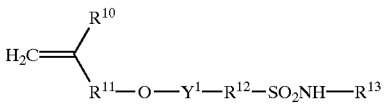

(v)

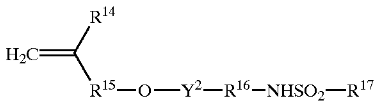

In the foregoing formulae (i) to (v), $X^1$ and $X^2$ each independently represents —O— or $—NR^7—$; $R^1$ and $R^4$ each independently represents a hydrogen atom or $—CH_3$; $R^2$, $R^5$, $R^9$, $R^{12}$, $R^{16}$ each independently represents an optionally substituted alkylene group, cycloalkylene group, arylene group or aralkylene group having from 1 to 12 carbon atoms; $R^3$, $R^7$, and $R^{13}$ each independently represents a hydrogen atom or an optionally substituted alkyl group, cycloalkyl group, aryl group or aralkyl group having from 1 to 12 carbon atoms; $R^6$ and $R^{17}$ each independently represents an optionally substituted alkyl group, cycloalkyl group, aryl group or aralkyl group having from 1 to 12 carbon atoms; $R^8$, $R^{10}$, and $R^{14}$ each independently represents a hydrogen atom or —$CH_3$; $R^{11}$ and $R^{15}$ each independently represents a simple bond or an optionally substituted alkylene group, cycloalkylene group, arylene group or aralkylene group having from 1 to 12 carbon atoms; and $Y^1$ and $Y^2$ each independently represents a simple (single) bond or —CO—.

Among the compounds represented by the formulae (i) to (v), m-aminosulfonylphenyl methacrylate, N-(p-aminosulfonylphenyl) methacrylamide, and N-(p-aminosulfonylphenyl) acrylamide can be particularly suitably used in the image recording material according to the invention.

As the monomer having the active imido group as in (3) can be enumerated compounds having at least one active imido group represented by any one of the foregoing structural formulae and at least one polymerizable unsaturated group in the molecule thereof. Among them are preferable compounds having at least one active imido group represented by the following structural formula and at least one polymerizable unsaturated group in the molecule thereof.

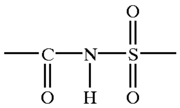

Specifically, N-(p-toluenesulfonyl) methacrylamide and N-(p-toluenesulfonyl) acrylamide can be suitably used.

As the monomer having the carboxyl group as in (4) can be enumerated compounds having at least one carboxyl group and at least one polymerizable unsaturated group in the molecule thereof. As the monomer having the sulfonic acid group as in (5) can be enumerated compounds having at least one sulfonic acid group and at least one polymerizable unsaturated group in the molecule thereof. As the monomer having the phosphoric acid group as in (6) can be enumerated compounds having at least one phosphoric acid group and at least one polymerizable unsaturated group in the molecule thereof.

Among the monomers having an acid group having a pKa of 12 or less are preferable the monomers having the phenol group as in (1), the monomers having the sulfonamide group as in (2), the monomers having the active imido group as in (3), and the monomers having the carboxyl group as in (4). Especially, the monomers having the phenol group as in (1), the monomers having the sulfonamide group as in (2), and the monomers having the carboxyl group as in (4) are most preferable from the standpoints of the solubility in an alkaline developing solution, the development latitude, and the sufficient film strength.

The composition molar ratio of the hydrophilic monomer is preferably 10 mole % or more in the copolymer component with the long-chain alkyl group-containing monomer. It is more preferable to undergo the copolymerization in a composition molar ratio of the hydrophilic monomer of 20 mole % or more from the viewpoint of enhancement of the scratch resistance.

Among the monomers having an acid group having a pKa of 12 or less are preferable the monomers having the phenol group as in (1), the monomers having the sulfonamide group as in (2), the monomers having the active imido group as in (3), and the monomers having the carboxyl group as in (4). Especially, the monomers having the phenol group as in (1), the monomers having the sulfonamide group as in (2), and the monomers having the carboxyl group as in (4) are most preferable from the standpoints of the solubility in an alkaline developing solution, the development latitude, and the sufficient film strength.

Further, as the copolymerization component of the long-chain alkyl group-containing monomer and the acid group-containing monomer, other monomers can be used. The content of the monomer other than the long-chain alkyl group-containing monomer and the acid group-containing monomer is preferably 30 mole % or less, and more preferably 20 mole % in the copolymer components from the standpoint of the effects of the invention.

As the monomer other than the long-chain alkyl group-containing monomer and the acid group-containing monomer, compounds as listed below in (7) to (17) can be enumerated.

(7) Acrylic esters and methacrylic esters having an aliphatic hydroxyl group such as 2-hydroxyethyl acrylate and 2-hydroxyethyl methacrylate (8) Acrylates such as methyl acrylate, ethyl acrylate, propyl acrylate, amyl acrylate, benzyl acrylate, 2-chloroethyl acrylate, glycidyl acrylate, N-dimethylaminoethyl acrylate, polyethylene glycol monoacrylate, and polypropylene glycol monoacrylate (9) Methacrylates such as methyl methacrylate, ethyl methacrylate, propyl methacrylate, amyl methacrylate, cyclohexyl methacrylate, benzyl methacrylate, 2-chloroethyl methacrylate, glycidyl methacrylate, N-dimethylaminoethyl methacrylate, polyethylene glycol monomethacrylate, and polypropylene glycol monomethacrylate

(10) Acrylamides and methacrylamides such as acrylamide, methacrylamide, N-methyloyl acrylamide, N-ethyl acrylamide, N-hexyl methacrylamide, N-cyclohexyl acrylamide, N-hydroxyethyl acrylamide, N-phenyl acrylamide, N-nitrophenyl acrylamide, and N-ethyl-N-phenyl acrylamide

(11) Vinyl ethers such as ethyl vinyl ether, 2-chloroethyl vinyl ether, hydroxyethyl vinyl ether, propyl vinyl ether, butyl vinyl ether, and phenyl vinyl ether

(12) Vinyl esters such as vinyl acetate, vinyl chloroacetate, vinyl butyrate, and vinyl benzoate

(13) Styrenes such as styrene, α-methylstyrene, methylstyrene, and chloromethylstyrene

(14) Vinyl ketones such as methyl vinyl ketone, ethyl vinyl ketone, propyl vinyl ketone, and phenyl vinyl ketone

(15) Olefins such as ethylene, propylene, isobutylene, butadiene, and isoprene

(16) N-vinylpyrrolidone, N-vinylcarbazole, 4-vinylpyrdine, acrylonitrile, and methacrylonitrile

(17) Unsaturated imides such as maleimide, N-acryloyl acrylamide, N-acetyl methacrylamide, N-propionyl methacrylamide, and N-(p-chlorobezoyl) methacrylamide As the copolymerization method of the foregoing monomers, there are employable conventionally known graft copolymerization, block copolymerization, and random copolymerization. The copolymerization component of the long-chain alkyl group-containing monomer may be used in admixture of two or more thereof.

Though the copolymer as obtained above is used as the long-chain alkyl group-containing polymer of the invention, a polymer having a structural unit represented by the following formula (III) is more preferable.

(III)

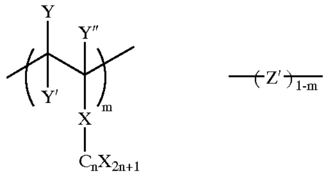

In the formula (III), n represents an integer of from 6 to 40; Y, Y', and Y" each represents a monovalent organic group; X represents a divalent connecting group; Z' represents a divalent hydrophilic group; and m represents a real number that is satisfactory with the relation of $0.1 \leqq m < 1$. From the viewpoints of the effect for improving the scratch resistance and influence against the solubility, m is preferably satisfactory with the relation of $0.2 \leqq m \leqq 0.9$, and more preferably $0.25 \leqq m \leqq 0.85$.

Specific examples of Y, Y', Y", and X are synonymous with those as given above for the formula (I). Specific examples of Z' are synonymous with those in the structural unit comprising the monomer represented by the formula (II).

In addition, as the long-chain alkyl group-containing polymer of the invention, is more preferable a polymer having a structural unit represented by the following formula (IV).

(IV)

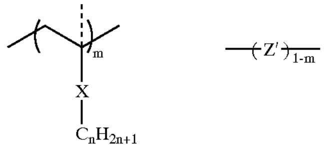

In the formula (IV), the bond represented by the broken line me ns that a methyl group or a hydrogen atom is present in the end terminal thereof. From the viewpoints of the effect for improving the scratch resistance and influence against the solubility, m is preferably satisfactory with the relation of $0.2 \leqq m \leqq 0.9$, more preferably $0.25 \leqq m \leqq 0.85$, and most preferably $0.30 \leqq m \leqq 0.60$. n represents an integer of from 6 to 40, preferably from 10 to 30, and more preferably from 12 to 20.

As the hydrophilic group represented by Z' in the formula (IV), a skeleton having a hydroxyl group, a (poly)alkylene oxide group having from 1 to 2,000 carbon atoms, a (poly) arylene oxide group having from 6 to 2,000 carbon atoms, a phenol group, a sulfonamide group, an active imido group, a carboxyl group, or a sulfonic acid group is preferable from the viewpoint of thoroughly ensuring the solubility in the alkaline developing solution; a skeleton having a phenol group, a sulfonamide group, an active imido group, a carboxyl group, or a sulfonic acid group is more preferably from the viewpoint of the sensitivity; and a skeleton having a carboxyl group is most preferable. As X in the formula (IV), —C(=O)— is most preferable.

As the copolymerization component having the structural unit represented by the formula (III), the compound as enumerated above in (7) or (17) can be used in a composition ratio of 50 mole % or less in the copolymer component. From the view of the effects, the composition ratio of this compound is preferably 30 mole % or less.

The amount of the residual monomers in the long-chain alkyl group-containing polymer is preferably 10% by weight or less, and more preferably 5% by weight from the standpoints of problems occurred in the case where the image recording material according to the invention is applied to a lithographic printing plate precursor, such as transfer to a protective paper (laminated paper) or the back surface of the support during the lamination of the lithographic printing plate precursor, and transfer to rollers during the manufacture of a lithographic printing plate precursor.

Specific examples of the long-chain alkyl group-containing polymer of the invention will be given below, but it should not be construed that the invention is limited thereto.

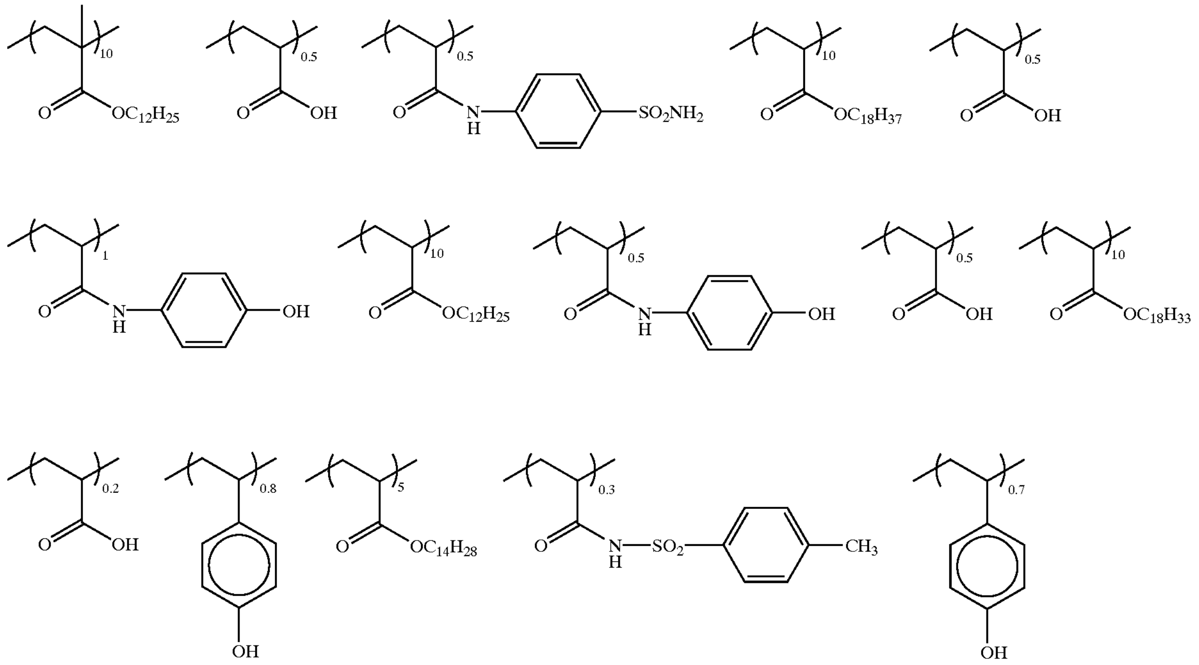

-continued
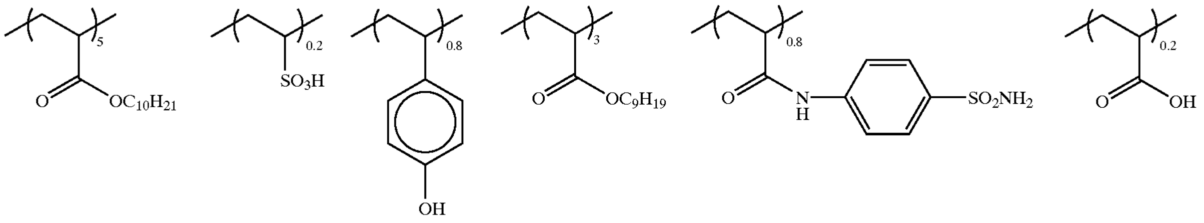
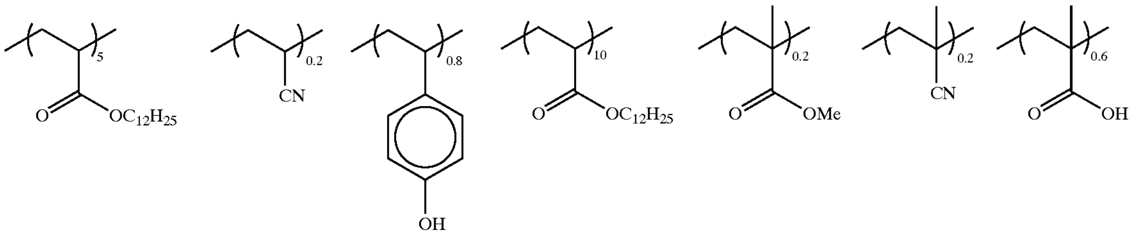
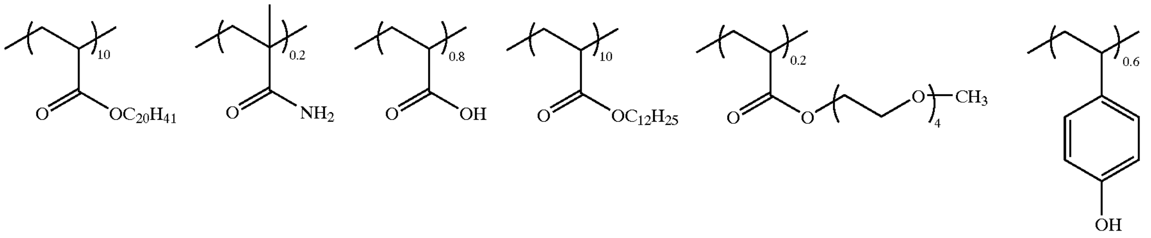
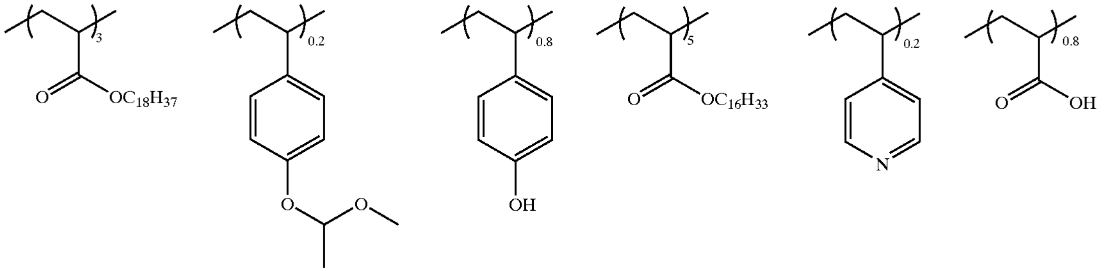
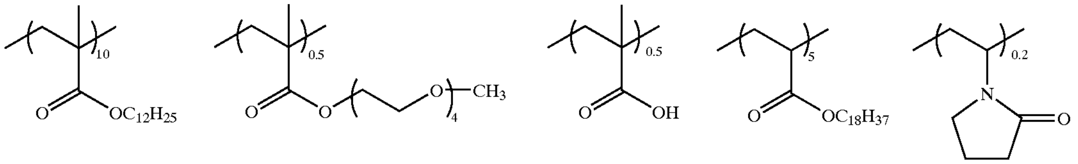
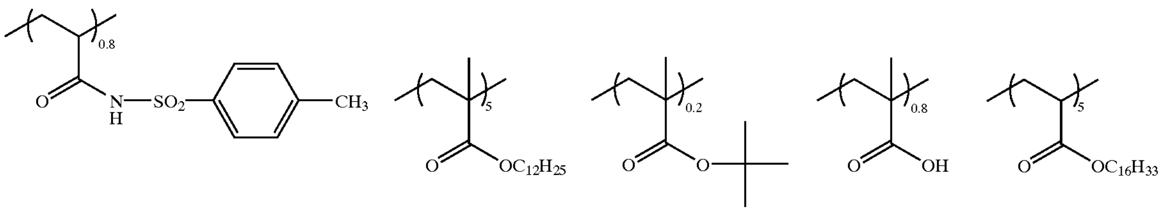
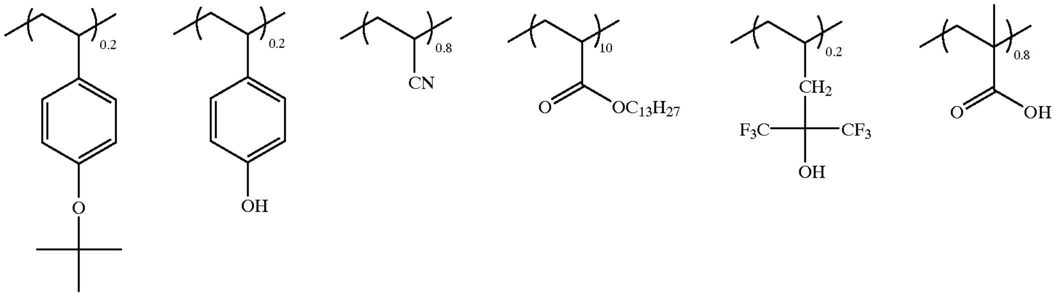

-continued
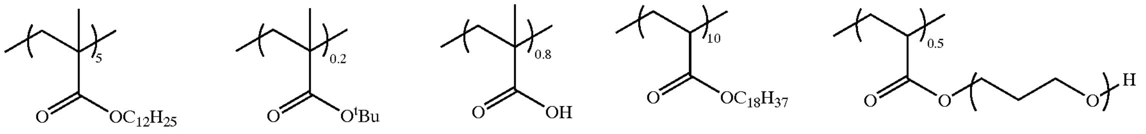
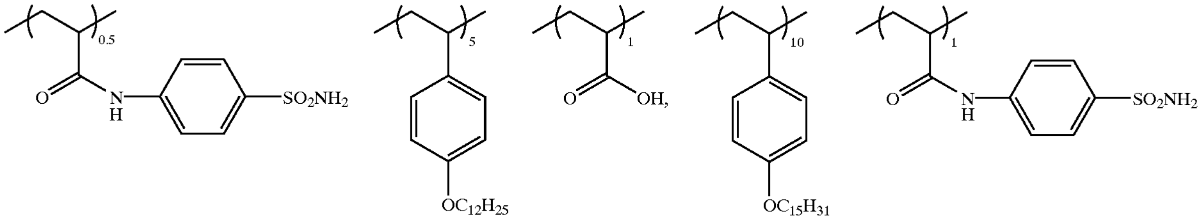
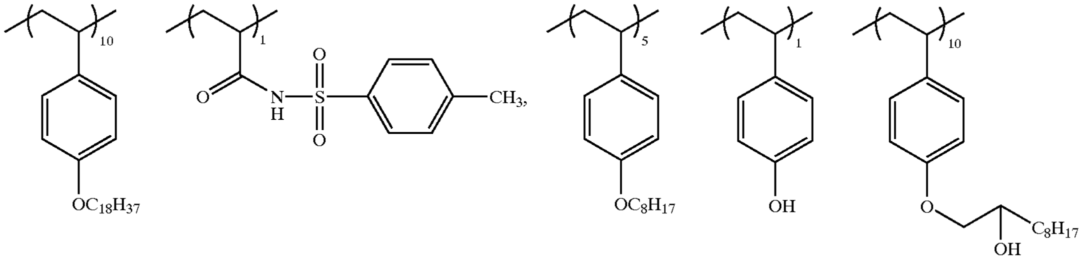
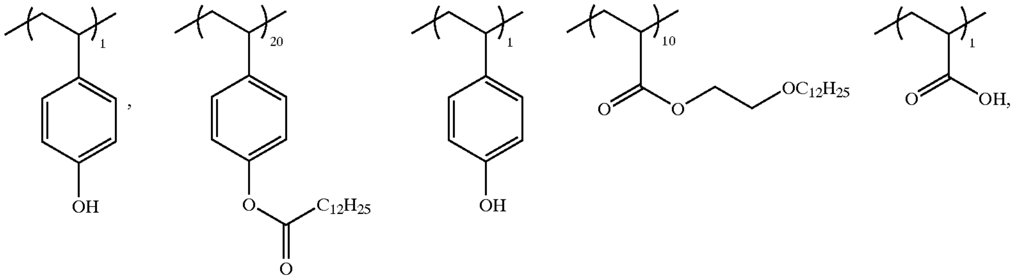
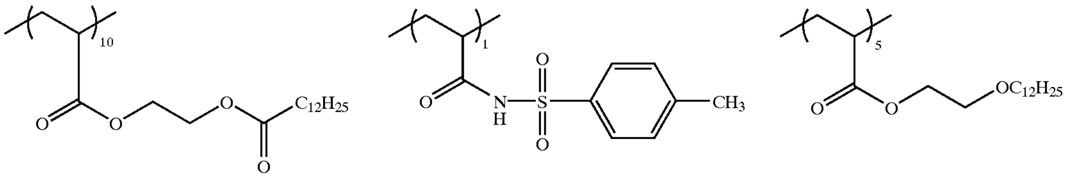
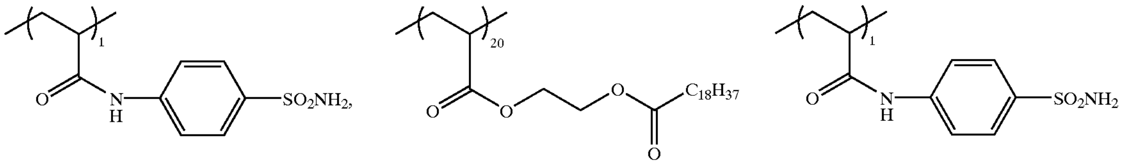
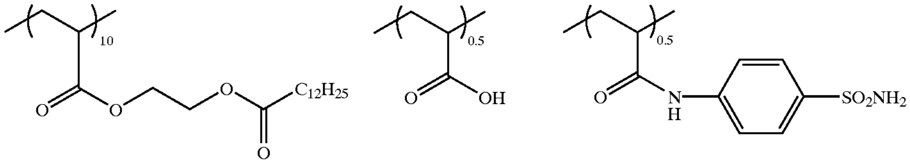
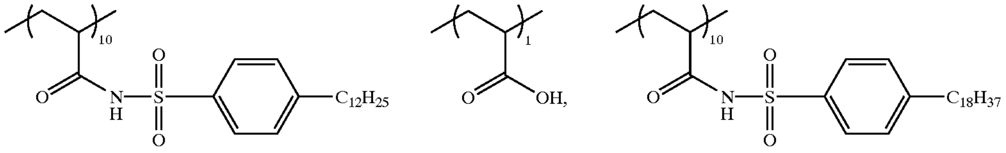
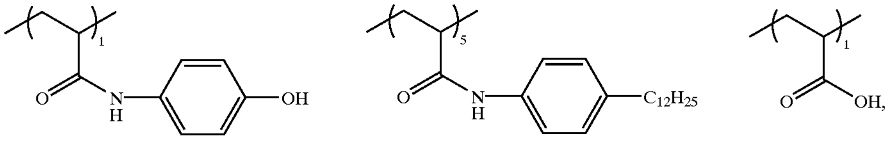

-continued

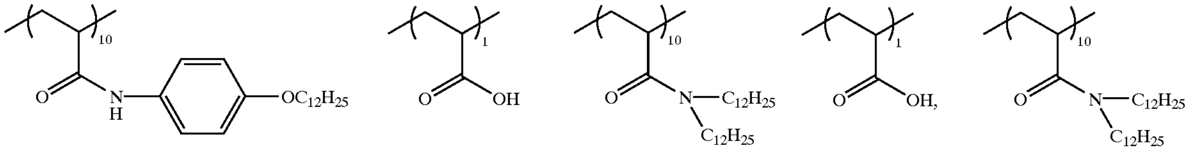

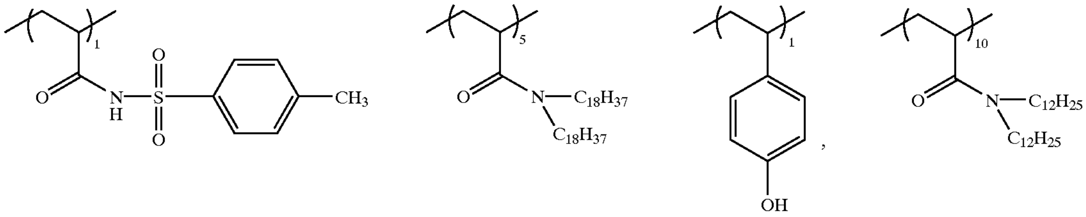

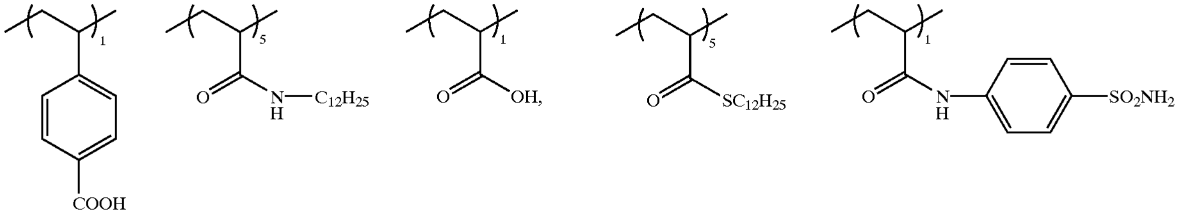

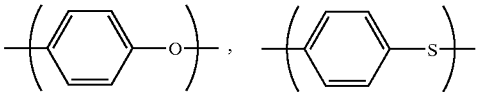

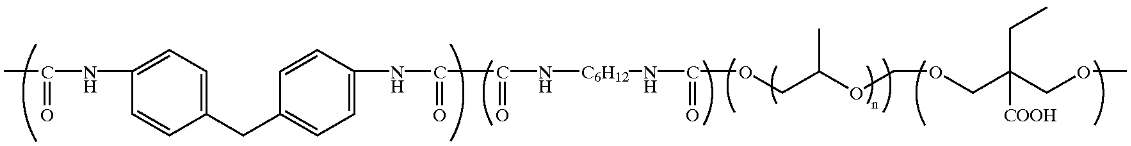

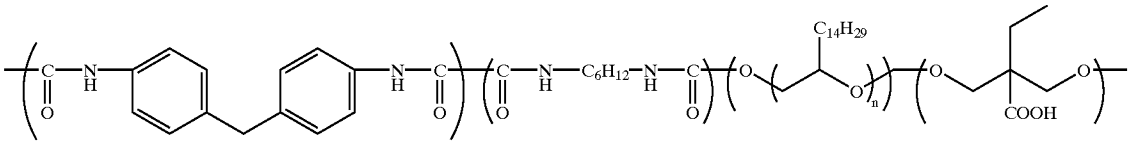

As the polymer to lower a dynamic coefficient of friction to from 0.38 to 0.60, which is used in the invention, those having a weight average molecular weight of 2,000 or more and a number average molecular weight of 1,000 or more are preferably used. More preferably, the weight average molecular weight as reduced into polystyrene is from 5,000 to 5,000,000, further preferably from 5,000 to 2,000,000, and most preferably from 10,000 to 1,000,000. These polymers may be used singly or in admixture of two or more thereof.

In the case where the image recording material of the invention is applied to a lithographic printing plate precursor, the amount of the residual monomers in the polymer used in the invention is preferably 10% by weight or less, and more preferably 5% by weight from the standpoints of problems such as transfer to a protective paper (laminated paper) or the back surface of the support during the lamination of a lithographic printing plate precursor, and transfer to rollers during the manufacture of a lithographic printing plate precursor.

The amount of the polymer to be used in the invention is preferably from 0.1 to 20% by weight, and more preferably from 0.2 to 15% by weight on a basis of the whole components of the recording layer for which the image recording material is used. When the amount of the polymer falls within this range, there is neither a problem in the transfer of a scratch resistance-improving material during the manufacture or conveying nor a problem in image forming properties, and good scratch resistance can be achieved.

In order to enhance the quality of the coating surface, the coating solution for recording layer of the invention may contain a surfactant such fluorine-based surfactants as described in JP-A-62-170950 and JP-A-2002-72474. An amount of the surfactant to be added is preferably from 0.001 to 1.0% by weight, and more preferably from 0.005 to 0.5% by weight of the solids content of the recording layer.

In the case where such a fluorine-based surfactant is used in combination with the polymer used in the invention, the amount of the polymer to be used in the invention is preferably from 0.5 to 30% by weight, and more preferably from 1 to 20% by weight on a basis of the whole components of the recording layer for which the image recording material is used.

The polymer used in the invention may be compatible or cause phase separation in the image forming material. The outermost surface layer of the image forming material containing the polymer used in the invention may be smooth or have irregularities.

The surface of the image forming material containing the polymer used in the invention preferably has a contact angle of water droplet in air in the range of from 60° to 140°.

It is preferred that the polymer used in the invention is not crystallized in the image forming material.

(Infrared Ray Absorber)

As the infrared ray absorber, any substance that absorbs infrared rays to generate a heat can be used without particular limitations on the absorption wavelength region. From the viewpoint of the adaptability to readily available high-output lasers, infrared ray absorbing dyes or pigments having an absorption maximum at a wavelength of from 700 nm to 1,200 nm are preferable.

As the dyes are employable commercially available dyes and known dyes as described in, for example, *Senryo Binran* (Dye Handbook) edited by The Society of Synthetic Organic Chemistry, Japan (1970). Specific examples include azo dyes, metal complex salt azo dyes, pyrazolone azo dyes, naphthoquinone dyes, anthraquinone dyes, phthalocyanine dyes, naphthalocyanine dyes, carbonium dyes, quinoneimine dyes, methine dyes, cyanine pigments, squarylium dyes, (thio)pyrylium salts, metal thiolate complexes, indoaniline metal complex-based dyes, oxonol dyes, diimonium dyes, aminium dyes, chroconium dyes, and intermolecular CT dyes.

Preferred examples of the dye include cyanine pigments as described in JP-A-58-125246, JP-A-59-84356, and JP-A-60-78787; methine dyes as described in JP-A-58-173696, JP-A-58-181690, and JP-A-58-194595; naphthoquinone dyes as described in JP-A-58-112793, JP-A-58-224793, JP-A-59-48187, JP-A-59-73996, JP-A-60-52940, and JP-A-60-63744; squarylium dyes as described in in JP-A-58-112792; and cyanine pigments as described in British Patent No. 434,875.

Also, near infrared absorbing sensitizers as described in U.S. Pat. No. 5,156,938 can be suitably used. In addition, substituted aryl benzo(thio)pyrylium salts as described in U.S. Pat. No. 3,881,924, trimethylthiapyrylium salts as described in JP-A-57-142645 (corresponding to U.S. Pat. No. 4,327,169), pyrylium-based compounds as described in JP-A-58-181051, JP-A-58-220143, JP-A-59-41363, JP-A-59-84248, JP-A-59-84249, and JP-A-59-146063, JP-A-59-146061, cyanine pigments as described in JP-A-59-216146, pentamethinethiopyrylium salts as described in U.S. Pat. No. 4,283,475, andpyrylium compounds as disclosed in JP-B-5-13514 (the term "JP-B" as used herein means an "examined Japanese patent publication") and JP-B-5-19702.

Moreover, near infrared absorbing dyes as described as the formulae (I) and (II) in U.S. Pat. No. 4,756,993 can be enumerated as another preferred example of the dye.

Among these dyes are particularly preferable cyanine pigments, phthalocyanine dyes, oxonol dyes, squarylium dyes, pyrylium salts, thiopyrylium dyes, and nickel thiolate complexes.

In addition, the dyes represented by the following formulae (a) to (f-2) are superior in light-heat conversion efficiency and hence, are preferred. Especially, when used for the photo-sensitive composition of the invention, the cyanine pigments represented by the formula (a) are most preferred because they give high mutual action with an alkali-soluble resin and are superior in stability and economy.

Formula (a)

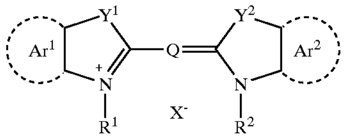

In the formula (a), $R^1$ and $R^2$ each independently represents an optionally substituted hydrocarbon group having 20 or less carbon atoms. Examples of the substituent include an alkoxy group, an aryl group, an amide group, an alkoxycarbonyl group, a hydroxyl group, a sulfo group, and a carboxyl group. $Y^1$ and $Y^2$ each independently represents oxygen, sulfur, selenium, a dialkylmethylene group, or —CH=CH—. $Ar^1$ and $Ar^2$ each independently represents an aromatic hydrocarbon group which may be substituted with a substituent selected from an alkyl group, an alkoxy group, a halogen atom, and an alkoxycarbonyl group and may be fused with an aromatic ring together with $Y^1$ or $Y^2$ via adjacent continuous two carbon atoms.

X represents a counter ion necessary for neutralization of the electric charge, and in the case where the pigment cation moiety has an anionic substituent, X is not always necessary. Q represents a polymethine group selected from a trimethine group, a pentamethine group, a heptamethine group, a nonamethine group, and an undecamethine group. Of these, a pentamethine group, a heptamethine group, and a nonamethine group are preferable from the standpoints of the wavelength adaptability against infrared rays to be used for the exposure and the stability. It is preferred from the standpoint of the stability to have a cyclohexene ring or a cyclopentene ring containing continuous three methine chains on any one of the carbon atoms.

Q may be substituted with a group selected from an alkoxy group, an aryloxy group, an alkylthio group, an arylthio group, a dialkylamino group, a diarylamino group, a halogen atom, an alkyl group, an aralkyl group, a cycloalkyl group, an aryl group, an oxy group, an iminium group, and a substituent represented by the following formula (Q1). Preferred examples of the substituent include a halogen atom such as a chlorine atom, a diarylamino group such as a diphenylamino group, and an arylthio group such as a phenythio group.

(Q1)

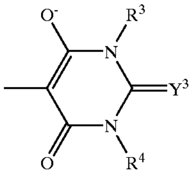

In the formula (Q1), $R^3$ and $R^4$ each independently represents a hydrogen atom, an alkyl group having from 1 to 8 carbon atoms, or an aryl group having from 6 to 10 carbon atoms, and $Y^3$ represents an oxygen atom or a sulfur atom.

In the case where the exposure is carried out with infrared rays having a wavelength of from 800 to 840 nm, heptamethinecyanine pigments represented by the following formulae (a-1) to (a-4) are particularly preferred as the cyanine pigment represented by the formula (a).

Formula (a-1)

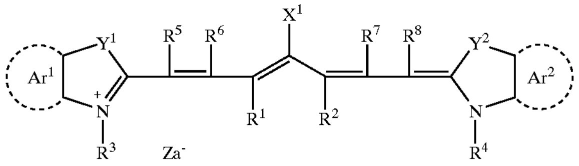

In the formula (a-1), $X^1$ represents a hydrogen atom or a halogen atom. $R^1$ and $R^2$ each independently represents a hydrocarbon group having from 1 to 12 carbon atoms. From the standpoint of the storage stability of the coating solution for recording layer, it is preferred that $R^1$ and $R^2$ each represents a hydrocarbon group having 2 or more carbon atoms. More preferably, $R^1$ and $R^2$ are taken together to form a 5-membered or 6-membered ring.

$Ar^1$ and $Ar^2$ may be the same or different and each represents an optionally substituted aromatic hydrocarbon group. Preferred examples of the aromatic hydrocarbon group include a benzene ring and a naphthalene ring. Preferred examples of the substituent include a hydrocarbon group having 12 or less carbon atoms, a halogen atom, and an alkoxy group having 12 or less carbon atoms. $Y^1$ and $Y^2$ may be the same or different and each represents a sulfur atom or a dialkylmethylene group having 12 or less carbon atoms. $R^3$ and $R^4$ may be the same or different and each represents an optionally substituted hydrocarbon group having 20 or less carbon atoms. Preferred examples of the substituent include an alkoxy group having 12 or less carbon atoms, a carboxyl group, and a sulfo group. $R^5$, $R^6$, $R^7$, and $R^8$ may be the same or different and each represents a hydrogen atom or a hydrocarbon group having 12 or less carbon atoms, and preferably a hydrogen atom from the standpoint of the easiness for availability of the raw materials. $Za^-$ represents a counter anion necessary for neutralization of the electric charge, and in the case where any one of $R^1$ to $R^8$ is substituted with an anionic substituent, $Za^-$ is not necessary. From the standpoint of the storage stability of the coating solution for recording layer, preferred examples of $Za^-$ include a halogen ion, a perchloric acid ion, a tetrafluoroborate ion, a hexafluorophosphate ion, and a sulfonic acid ion, with a perchloric acid ion, a tetrafluoroborate ion, a hexafluorophosphate ion, and a sulfonic acid ion being particularly preferred. The heptamethine pigment represented by the foregoing formula (a-1) can be suitably used for positive-working image recording materials. In particular, the heptamethine pigment represented by the foregoing formula (a-1) can be preferably used for so-called mutual action-release positive-working image recording materials combined with a phenolic hydroxyl group-containing alkali-soluble resin.

Formula (a-2)

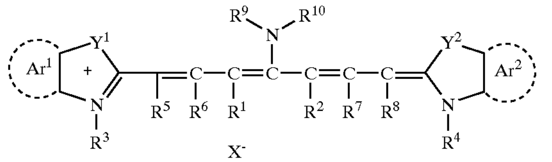

In the formula (a-2), $R^1$ and $R^2$ each independently represents a hydrogen atom or a hydrocarbon group having from 1 to 12 carbon atoms. $R^1$ and $R^2$ may be taken together to form a ring structure. Preferred examples of the ring to be formed include a 5-membered ring and a 6-membered ring, with a 5-membered ring being particularly preferred. $Ar^1$ and $Ar^2$ may be the same or different and each represents an optionally substituted aromatic hydrocarbon group. Preferred examples of the aromatic hydrocarbon group include a benzene ring and a naphthalene ring. Preferred examples of the substituent on the aromatic hydrocarbon group include a hydrocarbon group having 12 or less carbon atoms, a halogen atom, and an alkoxy group, alkoxycarbonyl group, alkylsulfonyl group or halogenated alkyl group having 12 or less carbon atoms, with electron-withdrawing substituents being particularly preferred. $Y^1$ and $Y^2$ may be the same or different and each represents a sulfur atom or a dialkylmethylene group having 12 or less carbon atoms. $R^3$and $R^4$ may be the same or different and each represents an optionally substituted hydrocarbon group having 20 or less carbon atoms. Preferred examples of the substituent include an alkoxy group having 12 or less carbon atoms, a carboxyl group, and a sulfo group. $R^5$, $R^6$, $R^7$, and $R^8$ may be the same or different and each represents a hydrogen atom or a hydrocarbon group having 12 or less carbon atoms, with a hydrogen atom being preferred from the standpoint of the easiness for availability of the raw materials. $R^9$ and $R^{10}$ may be the same or different and each represents an optionally substituted aromatic hydrocarbon groups having from 6 to 10 carbon atoms, an alkyl group having from 1 to 8 carbon atoms, or a hydrogen atom, and $R^9$ and $R^{10}$ may be taken together to form any of rings having the following structures.

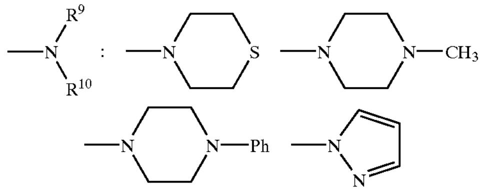

As $R^9$ and $R^{10}$, an aromatic hydrocarbon group such as a phenyl group is most preferred.

Further, $X^-$ represents a counter anion necessary for neutralization of the electric charge, which is synonymous with $Za^-$ in the foregoing formula (a-1). The heptamethine pigment represented by the formula (a-2) can be suitably used for image recording materials combined with an acid and/or a radical generator such as an onium salt, and particularly suitably used for negative-working image recording materials combined with a radical generator such as a sulfonium salt and an iodonium salt.

Formula (a-3)

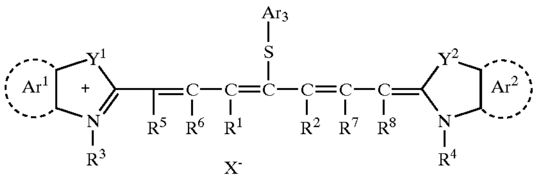

In the formula (a-3), $R^1$ to $R^8$, $Ar^1$, $Ar^2$, $Y^1$, $Y^2$, and $X^-$ are each synonymous with the definitions in the foregoing formula (a-2). $Ar^3$ represents an aromatic hydrocarbon group such as a phenyl group and a naphthyl group, or a monocyclic or polycyclic heterocyclic group containing at least one of a nitrogen atom, an oxygen atom, and a sulfur atom. Preferred examples of the heterocyclic group include a thiazole-based group, a benzothiazole-based group, a naphthothiazole-based group, a thianaphtheno-7',6',4,5-thiazole-based group, an oxazole-based group, a benzoxazole-based group, a naphthoxazole-based group, a selenazole-based group, a benzoselenazole-based group, a naphthoselenazole-based group, a thiazoline-based group, a 2-quinoline-based group, a 4-quinoline-based group, a 1-isoquinone-based group, a 3-isoquinoline-based group, a benzoimidazole-based group, a 3,3-dialkylbenzoindolenine-based group, a 2-pyridine-based group, a 4-pyridine-based group, a 3,3-dialkylbenzo[e]indole-based group, a tetrazole-based group, a triazole-based group, a pyrimidine-based group, and a thiadiazole-based group. Among them, heterocyclic groups having the following structures are particularly preferred.

Ar$^3$:

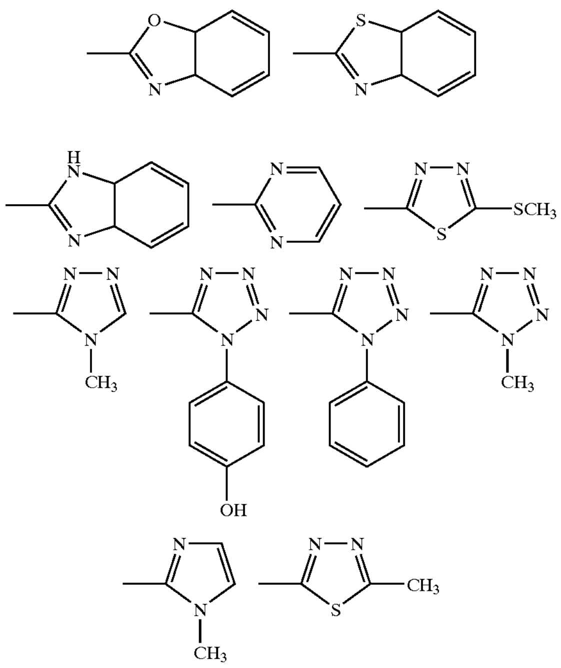

-continued

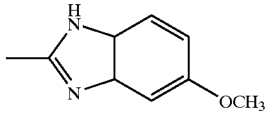

Formula (a-4)

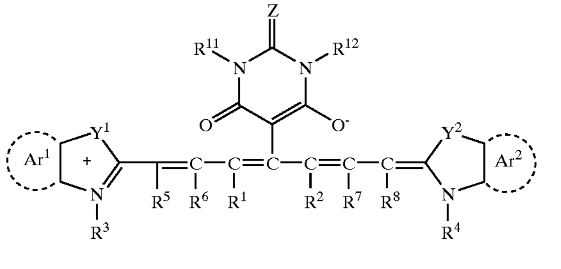

In the formula (a-4), $R^1$ to $R^8$, $Ar^1$, $Ar^2$, $Y^1$, and $Y^2$ are each synonymous with the definitions in the foregoing formula (a-2). $R^{11}$ and $R^{12}$ may be the same or different and each represents a hydrogen atom, an allyl group, a cyclohexyl group, or an alkyl group having from 1 to 8 carbon atoms. Z represents an oxygen atom or a sulfur atom.

As specific examples of the cyanine pigment represented by the formula (a), which can be suitably used in the invention, are enumerated not only those described below but also those described in paragraphs [0017] to [0019] of JP-A-2001-133969, paragraphs [0012] to [0038] of JP-A-2002-40638, and paragraphs [0012] to [0023] of JP-A-2002-23360.

IR-1

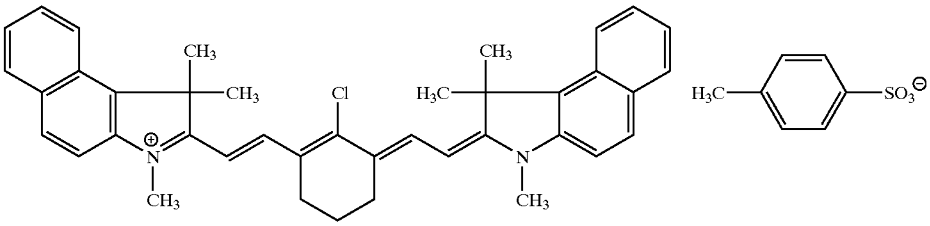

IR-2

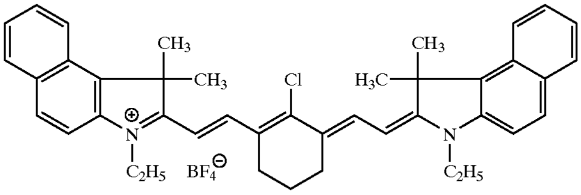

IR-3

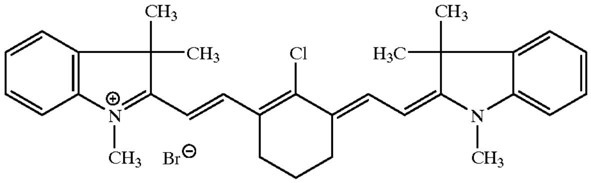

IR-4

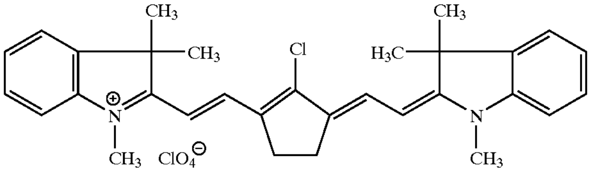

IR-5

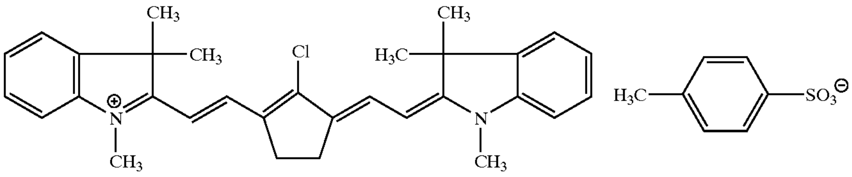

-continued
IR-6
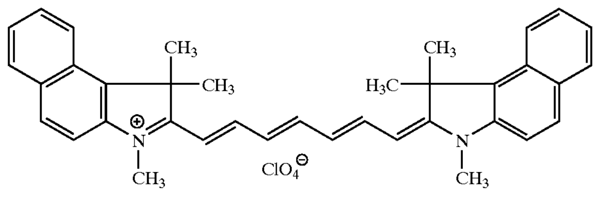
IR-7
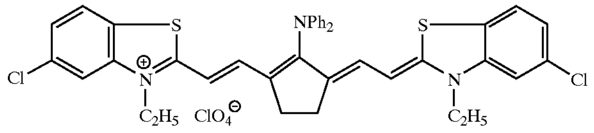
IR-8
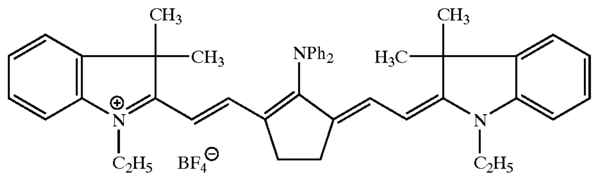
IR-9
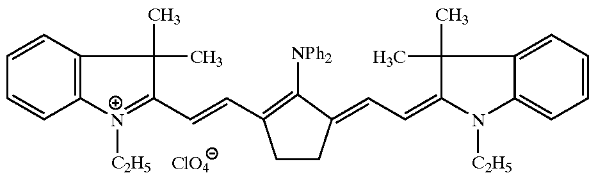
IR-10
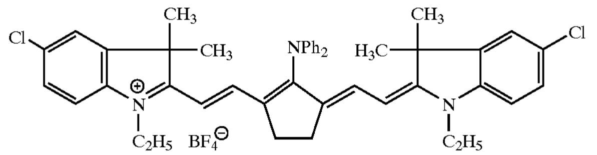
IR-11
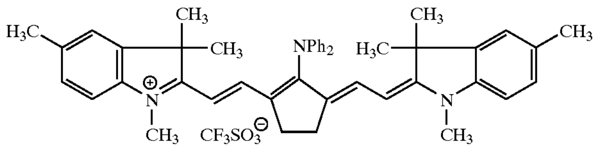
IR-12
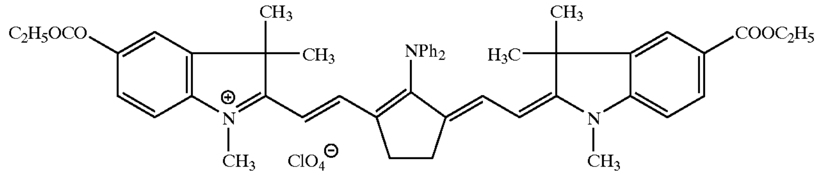
IR-13
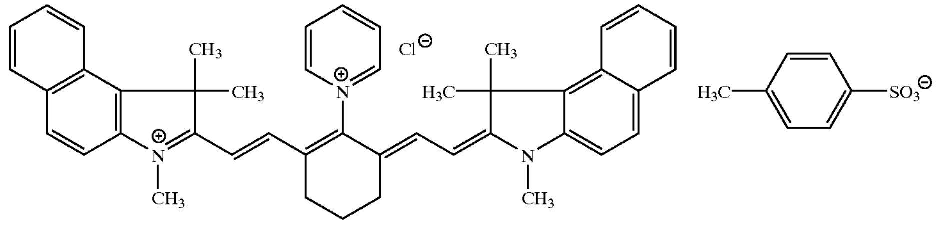
IR-14
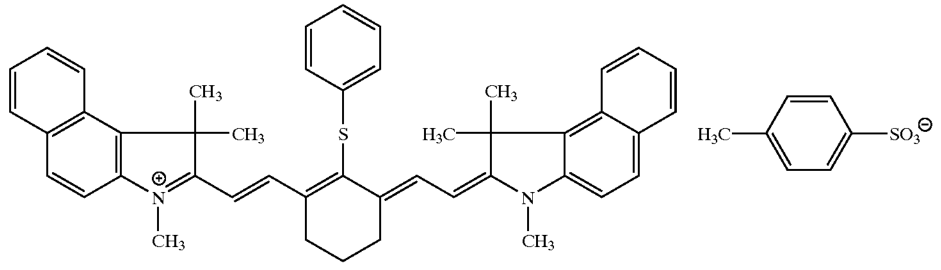

-continued
IR-15
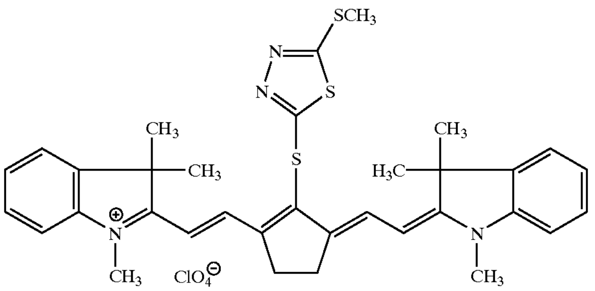
IR-16
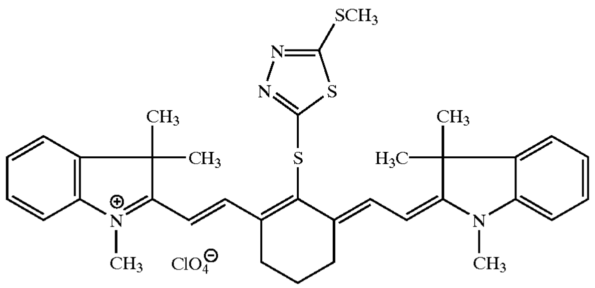
IR-17
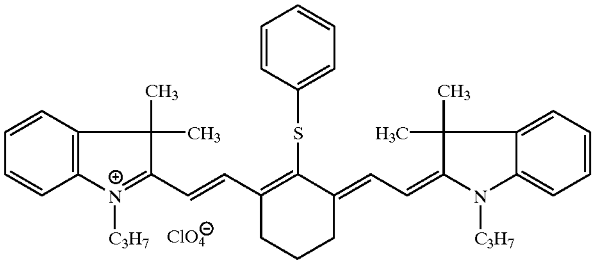
IR=18
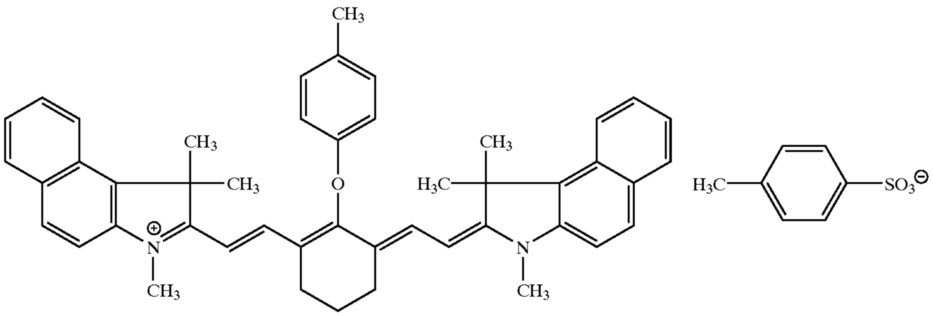
IR-19
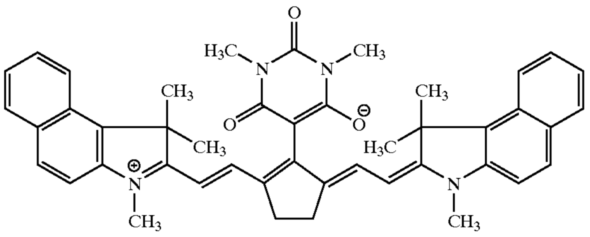
IR-20
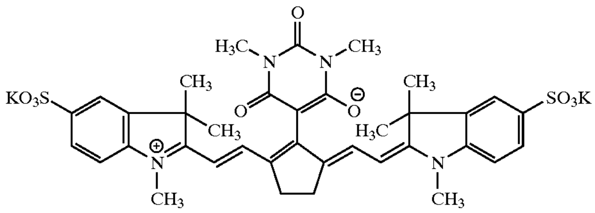
IR-21
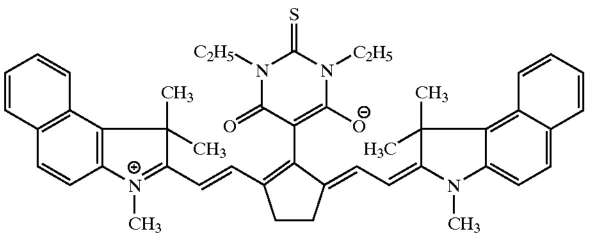
IR-22
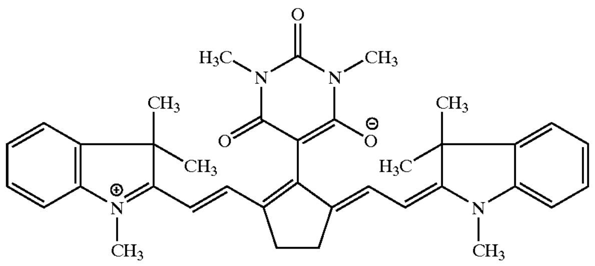

-continued

IR-23

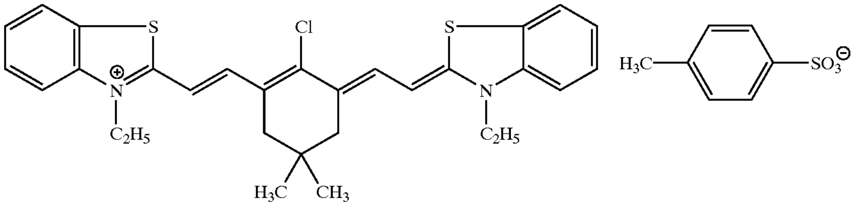

IR-24

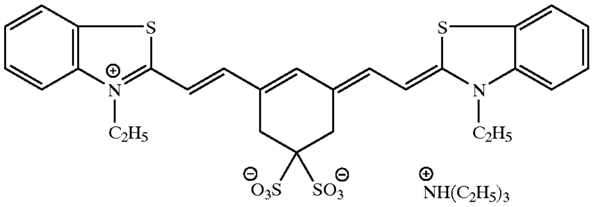

IR-25

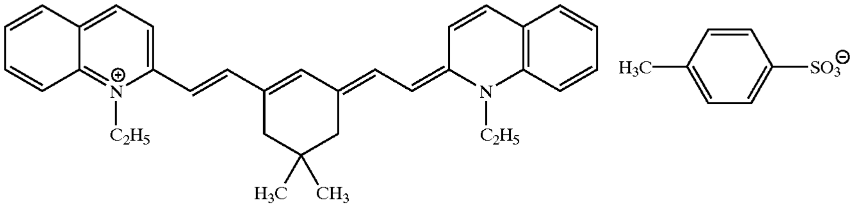

IR-26

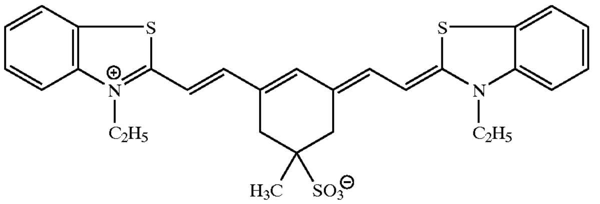

IR-27

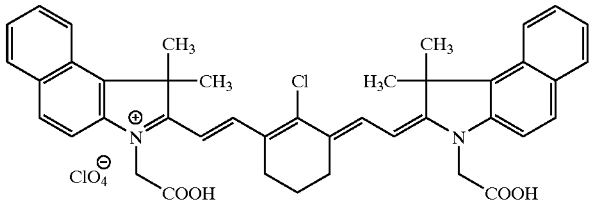

IR-28

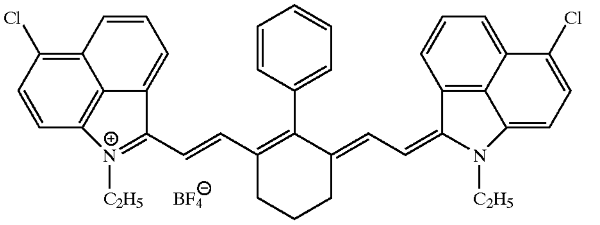

IR-29

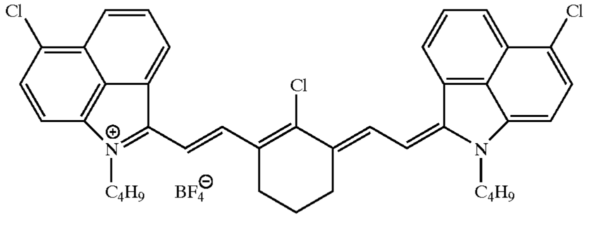

Formula (b)

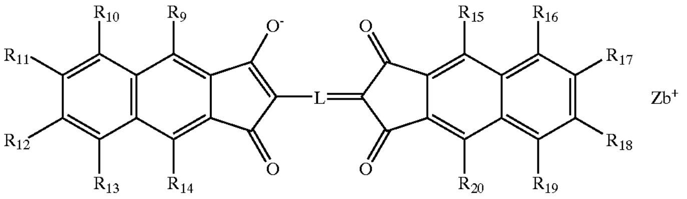

In the formula (b), L represents a methine chain having 7 or more conjugated carbon atoms. The methine chain may be substituted, and the substituents may be taken together to form a ring structure. $Zb^+$ represents a counter cation. Preferred examples of the counter cation include ammonium, iodonium, sulfonium, phosphonium, pyridinium, and an alkali metal cation (such as $Ni^+$, $K^+$, and $Li^+$). $R^9$ to $R^{14}$ and $R^{15}$ to $R^{20}$ each independently represents a hydrogen atom or a substituent selected from a halogen atom, a cyano group, an alkyl group, an aryl group, an alkenyl group, an alkynyl group, a carbonyl group, a thio group, a sulfonyl group, a sulfinyl group, an oxy group, and an amino group, or a combination of two or three of these substituents, and may be taken together to form a ring structure. Among the compounds represented by the formula (b), those in which L represents a methine group having 7 conjugated carbon atoms, and all of $R^9$ to $R^{14}$ and $R^{15}$ to $R^{20}$ represent a hydrogen atom are preferred from the standpoints of the easiness for availability and the effects.

Specific examples of the dye represented by the formula (b), which can be suitably used in the invention, will be given below.

IR-30

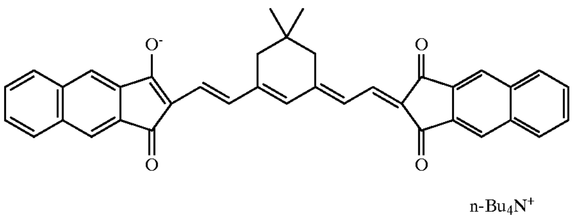

IR-31

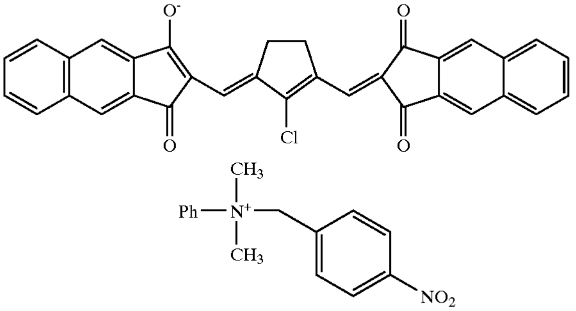

IR-32

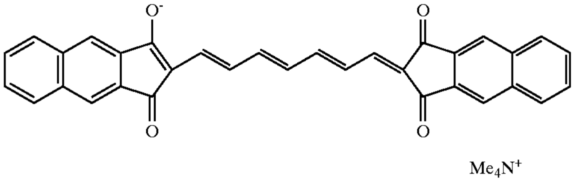

Formula (c)

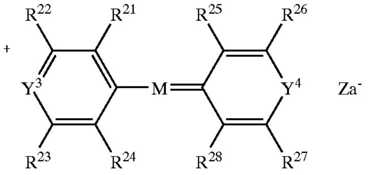

In the formula (c), $Y^3$ and $Y^4$ each independently represents an oxygen atom, a sulfur atom, a selenium atom, or a tellurium atom. M represents a methine chain having 5 or more conjugated carbon atoms. $R^{21}$ to $R^{24}$ and $R^{25}$ and $R^{28}$ may be the same or different and each represents a hydrogen atom, a halogen atom, a cyano group, an alkyl group, an aryl group, an alkenyl group, an alkynyl group, a carbonyl group, a thio group, a sulfonyl group, a sulfinyl group, an oxy group, or an amino group. $Za^-$ represents a counter anion, which is synonymous with $Za^-$ in the foregoing formula (a-1).

Specific examples of the dye represented by the formula (c), which can be suitably used in the invention, will be given below.

IR-33

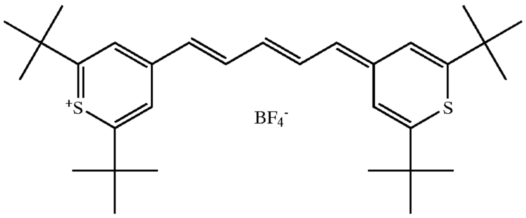

-continued

IR-34

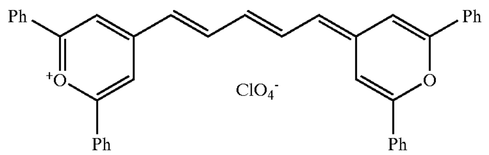

IR-35

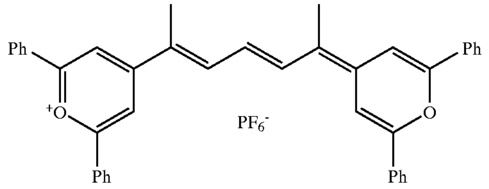

IR-36

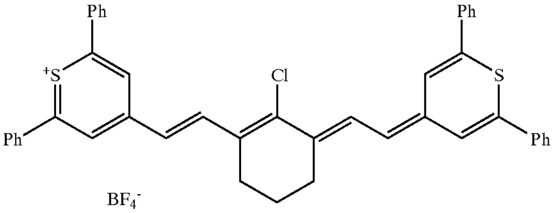

IR-37

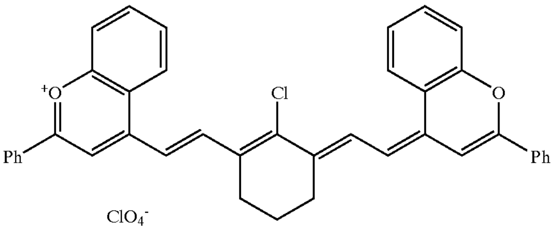

Formula (d)

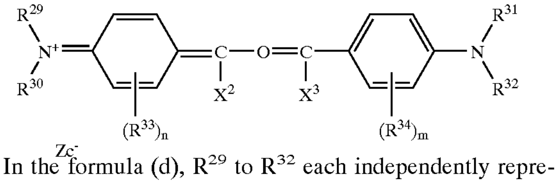

In the formula (d), $R^{29}$ to $R^{32}$ each independently represents a hydrogen atom, an alkyl group, or an aryl group. $R^{33}$ and $R^{34}$ each independently represents an alkyl group, a substituted oxy group, or a halogen atom. n and m each independently represents an integer of from 0 to 4. $R^{29}$ and $R^{30}$, or $R^{31}$ and $R^{32}$, may be taken together to form a ring. Further, $R^{29}$ and/or $R^{30}$ may be bound to $R^{33}$ to form a ring, and $R^{31}$ and/or $R^{32}$ may be bound to $R^{34}$ to form a ring. Moreover, in the case where a plural number of $R^{33}$s' or $R^{34}$s' are present, $R^{33}$s' or $R^{34}$s' may be taken together to form a ring. $X^2$ and $X^3$ each independently represents a hydrogen atom, an alkyl group, or an aryl group. Q represents an optionally substituted trimethine group or pentamethine group and may form a ring structure together with a divalent organic group. $Zc^-$ represents a counter anion, which is synonymous with $Za^-$ in the foregoing formula (a-1).

Specific examples of the dye represented by the formula (d), which can be suitably used in the invention, will be given below.

IR-38

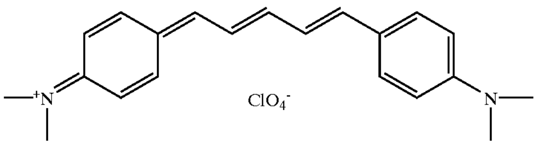

IR-39

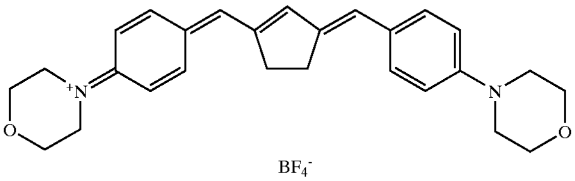

IR-40

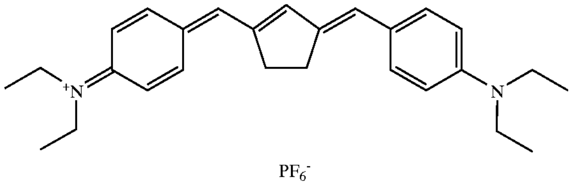

IR-41

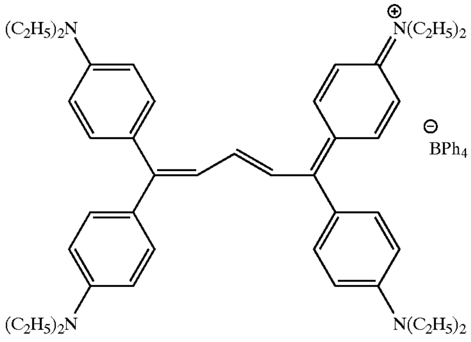

-continued

Formula (e)

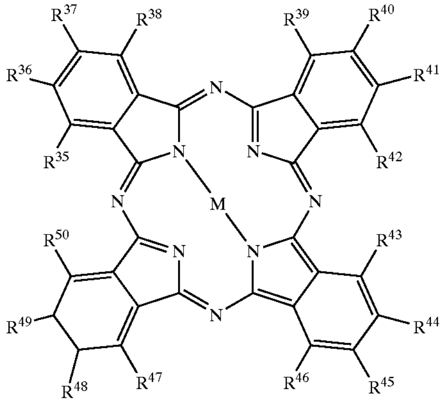

In the formula (e), $R^{35}$ to $R^{50}$ each independently represents a hydrogen atom, or a halogen atom, a cyano group, an alkyl group, an aryl group, an alkenyl group, an alkynyl group, a hydroxyl group, a carbonyl group, a thio group, a sulfonyl group, a sulfinyl group, an oxy group, an amino group, or an onium salt structure, each of which may be substituted. $R^{36}$ and $R^{37}$, $R^{40}$ and $R^{41}$, $R^{44}$ and $R^{45}$, or $R^{48}$ and $R^{49}$ may be connected to each other to form an aliphatic ring, an aromatic ring, or a heterocyclic ring, and each of these rings may have a fused ring. M represents two hydrogen atoms, or a metal atom, a halometal group, or an oxymetal group. Examples of the metal atom to be contained include atoms belonging to the groups IA, IIA, IIIB and IVB of the periodic table, transition metals of the first, second and third periods of the periodic table, and lanthanoid elements. Among them are preferable copper, nickel, magnesium, iron, zinc, tin, cobalt, aluminum, titanium, and vanadium, with vanadium, nickel, zinc, and tin being particularly preferred. In order to make the valence proper, these metal atoms may be bound to an oxygen atom or a halogen atom.

Specific examples of the dye represented by the formula (e), which can be suitably used in the invention, will be given below.

IR-42

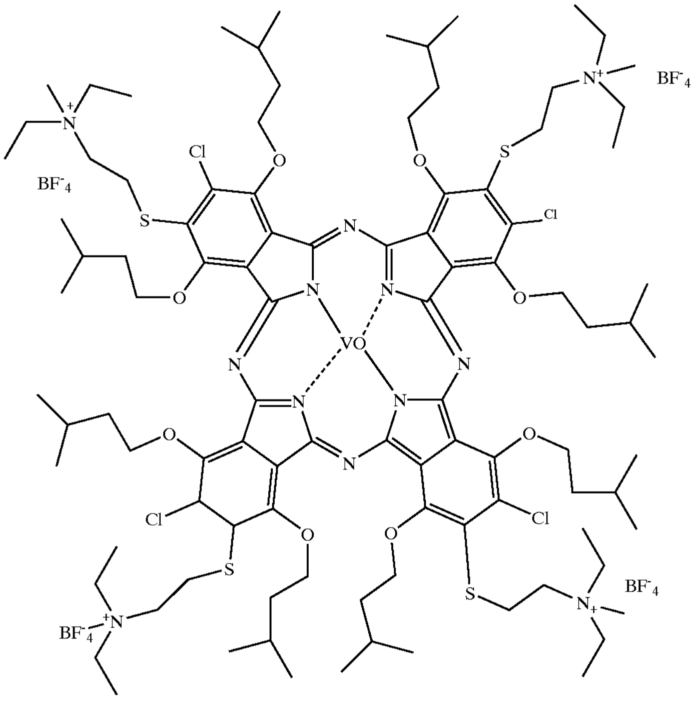

-continued
IR-43
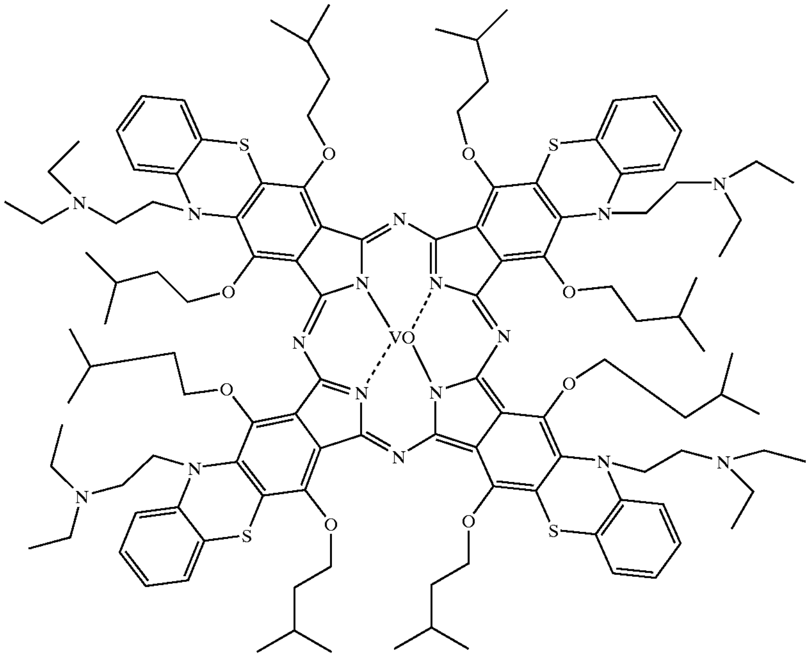
IR-44
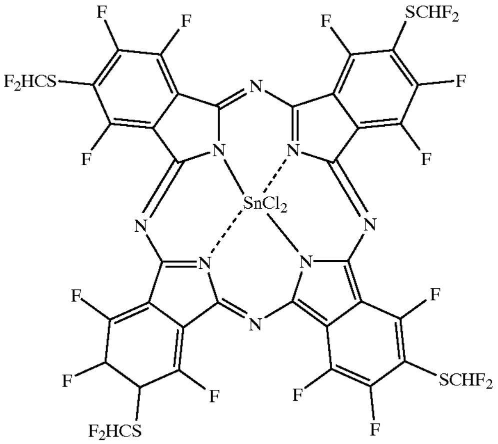
Formula (f-1) & Formula (f-2)
(f-1)
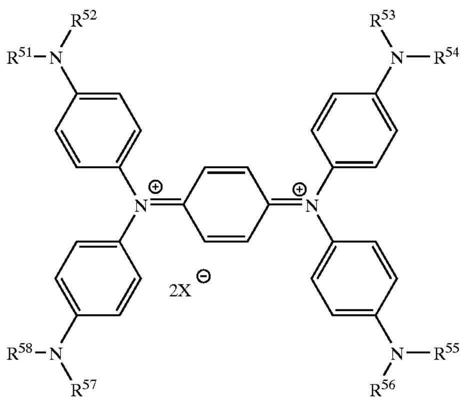
-continued
(f-2)
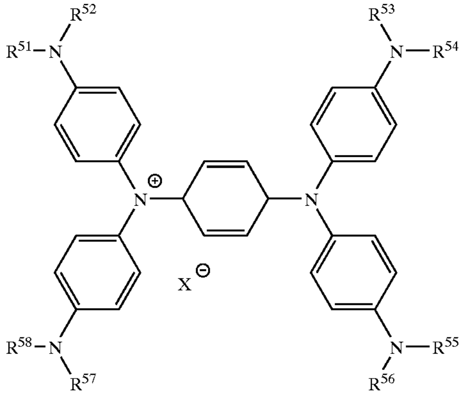

In the formulae (f-1) and (f-2), $R^{51}$ to $R^{58}$ each independently represents a hydrogen atom or an optionally substituted alkyl group or aryl group. $X^-$ is the same as defined in the foregoing formula (a-2).

Specific examples of the dyes represented by the formulae (f-1) and (f-2), which can be suitably used in the invention, will be given below.

IR-45

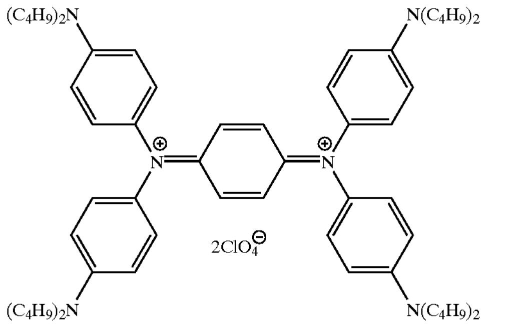

IR-46

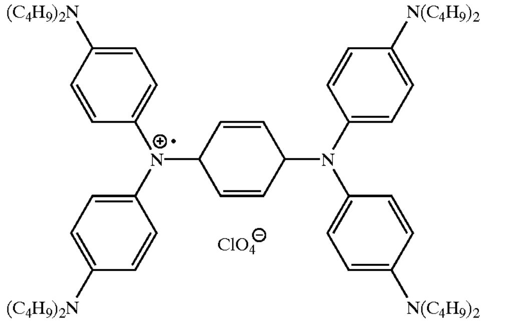

Besides the foregoing infrared ray absorbers, dyes having a plurality of chromophores as described in JP-A-2001-242613, can be suitably used dyes comprising a polymer compound having a chromophore connected thereto via covalent bond as described in JP-A-2002-97384 and U.S. Pat. No. 6,124,425, anionic dyes as described in U.S. Pat. No. 6,248,893, dyes having a surface orienting group as described in JP-A-2001-347765.

As the pigment that is used as the infrared ray absorber in the invention, are enumerated commercially available pigments and pigments as described in *The Color Index Handbook: Saishin Ganryo Binran* (The Newest Pigment Handbook), edited by the Society of Pigment Technology, Japan (1977), *Saishin Ganryo Oyo Gijutsu* (The Newest Pigment Application Technology), published by CMC Publishing Co., Ltd. (1986), and *Insatsu Ink Gijutsu* (Printing Ink Technology), published by CMC Publishing Co., Ltd. (1984).

As the type of the pigment are enumerated black pigments, yellow pigments, orange pigments, brown pigments, red pigments, violet pigments, blue pigments, green pigments, fluorescent pigments, metal powder pigments, and polymer-binding pigments. Specific examples include insoluble azo pigments, azo lake pigments, condensed azo pigments, chelate azo pigments, phthalocyanine-based pigments, anthraquinone-based pigments, perylene- and perynone-based pigments, thioindigo-based pigments, quinacridone-based pigments, dioxazine-based pigments, isoindolinone-based pigment, quinophthalone-based pigments, dyeing lake pigments, azine pigments, nitroso pigments, nitro pigments, natural pigments, fluorescent pigments, inorganic pigments, and carbon black, with carbon black being preferred.

These pigments may be used with or without being subjected to surface treatment. As the method of the surface treatment, there may be considered a method of coating the pigment surface with a resin or a wax, a method of attaching a surfactant to the pigment surface, and a method of binding a reactive substance (such as silane coupling agents, epoxy compounds, andpolyisocyanates) to the pigment surface. These surface treatment methods are described in *Kinzoku Sekken No Seishitsu To Oyo* (Nature and Application of Metallic Soap), published by Saiwai Shobo Co., Ltd., *Insatsu Ink Gijutsu* (Printing Ink Technology), published by CMC Publishing Co., Ltd. (1984), and *Saishin Ganryo Oyo Gijutsu* (The Newest Pigment Application Technology), published by CMC Publishing Co., Ltd. (1986).

The particle size of the pigment is preferably in the range of from 0.01 μm to 10 μm, more preferably from 0.05 μm to 1 μm, and most preferably from 0.1 μm to 1 μm. When the particle size of the pigment falls within this range, it is possible to attain good stability of the dispersion in the coating solution for recording layer and good uniformity of the recording layer.

As the method of dispersing the pigment, the known dispersion techniques as used in the ink manufacture or toner manufacture. As a dispersion device are employable a ultrasonic dispersion unit, a sand mill, an attritor, a pearl mill, a super mill, a ball mill, an impeller, a disperser, a KD mill, a colloid mill, a dynatron, a triple roll mill, and a pressure kneader. The details are described in *Saishin Ganryo Oyo Gijutsu* (The Newest Pigment Application Technology), published by CMC Publishing Co., Ltd. (1986).

These pigments or dyes are added in an amount of from 0.01 to 50% by weight, and preferably from 0.1 to 10% by weight based on the total solids content constituting the recording layer. In the case of the dyes, the amount of the dye is particularly preferably from 0.5 to 10% by weight, and in the case of the pigments, the amount of the pigment is particularly preferably from 0.1 to 10% by weight. When the amount of the pigment or dye falls within this range, not only there is no possibility of imparting undesired influences to the uniformity and durability of the recording layer, but also good sensitivity is obtained. Further, the dye or pigment may be used singly or in admixture of two or more thereof. In order to cope with an exposure machine with a plurality of wavelengths, it is desirable to combine dyes or pigments having a different absorption wavelength.

[Lithographic Printing Plate Precursor]

As the lithographic printing plate precursor to which the image recording material of the invention is applied are enumerated a positive-working lithographic printing plate precursor and a negative-working lithographic printing plate precursor, each of which can form an image upon exposure with infrared laser.

(Positive-Working Lithographic Printing Plate Precursor)

As the positive-working lithographic printing plate precursor to which the image recording material of the invention is applied are enumerated (1) a positive-working lithographic printing plate precursor containing a water-insoluble and alkali-soluble resin (hereinafter referred to as "alkali-soluble resin" for the sake of convenience) and a substance that mutually acts with the alkali-soluble resin to inhibit the alkali solubility (this substance being referred to as "dissolution inhibitor"), which is a type of undergoing the image formation by utilizing a phenomenon wherein the mutual action is released upon heating, whereby the alkali solubility increases; and (2) a positive-working lithographic printing plate precursor containing a compound that is converted to be soluble in a developing solution (for example, an alkaline aqueous solution) by the action of an acid and an acid generator to generate an acid by heat, which is a type of undergoing the image formation by utilizing a phenomenon wherein the solubility in a developing solution increases by the action of an acid generated upon heating.

As the positive-working lithographic printing plate precursor (1) using an alkali-soluble resin and a dissolution inhibitor are enumerated positive-working lithographic printing plate precursors as described in, for example, U.S. Pat. Nos. 3,628,953 and 4,708,925, JP-A-7-285275, International Publication No. 97/39894, JP-A-11-44956, JP-A-11-268512, and JP-A-2001-324808. The positive-working lithographic printing plate precursor is not limited to these examples, but any positive-working lithographic printing plate precursors can be employed so far as the image formation is carried out by the foregoing principle.

As the positive-working lithographic printing plate precursor (1) to which the image recording material of the invention is applied is specifically enumerated a positive-working lithographic printing plate precursor comprising a support and a recording layer thereon, the recording layer containing (a) an infrared ray absorber, (b) a copolymer of a long-chain alkyl group-containing monomer and a hydrophilic monomer, which lowers a dynamic coefficient of friction to from 0.38 to 0.60, and (c) an alkali-soluble resin. More preferably, there is employed the foregoing positive-working lithographic printing plate precursor further comprising (d) a dissolution inhibitor and optionally, (e) other known additives.

The foregoing alkali-soluble resin is a water-insoluble and alkali-soluble resin and includes homopolymers having an acid group in the main chain and/or side chains in the polymer, copolymers thereof, and mixtures thereof. Among them, those having an acid group as enumerated in (1) to (6) below in the main chain and/or side chains in the polymer are preferable from the viewpoints of the solubility in an alkaline developing solution and realization of dissolution inhibition ability.

(1) Phenol group (—Ar—OH)
(2) Sulfonamide group ($—SO_2NH—R$)
(3) Active imido group ($—SO_2NHCOR$, $—SO_2NHSO_2R$, $—CONHSO_2R$)
(4) Carboxyl group ($—CO_2H$)
(5) Sulfonic acid group ($—SO_3H$)
(6) Phosphoric acid group ($—OPO_3H_2$)

Among the alkali-soluble resins having an acid group selected from those in (1) to (6) are preferable the alkali-soluble resins having the phenol group as in (1), the alkali-soluble resins having the sulfonamide group as in (2), the alkali-soluble resins having the active imido group as in (3), and alkali-soluble resins having the carboxyl group as in (4). Especially, the alkali-soluble resins having the phenol group as in (1), the alkali-soluble resins having the sulfonamide group as in (2), and the alkali-soluble resins having the carboxyl group as in (4) are most preferable from the standpoints of the solubility in an alkaline developing solution, the development latitude, and the sufficient film strength.

Examples of the alkali-soluble resins having an acid group selected from those in (1) to (6) include phenol resins, polyhydroxystyrenes, polyhalogenated hydroxystyrenes, N-(4-hydroxyphenyl) methacrylamide copolymers, hydroquinone monomethcrylate copolymers, sulfonylimide-based polymers, carboxyl group-containing polymers, phenolic hydroxyl group-containing acrylic resins, sulfonamide group-containing acrylic resins, and urethane-based resins as described in U.S. Pat. Nos. 3,628,953 and 4,708,925, JP-A-7-285275, International Publication No. 97/39894, JP-A-11-44956, JP-A-11-268512, JP-A-2001-324808, JP-A-7-28244, JP-A-7-36184, JP-A-51-34711, and JP-A-2-866.

As the dissolution inhibitor that is used in the recording layer of the positive-working lithographic printing plate precursor, if desired are preferable thermally decomposable compounds that can inhibit the dissolution of an image portion in the developing solution in a non-decomposed state, such as onium salts, o-quinonediazide compounds, aromatic sulfone compounds, and aromatic sulfonic acid ester compounds, as described in JP-A-7-285275 and JP-A-2002-55446. Examples of the onium salts include diazonium salts, ammonium salts, phosphonium salts, iodonium salts, sulfonium salts, selenonium salts, and arsonium salts.

Of the positive-working lithographic printing plate precursors, examples of the positive-working lithographic printing plate precursor (2) containing a compound that is converted to be soluble in a developing solution by the action of an acid and an acid generator include positive-working lithographic printing plate precursors as described in JP-A-9-171254, JP-A-10-55067, JP-A-10-87733, and JP-A-10-268507. The positive-working lithographic printing plate precursor is not limited to these examples, but any positive-working lithographic printing plate precursors can be employed so far as the image formation is carried out by the foregoing principle.

As the positive-working lithographic printing plate precursor (2) to which the image recording material of the invention is applied is specifically enumerated a positive-working lithographic printing plate precursor comprising a support and a recording layer thereon, the recording layer containing (a) an infrared ray absorber, (b) a copolymer of a long-chain alkyl group-containing monomer and a hydrophilic monomer, which lowers a dynamic coefficient of friction to from 0.38 to 0.60, (c) a compound capable of generating an acid upon irradiation with actinic rays (acid generator), and (d) a compound having at least one bond that is decomposable with an acid (acid-decomposable compound).

As the acid-decomposable compound can be enumerated compounds having a C—O—C bond as described in JP-A-48-89603, JP-A-51-120714, JP-A-53-133429, JP-A-55-12995, JP-A-55-126236, and JP-A-56-17345; compounds having an Si—O—C bond as described in JP-A-60-37549 and JP-A-60-121446; and other acid-decomposable compounds as described in JP-A-60-3625 and JP-A-60-10247. In addition, there are employable compounds having an Si—N bond as described in JP-A-62-222246; carbonic acid esters as described in JP-A-62-251743; orthocarbonic acid esters as described in JP-A-62-209451; orthotitanic acid esters as described in JP-A-62-280841; orthosilicic acid esters as described in JP-A-62-280842; acetals, ketals, and orthocarboxylic acid esters as described in JP-A-63-010153, JP-A-9-171254, JP-A-10-55067, JP-A-10-111564, JP-A-10-87733, JP-A-10-153853, JP-A-10-228102, JP-A-10-268507, JP-A-10-282648, JP-A-10-282670, and European Patent No. 884,547A1; and compounds having a C—S bond as described in JP-A-62-244038.

Of these are preferable compounds having a C—O—C bond, compounds having an Si—O—C bond, orthocarbonic acid esters, acetals, ketals, and silyl ethers. Also, polymers having a repeating acetal or ketal moiety in the main chain thereof, whose solubility in an alkaline developing solution increases by an acid as generated, are preferably used.

Examples of the acid generator that is used together with the foregoing acid-decomposable compound include onium salts such as iodonium salts, sulfonium salts, phosphonium salts, and diazonium salts. Specifically, compounds as described in U.S. Pat. No. 4,708,925 and JP-A-7-20629 can be enumerated. In particular, iodonium salts, sulfonium salts, and diazonium salts, each of which comprises a sulfonic acid ion as a counter ion, are preferred. As the diazonium salts are preferable diazonium compounds as described in U.S. Pat. No. 3,867,147, diazonium compounds as described in U.S. Pat. No. 2,632,703, and diazo resins as described in JP-A-1-102456 and JP-A-1-102457. Also, benzyl sulfonates as described in U.S. Pat. Nos. 5,135,838 and 5,200,544 are preferred. In addition, active sulfonic acid esters and disulfonyl compounds as described in JP-A-2-100054, JP-A-2-100055, and JP-A-9-197671 are preferred. Besides, haloalkyl-substituted S-triazines as described in JP-A-7-271029 are preferred.

(Negative-Working Lithographic Printing Plate Precursor)

As the negative-working lithographic printing plate precursor to which the image recording material of the invention is applied are enumerated a lithographic printing plate precursor utilizing a phenomenon wherein a radical polymerization reaction takes place by heat, whereby the product becomes insoluble in the developing solution and a lithographic printing plate precursor utilizing a phenomenon wherein a crosslinking reaction (including cationic polymerization) takes place, whereby the product becomes insoluble in the developing solution.

As the lithographic printing plate precursor utilizing a polymerization reaction by heat are negative-working lithographic printing plate precursors of a type of undergoing polymerization by the generation of heat upon exposure with infrared laser, as described in JP-A-2001-183825, JP-A-2001-337447, JP-A-2002-023360, JP-A-2002-040638, JP-A-2002-62642, JP-A-2002-62648, and JP-A-2002-69109. These negative-working lithographic printing plate precursors utilize a phenomenon in which a radical generator (polymerization initiator) generates radicals by the generation of heat upon exposure to polymerize a polymerizable compound, whereby the product becomes insoluble in the developing solution. The negative-working lithographic printing plate precursor to which the image recording material of the invention is applied is not limited to these examples, but any negative-working lithographic printing plate precursors can be employed so far as the image formation is carried out by the foregoing principle.

As the negative-working lithographic printing plate precursor to which the image recording material of the invention is applied is enumerated a negative-working lithographic printing plate precursor comprising a support and a recording layer thereon, the recording layer containing (a) an infrared ray absorber, (b) a copolymer of a long-chain alkyl group-containing monomer and a hydrophilic monomer, which lowers a dynamic coefficient of friction to from 0.38 to 0.60, (c) a radical generator, (d) a radical polymerizable compound, and optionally, (e) binder polymers or known additives.

The radical generator that is used in the invention means a compound that generates radicals by light or heat, or the both energies, thereby initiating and promoting the polymerization of a compound having a polymerizable unsaturated group. Examples of the radical generator that can be used in the invention include known thermal polymerization initiators to be used for the synthesis reaction of polymers by radical polymerization; compounds having a bond of low bond-dissociation energy; and photo-polymerization initiators. As the compound to generate radicals that can be suitably used in the invention, compounds that generate radicals by heat energy, thereby initiating and promoting the polymerization of a compound having a polymerizable unsaturated group. The radical generator may be used singly or in admixture of two or more thereof.

Examples of such radical generators include organic halide compounds, carbonyl compounds, organic peroxide compounds, azo-based polymerization initiators, azide compounds, metallocene compounds, hexaaryl biimidazole compounds, organic boric acid compounds, disulfonic acid compounds, and onium salt compounds as described in JP-A-8-220758, JP-A-10-260536, JP-A-2001-337447, and JP-A-2002-023360. As the onium salt, the same compounds as described in the positive-working lithographic printing plate precursor can be used. In such a polymerization system, the onium salt functions not as an acid generator but as an initiator of ionic radical polymerization.

As the radical polymerizable compound that can be used in the invention are suitably used compounds having at least one, and preferably two or more terminal ethylenically unsaturated groups (such as an acryloyl group, a methacryloyl group, a vinyl group, and an allyl group) to undergo the radical polymerization reaction. These compounds are widely known as monomers for photo-polymerizable or thermally polymerizable compositions or crosslinking agents in the industrial field of the art and can be used in the invention without particular limitations. The chemical morphology includes a monomer, a prepolymer, i.e., a dimer, a trimer, an oligomer, a polymer or a copolymer, or a mixture thereof.

Specific examples of the radical polymerizable compound include polymerizable compounds as described in JP-A-8-220758, JP-A-2001-183825, and JP-A-2002-62648.

As the lithographic printing plate precursor utilizing a crosslinking reaction by heat are negative-working lithographic printing plate precursors as described in U.S. Pat. No. 5,340,696, JP-A-7-20629, JP-A-7-271029, JP-A-10-111564, JP-A-11-84649, JP-A-11-95419, JP-A-11-102071, JP-A-11-119428, JP-A-11-216965, JP-A-11-218903, JP-A-11-231509, JP-A-11-254850, and International Publication Nos. 98/51544 and 98/31545. In these negative-working lithographic printing plate precursors, there is used an acid catalyst crosslinking reaction in which the acid generator generates an acid by the generation of heat upon exposure, and the acid thus generated functions as a catalyst to cause a crosslinking reaction of a crosslinking agent, whereby the product becomes insoluble in the developing solution. Since the acid catalyst crosslinking reaction is initiated or promoted, the development may suitably proceed upon heating of the precursor after the exposure. The negative-working lithographic printing plate precursor to which the image recording material of the invention is applied is not limited to these examples, but any negative-working lithographic printing plate precursors can be employed so far as the image formation is carried out by the foregoing principle.

As the negative-working lithographic printing plate precursor to which the image recording material of the invention is applied is enumerated a negative-working lithographic printing plate precursor comprising a support and a recording layer thereon, the recording layer containing (a) an infrared ray absorber, (b) a copolymer of a long-chain alkyl group-containing monomer and a hydrophilic monomer, which lowers a dynamic coefficient of friction to from 0.38 to 0.60, (c) a compound capable of generating an acid upon irradiation with actinic rays (acid generator), (d) a crosslinking agent to undergo reaction by an acid catalyst, and optionally, (e) binder polymers or known additives.

Examples of the crosslinking agent include (i) aromatic compounds substituted with an alkoxymethyl group or a hydroxymethyl group, (ii) compounds having an N-hydroxymethyl group, an N-alkoxymethyl group, or an N-acyloxymethyl group, and (iii) epoxy compounds as described in JP-A-7-20629, JP-A-11-102071, and JP-A-11-254850.

As the acid generator that is used together with the crosslinking agent, the same compound as enumerated as the acid generator to be used in the foregoing positive-working lithographic printing plate precursor can be enumerated.

(Support for Lithographic Printing Plate Precursor)

As the support that is used in the invention, supports that are a dimensionally stable sheet and are known as printing plate support can be used. Examples of such supports include paper, papers laminated with plastics (such as polyethylene, polypropylene, and polystyrene), metal sheets (such as aluminum (inclusive of aluminum alloys), zinc, iron, and copper), plastic films (such as cellulose diacetate, cellulose triacetate, cellulose propionate, cellulose butyrate, cellulose acetate butyrate, cellulose nitrate, polyethylene terephthalate, polyethylene, polystyrene, polypropylene, polycarbonate, and polyvinyl acetal), and papers or plastic films laminated or vapor deposited with the foregoing metals, with an aluminum sheet being particularly preferred. The aluminum sheet includes a pure aluminum sheet and an aluminum alloy sheet. As the aluminum alloy can be used various aluminum alloys. Examples include alloys of aluminum and a metal such as silicon, copper, manganese, magnesium, chromium, zinc, lead, bismuth, and nickel. These compositions may contain negligible amounts of impurities in addition to slight amounts of iron and titanium.

If desired, the support is subjected to surface treatment. Preferably, the surface of the support of the photo-sensitive lithographic printing plate is subjected to hydrophilic treatment. In the case of a support having a surface of a metal, especially aluminum, it is preferred to subject the support to surface treatment such as graining treatment, immersion treatment with an aqueous solution of, e.g., sodium silicate, potassium fluorozirconate, phosphate, or anodic oxidation treatment. The anodic oxidation treatment is carried out by passing an electric current while using the aluminum sheet as an anode in an electrolyte comprising one or two or more aqueous solutions or non-aqueous solutions of an inorganic acid (such as phosphoric acid, chromic acid, sulfuric acid, and boric acid) or an organic acid (such as oxalic acid and sulfamic acid).

There are also suitably used aluminum sheets subjected to immersion treatment with a sodium silicate aqueous solution after graining as described in U.S. Pat. No. 2,714,066, and aluminum sheets subjected to anodic oxidation treatment and then to immersion treatment with an aqueous solution of an alkali metal silicate as described in U.S. Pat. No. 3,181,461. Further, the silicate vapor deposition as described in U.S. Pat. No. 3,658,662 is also effective. These hydrophilic treatments are carried out for the purposes of not only making the surface of the support hydrophilic but also preventing a noxious reaction with the photo-sensitive composition to be provided thereon and enhancing the adhesiveness to the recording layer.

Prior to graining the aluminum sheet, if desired, the surface of the aluminum sheet may be subjected to a pre-treatment for the purposes of removing a rolling oil on the surface and exposing a clean aluminum surface. For achieving the former, a solvent such as trichlene and a surfactant are used. For achieving the latter, there is widely employed a method of using an alkaline etching agent such as sodium hydroxide and potassium hydroxide.

As the graining method, any of a mechanical graining method, a chemical graining method, and an electrochemical graining method are effective. Examples of the mechanical graining method include a ball polishing method, a blast polishing method, and a brush polishing method of brushing a water dispersion slurry of a polishing agent (such as pumice) with a nylon brush. As the chemical graining method is suitable a method of undergoing immersion with a saturated aqueous solution of an aluminum salt of a mineral acid as described in JP-A-54-31187. As the electrochemical graining method is a method of undergoing alternating current electrolysis in an acidic electrolyte of hydrochloric acid, nitric acid or a combination thereof. Of these surface roughening methods, a surface roughening method comprising a combination of the mechanical surface roughening and the electrochemical surface roughening as described in JP-A-55-137993 is particularly preferred because the adhesive force of the oleophilic image to the support is high. Preferably, the graining by the foregoing methods is carried out in a manner such that a centerline surface roughness (Ra) of the surface of the aluminum sheet is within the range of from 0.3 to 1.0 $\mu$m.

If desired, the grained aluminum sheet is rinsed with water and chemically etched. The etching treatment solution is selected from aqueous solutions of a base or an acid that can usually dissolve aluminum therein. In this case, on the etched surface, a coating film different from the aluminum to be derived from the etching solution components must be provided. Preferred examples of the etching agent include basic substances such as sodium hydroxide, potassium hydroxide, trisodium phosphate, disodium phosphate, tripotassium phosphate, and dipotassium phosphate; and acidic substances such as sulfuric acid, persulfuric acid, phosphoric acid, hydrochloric acid, and salts thereof. Salts of a metal having a lower ionization tendency than aluminum, such as zinc, chromium, cobalt, nickel, and copper, are not preferred because an unnecessary coating film is formed on the etched surface. Most preferably, the etching agent is used in setting up the concentration and temperature to be used in a manner such that the dissolution rate of the aluminum or aluminum alloy is from 0.3 to 40 g/$m^2$ per minute of the immersion time. However, even when the dissolution rate is higher or lower than the specified range, there is no problem. The etching is carried out by a method of immersing the aluminum sheet with the etching solution, or by applying the etching solution on the aluminum sheet. Preferably, the etching is carried out in an etching amount ranging from 0.5 to 10 g/$m^2$. As the etching agent, it is desired to use an aqueous solution of a base because of its high etching rate. In this case, since a smut is formed, a desmutting treatment is usually carried out. Examples of an acid that is used for the desmutting treatment include nitric acid, sulfuric acid, phosphoric acid, chromic acid, hydrofluoric acid,. and borofluoric acid.

If desired, the etched aluminum sheet is rinsed with water and anodically oxidized. The anodic oxidation can be carried out by a method that has hitherto been employed in the art. Concretely, when a direct or alternating current is passed through the aluminum in an aqueous solution or non-aqueous solution of, for example, sulfuric acid, phosphoric acid, chromic acid, oxalic acid, sulfamic acid, or benzenesulofnic acid, or a combination of two or more thereof, an anodic oxidation coating film can be formed on the surface of the aluminum support.

Since the treatment condition of the anodic oxidation varies depending on the electrolyte to be used, it cannot be unequivocally defined. But, in general, it is proper that the concentration of electrolyte is from 1 to 80% by weight, the solution temperature is from 5 to 70° C. the current density is from 0.5 to 60 A/$dm^2$, the voltage is from 1 to 100 V, and the electrolysis time is from 30 seconds to 50 minutes. Of these anodic oxidation treatments are preferable a method of undergoing the anodic oxidation in sulfuric acid at a high current density as described in British Patent No. 1,412,768 and a method of undergoing the anodic oxidation using phosphoric acid as the electrolytic bath as described in U.S. Pat. No. 3,511,661.

If desired, the thus roughened and anodically oxidized aluminum sheet may be subjected to hydrophilic treatment. Preferred examples of the hydrophilic treatment include a method of treating with an alkali metal silicate (such as a sodium silicate aqueous solution) as described in U.S. Pat. Nos. 2,714,066 and 3,181,461, a method of treating with potassium fluorozirconate as described in JP-B-36-22063, and a method of treating with polyvinylsulfonic acid as described in U.S. Pat. No. 4,153,461.

For the purpose of reducing the development residual film, the support can be provided with an organic subbing layer prior to the application of the recording layer. Examples of the organic compound that is used in the organic subbing layer include carboxymethyl cellulose, dextrin, gum arabic, amino group-containing phosphonic acids (such as 2-aminoethyl phosphonate), organic phosphonic acids (such as optionally substituted phenylphosnonic acids, napthylphosphonic acids, alkylphosphonic acids, glycerophosphonic acids, methylenediphosphonic acids, and ethylenediphosphonic acids), organic phosphoric acids (such as optionally substituted phenylphosphoric acids, napthylphosphoric acids, alkylphosphoric acids, and glycerophosphoric acids), organic phosphinic acids (such as optionally substituted phenylphosphinic acids, napthylphosphinic acids, alkylphosphinic acids, and glycerophosphinic acids), amino acids (such as glycine and β-alanine), and hydrochlorides of a hydroxyl group-containing amine (such as hydrochloride of triethanolamine). These compounds may be used in admixture of two or more thereof.

It is also preferred that the organic subbing layer contains an onium group-containing compound. The details of the onium group-containing compound are described in JP-A-2000-10292 and JP-A-2000-108538.

Besides, at least one compound selected from the group of polymers having a structural unit represented by poly(p-vinylbenzoic acid) in the molecule thereof can be used. Specific examples include a copolymer of p-vinylbenzoic acid and vinylbenzyl triethylammonium salt and a copolymer of p-vinylbenzoic acid and vinylbenzyl trimethylammonium chloride.

The organic subbing layer can be provided in the following method. That is, there are employed a method in which a solution of the foregoing organic compound dissolved in water or an organic solvent (such as methanol, ethanol, and methyl ethyl ketone), or a mixed solvent thereof is applied on the aluminum sheet and then dried; and a method in which the aluminum sheet is immersed with a solution of the foregoing organic compound dissolved in water or an organic solvent (such as methanol, ethanol, and methyl ethyl ketone), or a mixed solvent thereof to adsorb the organic compound onto the aluminum sheet, which is then rinsed with water and dried to provide the organic subbing layer. In the former method, a solution having a concentration of the organic compound of from 0.005 to 10% by weight can be applied in various methods. For example, the application can be carried out by bar coater coating, rotary coating, spray coating, and curtain coating. In the latter method, the solution concentration is from 0.01 to 20% by weight, and preferably from 0.05 to 5% by weight, the immersion temperature is from 20 to 90° C., and preferably from 25 to 50° C., and the immersion time is from 0.1 seconds to 20 minutes, and preferably from 2 seconds to one minute.

The solution to be used can be adjusted so as to have a pH in the range of from 1 to 12 with a basic substance (such as ammonia, triethylamine, and potassium hydroxide) or an acidic substance (such as hydrochloric acid and phosphoric acid).

To this solution can be added a compound represented by the following formula (V).

$$(HO)_x—R_5—(COOH)_y \qquad \text{Formula (V)}$$

In the formula (V), $R_5$ represents an optionally substituted arylene group having 14 or less carbon atoms; and x and y each independently represents an integer of from 1 to 3.

Specific examples of the compound represented by the formula (V) include 3-hydroxybenzoic acid, 4-hydroxybenzoic acid, salicylic acid, 1-hydroxy-2-naphthoenic acid, 2-hydroxy-1-naphthoenic acid, 2-hydroxy-3-naphthoenic acid, 2,4-dihydroxybenzoic acid, and 10-hydroxy-9-anthracenecarboxylic acid.

The coverage of the organic subbing layer after drying is suitably from 1 to 100 mg/$m^2$, and preferably from 2 to 70 mg/$m^2$. When the coverage is less than 1 mg/$m^2$, sufficient printing resistance cannot be obtained. On the other hand, when it exceeds 100 mg/$m^2$, the printing resistance is not satisfactory.

If desired, a back coating is provided on the back surface of the support. As the back coating are suitably used coating layers made of an organic polymer compound as described in JP-A-5-45885 and coating layers made of a metal oxide obtained by hydrolysis and polycondesnation of an organic or inorganic metal compound as described in JP-A-6-35174. Among them, coating layers made of a metal oxide obtained from readily available and cheap alkoxy compounds of silicon (such as $Si(OCH_3)_4$, $Si(OC_2H_5)_4$, $Si(OC_3H_7)_4$, and $Si(OC_4H_9)_4$) are particularly preferred because they are superior in resistance to developing solution.

[Plate-Making and Printing]

The lithographic printing plate precursor of the invention undergoes the image formation by heat. Concretely, there are employed direct imagewise recording by, for example, a thermal recording head, scanning exposure by infrared lasers, high-illuminance flash exposure by, for example, a xenon discharge lamp, and infrared ray lamp exposure, with exposure by semiconductor lasers emitting infrared rays having a wavelength of from 700 to 1,200 nm or by solid high-output infrared lasers such as YAG lasers being suitable.

The exposed lithographic printing plate precursor of the invention is subjected to development treatment and post-treatment by a finisher or a protective gum, to become a printing plate. If desired, the plate can be heated before the development treatment as in the case of the foregoing negative-working lithographic printing plate precursor utilizing the acid catalyst crosslinking reaction.

As the treating agent to be used for the development treatment and post-treatment of the lithographic printing plate precursor of the invention are properly selected and used known treating agents. As the developing solution, a developing solution having a pH in the range of from 9.0 to 14.0, and preferably from 12.0 to 13.5 is suitable. As the developing solution, a conventionally known alkaline aqueous solution can be used. Suitable examples of the alkaline aqueous solution as the developing solution include aqueous solutions containing a silicate alkali as a base and having a pH of 12 or more, which are conventionally known, so-called "silicate developing solutions", and so-called "non-silicate developing solutions" not containing a silicate alkali but containing a non-reducing sugar (an organic compound having a buffer action) and a base.

In the case where the lithographic printing plate of the invention is subjected to burning treatment, there is suitably employed a conventionally known method in which the burnishing is carried out using a burning-finishing liquid and a burning processor.

The resulting lithographic printing plate thus treated is installed in an offset printing machine to produce a number of prints.

EXAMPLES

The invention will be more specifically described below with reference to the following Examples. As a matter of course, it should not be construed that the scope of the invention is limited thereto.

Synthesis Example 1

Synthesis of Long-Chain Alkyl Group-Containing Polymer A)

In a 1,000-mL three-necked flask equipped with a condenser and a stirrer was charged 22.0 g of N,N-dimethylacetamide and heated at 70° C. To the heated N,N-dimethylacetamide were added dropwise 20.0 g of dodecyl n-methacrylate, 1.9 g of compound a as described below, and a solution of 0.215 g of V-65 (manufactured by WAKO PURE CHEMICAL INDUSTRIES, LTD.) in 22.0 g of N,N-dimethylacetamine over 2.5 hours under a nitrogen gas stream, and the mixture was allowed to react at 70° C. for an additional 2 hours. The reaction mixture was cooled to room temperature and then poured into 1,000 mL of methanol. After decantation, the mixture was rinsed with methanol, and the resulting liquid product was dried in vacuo to obtain 18.5 g of long-chain alkyl group-containing polymer A. This product had a weight average molecular weight of 30,000 as reduced into polystyrene as a standard substance by the gel permeation chromatography (GPC).

Compound a

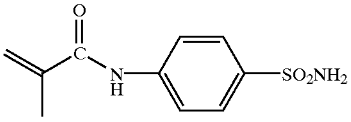

Synthesis Example 2

Synthesis of Long-Chain Alkyl Group-Containing Polymer B)

In a 1,000-mL three-necked flask equipped with a condenser and a stirrer was charged 21.0 g of 1-methoxy-2-propanol and heated at 70° C. To the heated 1-methoxy-2-propanol were added dropwise 20.0 g of dodecyl n-methacrylate, 0.677 g of methacrylic acid, and a solution of 0.215 g of V-65 (manufactured by WAKO PURE CHEMICAL INDUSTRIES, LTD.) in 21.0 g of 1-methoxy-2-propanol over 2.5 hours under a nitrogen gas stream, and the mixture was allowed to react at 70° C. for an additional 2 hours. The reaction mixture was cooled to room temperature and then poured into 1,000 mL of methanol. After decantation, the mixture was rinsed with methanol, and the resulting liquid product was dried in vacuo to obtain 18.2 g of long-chain alkyl group-containing polymer B. This product had a weight average molecular weight of 50,000 as reduced into polystyrene as a standard substance by the gel permeation chromatography (GPC).

Synthesis Examples 3 to 9

Syntheses of Long-Chain Alkyl Group-Containing Polymers C to I

Using the long-chain alkyl group-containing monomer and the hydrophilic monomer as shown in Table 1, long-chain alkyl group-containing polymers C to I of the invention were synthesized in the same manner as in Synthesis Example 1 or Synthesis Example 2.

TABLE 1

Long-chain alkyl group-containing polymers C to I

| Long-chain alkyl group-containing polymer | Long-chain alkyl group-containing compound (mole ratio) | Monomer (mole ratio) | Weight average molecular weight |
|---|---|---|---|
| C | 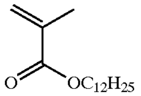 (10) | 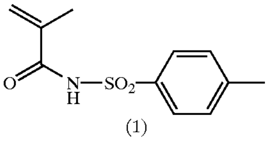 (1) | 47000 |
| D | 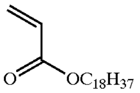 (20) | 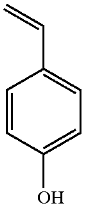 (1) | 35000 |
| E | 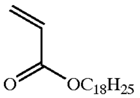 (10) | 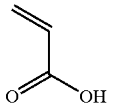 (1) | 40000 |
| F | 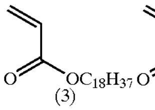 (3) | 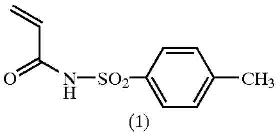 (1) | 42000 |
| G | 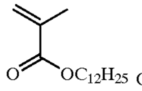 (5) | 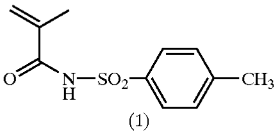 (1) | 38000 |

TABLE 1-continued

| Long-chain alkyl group-containing polymers C to I | | | |
|---|---|---|---|
| Long-chain alkyl group-containing polymer | Long-chain alkyl group-containing compound (mole ratio) | Monomer (mole ratio) | Weight average molecular weight |
| H | 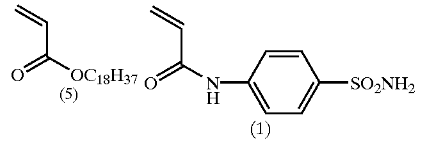 (5) | (1) | 37000 |
| I | 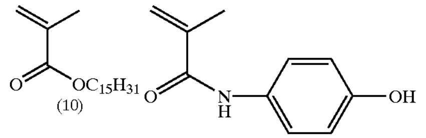 (10) | (1) | 39000 |

(Preparation of Substrate A)

A 0.24 mm-thick aluminum sheet (an aluminum alloy containing 0.06% by weight of Si, 0.30% by weight of Fe, 0.014% by weight of Cu, 0.001% by weight of Mn, 0.001% by weight of Mg, 0.001% by weight of Zn, and 0.03% by weight of T, with the remainder being Al and inevitable impurities) was continuously subjected to the following surface treatments.

The surface of the aluminum sheet was subjected to mechanical roughening by a rotating roller-shaped nylon brush while supplying a suspension comprising a polishing agent (silica sand) and water and having a specific gravity of 1.12 as a polishing slurry liquid. Thereafter, the aluminum sheet was subjected to etching treatment in a sodium hydroxide concentration of 2.6% by weight and in an aluminum ion concentration of 6.5% by weight at a temperature of 70° C. and dissolved in an amount of 6 g/m$^2$, followed by rinsing with water by spraying. Further, the resulting aluminum sheet was subjected to desmutting treatment with an aqueous solution having a nitric acid concentration of 1% by weight at a temperature of 30° C. (containing 0.5% by weight of an aluminum ion) by spraying and then rinsed with water by spraying. Thereafter, the aluminum sheet was continuously subjected to electrochemical roughening treatment using an alternating current voltage of 60 Hz. At this time, the electrolyte was an aqueous solution of 10 g/L of nitric acid (containing 5 g/L of an aluminum ion and 0.007% by weight of an ammonium ion) at a temperature of 80° C. After rinsing with water, the aluminum sheet was subjected to etching treatment in a sodium hydroxide concentration of 26% by weight and in an aluminum ion concentration of 6.5% by weight at a temperature of 32° C. and dissolved in an amount of 0.20 g/m$^2$, followed by rinsing with water by spraying. Thereafter, the resulting aluminum sheet was subjected to desmutting treatment with an aqueous solution having a sulfuric acid concentration of 25% by weight at a temperature of 60° C. (containing 0.5% by weight of an aluminum ion) by spraying and then rinsed with water by spraying.

Next, the resulting aluminum sheet was subjected to anodic oxidation treatment using an anodic oxidation device of two-stage feeding electrolysis. As the electrolyte to be fed to the electrolysis part, sulfuric acid was used. Thereafter, the aluminum sheet was rinsed with water by spraying. A final oxidized film amount was 2.7 g/m$^2$.

The aluminum support obtained by the anodic oxidation treatment was subjected to treatment with an alkali metal silicate (silicate treatment) by immersing it into a treatment tank containing an aqueous solution of 1% by weight of No. 3 sodium silicate at a temperature of 30° C. Thereafter, the aluminum sheet was rinsed with water by spraying.

On the alkali metal silicate-treated aluminum support thus obtained was applied a subbing solution having the following composition and dried at 80° C. for 15 seconds to form a coating film. The coverage after drying was 15 mg/m$^2$.

| (Subbing solution) | |
|---|---|
| Compound as described below: | 0.3 g |
| Methanol: | 100 g |
| Water: | 1 g |

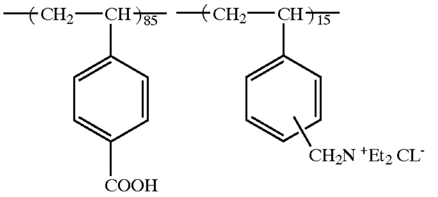

Molecular weight: 28,000

(Preparation of Substrate B)

A 0.24 mm-thick aluminum sheet having the same quality as used in the preparation of the substrate A was continuously subjected to the following surface treatments.

The aluminum sheet was continuously subjected to electrochemical roughening treatment using an alternating current voltage of 60 Hz. At this time, the electrolyte was an aqueous solution of 10 g/L of nitric acid (containing 5 g/L of an aluminum ion and 0.007% by weight of an ammonium ion) at a temperature of 80° C. After rinsing with water, the aluminum sheet was subjected to etching treatment in a sodium hydroxide concentration of 26% by weight and in an aluminum ion concentration of 6.5% by weight at a temperature of 32° C. and dissolved in an amount of 0.20 g/m$^2$, followed by rinsing with water by spraying. Thereafter, the resulting aluminum sheet was subjected to desmutting treatment with an aqueous solution having a sulfuric acid concentration of 25% by weight at a temperature of 60° C. (containing 0.5% by weight of an aluminum ion) by spraying and then rinsed with water by spraying.

Next, the resulting aluminum sheet was subjected to anodic oxidation treatment (oxidized film amount: 2.7 g/m$^2$), silicate treatment, and then applied with the subbing solution (coverage after drying: 15 mg/m$^2$) in the same manners as in the preparation of the substrate A. There was thus prepared a substrate B.

(Preparation of Substrate C)

A melt of JIS A 1050 alloy containing 99.5% by weight or more of aluminum, 0.30% by weight of Fe, 0.10% by weight of Si, 0.02% by weight of Ti, and 0.013% by weight of Cu was subjected to cleaning treatment and cast. For the cleaning treatment, in order to remove unnecessary gases in the melt, such as hydrogen, degassing treatment was carried out, and treatment by a ceramic tube filter was then carried out. As the casting method was employed a DC casting method. The solidified ingot having a thickness of 500 mm was subjected to facing in a depth of 10 mm from the surface and then to homogenizing treatment at 550° C. for 10 hours such that the intermetallic compound did not become coarse.

Next, the resulting ingot was hot rolled at 400° C., subjected to intermediate annealing in a continuous annealing furnace at 500° C. for 60 seconds, and then cold rolled to prepare an aluminum rolled sheet having a thickness of 0.30 mm. By controlling the roughness of rolling rollers, the centerline mean surface roughness Ra after the cold rolling was controlled to 0.2 μm. Thereafter, in order to enhance the flatness, the aluminum sheet was passed through a tension leveler.

The resulting aluminum sheet was subjected to the following surface treatments.

First, in order to remove the rolled oil on the surface of the aluminum sheet, the aluminum sheet was subjected to degreasing treatment with a 10 weight % sodium aluminate aqueous solution at 50° C. for 30 seconds and neutralized with a 30 weight % sulfuric acid aqueous solution at 50° C. for 30 seconds to achieve desmutting treatment. Next, in order to make the adhesiveness of the support to the recording layer good and impart water retention to the non-image area, a so-called graining treatment was carried out to roughen the surface of the support. While keeping an aqueous solution containing 1% by weight of nitric acid and 0.5% by weight of aluminum nitrate at 45° C., the aluminum web was transported into the aqueous solution and subjected to electrolytic graining by supplying an electric amount of 240 C/dm$^2$ at the anode side with an alternating waveform at a current density of 20 A/dm$^2$ in a duty ratio of 1:1 from an indirect feeding cell. Thereafter, the aluminum web was subjected to etching treatment with a 10 weight % sodium aluminate aqueous solution at 50° C. for 30 seconds and then neutralized with a 30 weight % sulfuric acid aqueous solution at 50° C. for 30 seconds to achieve desmutting treatment.

In addition, in order to enhance the abrasion resistance, chemical resistance and water retention, an oxidized film was formed on the support by anodic oxidation. Using an aqueous solution of 20% by weight of sulfuric acid as an electrolyte at 35° C., the aluminum web was transported into the electrolyte and subjected to electrolytic treatment by a direct current of 14 A/dm$^2$ from an indirect feeding cell, to prepare an anodically oxidized film of 2.5 g/m$^2$. Thereafter, in order to ensure hydrophilicity as a non-image portion of the printing plate, the resulting aluminum web was subjected to silicate treatment. The treatment was carried out by conveying the aluminum into an aqueous solution of 1.5% by weight of No. 3 sodium silicate kept at 70° C. for a contact time of 15 seconds, and then rinsed with water. An amount of Si as attached was 10 mg/M$^2$. The thus completed substrate C had an Ra (centerline surface roughness) of 0.25 μm.

Example 1

On the obtained substrate B was applied the following coating solution 1 for recording layer at a coverage of 1.0 g/m$^2$ and dried at 140° C. for 50 seconds by PERFECT OVEN PH200 (manufactured by TABAI) while setting Wind Control at 7, to form a recording layer. There was thus obtained a lithographic printing plate precursor 1.

| (Coating solution 1 for recording layer) | |
|---|---|
| Long-chain alkyl group-containing polymer A: | 0.02 g |
| m,p-Cresol novolak (m/p molar ratio: 6/4, weight average molecular weight: 3,500, content of unreacted cresol: 0.5% by weight): | 0.474 g |
| Specified copolymer 1 (set forth beow): | 2.37 g |
| Infrared ray absorber (IR-1): | 0.155 g |
| 2-Methoxy-4-(N-phenylamino)benzenediazonium hexafluorophosphate: | 0.03 g |
| Tetrahydrophthalic anhydride: | 0.19 g |
| Ethyl Violet in which the counter ion is substituted with a 6-hydroxy-β-naphthalene-sulfonic acid ion: | 0.05 g |
| Fluorine-based surfactant (MEGAFACE F176PF (solids content: 20% by weight), manufactured by DAINIPPON INK AND CHEMICALS INCORPORATED): | 0.035 g |
| p-Toluenesulfonic acid: | 0.008 g |
| Bis-p-hydroxyphenyl sulfone: | 0.063 g |
| γ-Butyrolactone: | 13 g |
| Methyl ethyl ketone: | 24 g |
| 1-Methoxy-2-propanol: | 11 g |

Specified copolymer 1: N-(p-aminosulfonylphenyl) methacrylamide/ethyl methacrylate/acrylonitrile (mole %: 32/43/25), weight average molecular weight: 53,000, which can be synthesized by the method as described in JP-A-11-288093.

Example 2

On the obtained substrate B was applied the following coating solution 2 for recording layer at a coverage of 1.8 g/m$^2$ and dried under the same conditions as in Example 1, to form a recording layer. There was thus obtained a lithographic printing plate precursor 2.

| (Coating solution 2 for recording layer) | |
|---|---|
| Long-chain alkyl group-containing polymer A: | 0.09 g |
| Novolak resin (resin (B)) (m/p-cresol molar ratio: 6/4, weight average molecular weight: 7,000, content of unreacted cresol: 0.5% by weight): | 0.90 g |
| Ethyl methacrylate/isobutyl methacrylate/ methacrylic acid copolymer (mole %: 35/35/30): | 0.10 g |
| Infrared ray absorber (IR-1): | 0.1 g |
| Phthalic anhydride: | 0.05 g |
| p-Toluenesulfonic acid | 0.002 g |
| Ethyl Violet in which the counter ion is substituted with a 6-hydroxy-β-naphthalene-sulfonic acid ion: | 0.02 g |
| Fluorine-based polymer (DEFENSA F-176 (solids content: 20% by weight), manufactured by DAINIPPON INK AND CHEMICALS INCORPORATED): | 0.015 g |
| Fluorine-based polymer (DEFENSA MCF-312 (solids content: 30% by weight), manufactured by DAINIPPON INK AND CHEMICALS INCORPORATED): | 0.035 g |
| Methyl ethyl ketone: | 12 g |

Examples 3 to 9

Lithographic printing plate precursors 3 to 9 were obtained in the same manner as in Example 1, except that in the coating solution 1 for recording layer of Example 1, the long-chain alkyl group-containing polymer A was replaced by each of the long-chain alkyl group-containing polymers as shown in Table 2.

TABLE 2

| Long-chain alkyl group-containing polymers as used in Examples 3 to 9 | Example No. | | | | | | |
|---|---|---|---|---|---|---|---|
| | 3 | 4 | 5 | 6 | 7 | 8 | 9 |
| Long-chain alkyl group-containing polymer No. | C | D | E | F | G | H | I |
| Lithographic printing plate precursor No. | 3 | 4 | 5 | 6 | 7 | 8 | 9 |

Comparative Example 1

A lithographic printing plate precursor 10 was obtained in the same manner as in Example 1, except that in the coating solution 1 for recording layer of Example 1, the long-chain alkyl group-containing polymer A was not added.

Comparative Example 2

A lithographic printing plate precursor 11 was obtained in the same manner as in Example 1, except that in the coating solution 1 for recording layer of Example 1, the long-chain alkyl group-containing polymer A was replaced by 0.02 g of n-dodecyl stearate.

Comparative Example 3

A lithographic printing plate precursor 12 was obtained in the same manner as in Example 2, except that in the coating solution 2 for recording layer of Example 2, the long-chain alkyl group-containing polymer A was not added.

Example 10

On the substrate A was applied the following coating solution 3 for recording layer at a coverage of 2.0 g/$m^2$ and dried at 130° C. for 50 seconds by PERFECT OVEN PH200 (manufactured by TABAI) while setting Wind Control at 7. Thereafter, the following coating solution 4 for recording layer was applied at a coverage of 0.40 g/$m^2$ and dried at 140° C. for one minute. There was thus obtained a lithographic printing plate precursor 13.

| (Coating solution 3 for recording layer) | |
|---|---|
| N-(4-Aminosulfonylphenyl) methacrylamide/acrylonitrile/methyl methacrylate copolymer (mole %: 36/34/30, weight average molecular weight: 50,000, acid value: 2.65): | 2.133 g |
| Infrared ray absorber (IR-1): | 0.134 g |
| 4,4'-Bishydroxyphenyl sulfone: | 0.126 g |
| Tetrahydrophthalic anhydride: | 0.190 g |
| p-Toluenesulfonic acid: | 0.008 g |
| 3-Methoxy-4-diazodiphenylamine hexafluorophosphate: | 0.032 g |
| Ethyl Violet in which the counter ion is substituted with a 6-hydroxy-β-naphthalene-sulfonic acid ion: | 0.781 g |
| MEGAFACE F176 (a coating surface-improving fluorine-based surfactant (solids content: 20% by weight), manufactured by DAINIPPON INK AND CHEMICALS INCORPORATED): | 0.035 g |
| Methyl ethyl ketone: | 25.41 g |
| 1-Methoxy-2-propanol: | 12.97 g |
| γ-Butyrolactone: | 13.18 g |

-continued

| (Coating solution 4 for recording layer) | |
|---|---|
| m,p-Cresol novolak (m/p molar ratio: 6/4, weight average molecular weight: 4,500, content of unreacted cresol: 0.8% by weight): | 0.3479 g |
| Infrared ray absorber (IR-1): | 0.0192 g |
| 30 weight % MEK solution of ethyl methacrylate/isobutyl methacrylate/acrylic acid copolymer (mole %: 37/37/26): | 0.1403 g |
| Long-chain alkyl group-containing polymer A: | 0.034 g |
| MAGAFACE F176 (20% by weight) (a fluorine-based surfactant manufactured by DAINIPPON INK AND CHEMICALS INCORPORATED): | 0.022 g |
| MAGAFACE MCF-312 (30% by weight) (a fluorine-based surfactant manufactured by DAINIPPON INK AND CHEMICALS INCORPOPATED): | 0.011 g |
| Methyl ethyl ketone: | 13.07 g |
| 1-Methoxy-2-propanol: | 7.7 g |

Example 11

On the same substrate as used in Example 10 was applied the following coating solution 5 for recording layer under the same conditions as in the coating solution 3 for recording layer of Example 10 and dried. Then, the following coating solution 6 for recording layer was applied under the same conditions as in the coating solution 4 for recording layer of Example 10 and dried. There was thus obtained a lithographic printing plate precursor 14 having a double-layered recording layer.

| (Coating solution 5 for recording layer) | |
|---|---|
| N-(4-Aminosulfonylphenyl) methacrylamide/acrylonitrile/methyl methacrylate copolymer (mole %: 36/34/30, weight average molecular weight: 50,000, acid value: 2.65): | 2.133 g |
| Infrared ray absorber (IR-1): | 0.109 g |
| 4,4'-Bishydroxyphenyl sulfone: | 0.126 g |
| Tetrahydrophthalic anhydride: | 0.190 g |
| p-Toluenesulfonic acid: | 0.008 g |
| 3-Methoxy-4-diazodiphenylamine hexafluorophosphate: | 0.030 g |
| Ethyl Violet in which the counter ion is substituted with a 6-hydroxy-β-naphthalene-sulfonic acid ion: | 0.100 g |
| MEGAFACE F176 (a fluorine-based surfactant (solids content: 20% by weight), manufactured by DAINIPPON INK AND CHEMICALS INCORPORATED): | 0.035 g |
| Methyl ethyl ketone: | 25.38 g |
| 1-Methoxy-2-propanol: | 13.0 g |
| γ-Butyrolactone: | 13.2 g |
| (Coating solution 6 for recording layer) | |
| m,p-Cresol novolak (m/p molar ratio: 6/4, weight average molecular weight: 4,500, content of unreacted cresol: 0.8% by weight): | 0.3478 g |
| Infrared ray absorber (IR-1): | 0.0192 g |
| Long-chain alkyl group-containing polymer A: | 0.034 g |
| Ammonium compound as used in Example 2 of JP-A-2001-398047: | 0.0115 g |
| MAGAFACE F176 (20% by weight) (a fluorine-based surfactant manufactured by DAINIPPON INK AND CHEMICALS INCORPORATED): | 0.022 g |
| Methyl ethyl ketone: | 13.07 g |
| 1-Methoxy-2-propanol: | 6.79 g |

Examples 12 to 19

Lithographic printing plate precursors 15 to 22 were obtained in the same manner as in Example 10, except that in the coating solution 4 for recording layer of Example 10, the long-chain alkyl group-containing polymer A was replaced by each of the long-chain alkyl group-containing polymers as shown in Table 3.

TABLE 3

Long-chain alkyl group-containing polymers as used in Examples 12 to 19

| | Example No. | | | | | | | |
|---|---|---|---|---|---|---|---|---|
| | 12 | 13 | 14 | 15 | 16 | 17 | 18 | 19 |
| Long-chain alkyl group-containing polymer No. | B | C | D | E | F | G | H | I |
| Lithographic printing plate precursor No. | 15 | 16 | 17 | 18 | 19 | 20 | 21 | 22 |

Examples 20 to 27

Lithographic printing plate precursors 23 to 30 were obtained in the same manner as in Example 11, except that in the coating solution 6 for recording layer of Example 11, the long-chain alkyl group-containing polymer A was replaced by each of the long-chain alkyl group-containing polymers as shown in Table 4.

TABLE 4

Long-chain alkyl group-containing polymers as used in Examples 20 to 27

| | Example No. | | | | | | | |
|---|---|---|---|---|---|---|---|---|
| | 20 | 21 | 22 | 23 | 24 | 25 | 26 | 27 |
| Long-chain alkyl group-containing polymer No. | B | C | D | E | F | G | H | I |
| Lithographic printing plate precursor No. | 23 | 24 | 25 | 26 | 27 | 28 | 29 | 30 |

Comparative Example 4

A lithographic printing plate precursor 31 was obtained in the same manner as in Example 10, except that in the coating solution 1 for recording layer of Example 10, the long-chain alkyl group-containing polymer A was not added.

[Evaluation of Lithographic Printing Plate Precursors as Prepared in Examples 1 to 27 and Comparative Examples 1 to 4]

With respect to the lithographic printing plate precursors thus prepared, the dynamic coefficient of friction, scratch resistance, development latitude, and transfer properties were evaluated in the following manners.

<Measurement of Dynamic Coefficient of Friction>

The dynamic coefficient of friction ($\mu k$) of the image recording material of the invention was measured in the following manner. That is, each of the lithographic printing plate precursors 1 to 31 of the Examples and Comparative Examples was placed such that the surface of the recording layer of the lithographic printing plate precursor came into contact with stainless steel. The results are shown in Table 5.

<Evaluation of Reduction Rate of Coefficient of Friction> m,p-Cresol novolak (m/p molar ratio: 6/4, weight average molecular weight: 4,500) was used as the base polymer, and a coating solution as described below was applied on the same support as used in Example 1 at a coverage after drying of 1.6 g/$m^2$ and then dried at 120° C. for 60 seconds by PERFECT OVEN PH200 (manufactured by TABAI) while setting Wind Control at 7, to prepare a sample for the measurement of coefficient of friction of each of the systems having the long-chain alkyl group-containing polymers A to I added thereto. A sample for the measurement of coefficient of friction of the base polymer was prepared in the same formulation, except that the long-chain alkyl group-containing polymer was not added and that the amount of m,p-cresol novolak of the coating solution was changed to 1.200 g.

(Coating Solution for Sample for the Measurement of Coefficient of Friction)

| | |
|---|---|
| m,p-Cresol novolak (m/p molar ratio: 6/4, weight average molecular weight: 4,500, content of unreacted cresol: 0.8% by weight): | 1.080 g |
| Long-chain alkyl group-containing polymer: | 0.120 g |
| Methyl ethyl ketone: | 5.954 g |
| 1-Methoxy-2-propanol: | 3.033 g |

The obtained sample was placed such that the polymer-applied surface came into contact with stainless steel and measured for a dynamic coefficient of friction against the stainless steel according to ASTM D1894. The reduction rate of coefficient of friction was determined by dividing the coefficient of friction of the sample having the long-chain alkyl group-containing polymer thereto by the coefficient of friction of the sample only made of the base polymer. The evaluation results are shown in Table 2-5.

TABLE 2-5

Reduction rate of coefficient of friction of the long-chain alkyl group-containing polymers

| Long-chain alkyl group-containing polymer | Reduction rate of coefficient of friction |
|---|---|
| A | 0.71 |
| B | 0.62 |
| C | 0.61 |
| D | 0.73 |
| E | 0.71 |
| F | 0.79 |
| G | 0.80 |
| H | 0.86 |
| I | 0.85 |
| n-dodecyl stearate | 0.60 |

<Evaluation of Scratch Resistance>

Each of the lithographic printing plate precursors 1 to 31 of the Examples and Comparative Examples was rubbed 15 times under a load of 250 g by an abraser felt, CS5 using a rotary abrasion tester (manufactured by TOYOSEIKI). Thereafter, the resulting lithographic printing plate precursor was developed at a liquid temperature of 30° C. for a development time of 12 seconds using a PS processor, 900H (manufactured by FUJI PHOTO FILM CO., LTD.) charged with a developing solution, DT-1 (diluted in a ratio of 1:8, manufactured by FUJI PHOTO FILM CO., LTD.) and a finisher, FP2W (diluted in a ratio of 1:1, manufactured by FUJI PHOTO FILM CO., LTD.). At this time, the developing solution had a conductivity of 45 mS/cm. The scratch resistance was evaluated on the following criteria by visual observation and measurement by a reflection densitometer (Gretag Macbeth D19C) with respect to the optical density of the rubbed and non-rubbed portions by the abraser felt after the development. The evaluation results are shown in Table 5.

(Evaluation Criteria of Scratch Resistance)

A: The optical density of the recording layer film in the rubbed portion did not change at all.

B: The optical density of the recording layer film in the rubbed portion slightly changed by visual observation.

C: The optical density of the recording layer film in the rubbed portion was reduced to 2/3 or less as compared with that in the non-rubbed portion.

<Evaluation of Development Latitude>

A test pattern was imagewise drawn in each of the the lithographic printing plate precursors 1 to 31 of the Examples and Comparative Examples by Trendsetter 3244VFS (manufactured by CREO) under conditions of an infrared laser beam intensity of 9 W and a drum rotation speed of 150 rpm.

A non-silicate developing solution, DT-1 (manufactured by FUJI PHOTO FILM CO., LTD.) was diluted with tap water to prepare developing solutions having a varied conductivity. The developing solution was charged in a PS processor, 900H (manufactured by FUJI PHOTO FILM CO., LTD.), and the exposed lithographic printing plate precursor was developed at a liquid temperature of 30° C. for a development time of 12 seconds As a finisher solution was used FP-2W (diluted with tap water in a ratio of 1:1, manufactured by FUJI PHOTO FILM CO., LTD.).

Under this development condition, the reduction in the optical density of the non-exposed area (image potion) of the recording layer of the lithographic printing plate precursor was visually evaluated. The conductivity of the developing solution when the reduction of the density was observed is defined as (X) mS/cm. Further, under the same development condition, he reduction in the optical density of the exposed area (non-image potion) of the recording layer of the lithographic printing plate precursor was visually evaluated. The conductivity of the developing solution as used when the reduction of the density was observed is defined as (Y) mS/cm. In the Examples, [(X)-(Y)] was defined as the development latitude. As the value of the development latitude is large, the residual film hardly generates in the exposed area (non-image portion), and the reduction of the density in the non-exposed area (image portion) hardly occurs. Accordingly, it may be said that in such case, the latitude is wide. The evaluation results are shown in Table 5.

<Evaluation of Transfer Properties>

The transfer properties were evaluation in the following manner. That is, a chloroprene rubber (90 mm×90 mm) was placed on each of the lithographic printing plate precursors 1 to 31 of the Examples and Comparative Examples and heated at 100° C. for 10 minutes while applying a load of 6 kg. Then, the surface of the chloroprene rubber with which the lithographic printing plate precursor had come into contact was visually evaluated. The evaluation was made on the following criteria. The evaluation results are shown in Table 5.

A: The color did not change.

B: The color changed.

TABLE 5

Evaluation results of lithographic printing plate precursors of Examples 1 to 27 and Comparative Examples 1 to 4

| | Lithographic printing plate precursor | Dynamic coefficient of friction | Scratch resistance | Development latitude | Transfer properties |
|---|---|---|---|---|---|
| Example 1 | 1 | 0.47 | A | 9 | A |
| Example 2 | 2 | 0.45 | A | 9 | A |
| Example 3 | 3 | 0.49 | A | 9 | A |
| Example 4 | 4 | 0.51 | A | 9 | A |
| Example 5 | 5 | 0.49 | A | 9 | A |
| Example 6 | 6 | 0.50 | A | 9 | A |
| Example 7 | 7 | 0.48 | A | 9 | A |
| Example 8 | 8 | 0.51 | A | 9 | A |
| Example 9 | 9 | 0.50 | A | 9 | A |
| Example 10 | 13 | 0.49 | A | 12 | A |
| Example 11 | 14 | 0.47 | A | 12 | A |
| Example 12 | 15 | 0.48 | A | 11 | A |
| Example 13 | 16 | 0.52 | A | 10 | A |
| Example 14 | 17 | 0.53 | A | 10 | A |
| Example 15 | 18 | 0.55 | A | 12 | A |
| Example 16 | 19 | 0.48 | A | 10 | A |
| Example 17 | 20 | 0.54 | A | 12 | A |
| Example 18 | 21 | 0.52 | A | 10 | A |
| Example 19 | 22 | 0.46 | A | 10 | A |
| Example 20 | 23 | 0.48 | A | 12 | A |
| Example 21 | 24 | 0.49 | A | 13 | A |
| Example 22 | 25 | 0.49 | A | 12 | A |
| Example 23 | 26 | 0.48 | A | 12 | A |
| Example 24 | 27 | 0.53 | A | 13 | A |
| Example 25 | 28 | 0.52 | A | 12 | A |
| Example 26 | 29 | 0.49 | A | 10 | A |
| Example 27 | 30 | 0.53 | A | 12 | A |
| Comparative Example 1 | 10 | 0.62 | C | 6 | A |
| Comparative Example 2 | 11 | 0.41 | A | 6.5 | B |
| Comparative Example 3 | 12 | 0.62 | C | 7 | A |
| Comparative Example 4 | 31 | 0.64 | B | 10 | A |

It can be understood from Table 5 that the lithographic printing plate precursors obtained from the image recording material of the invention exhibit good development latitude, hardly generate a residual film in the non-image portion, and hardly cause a reduction of the density in the image portion, as compared with those of Comparative Examples 1 to 3 not containing the long-chain alkyl group-containing polymer. Further, it can be understood that the lithographic printing plate precursors obtained from the image recording material of the invention are superior in the scratch resistance as compared with those of Comparative Examples 1, 3 and 4. Moreover, it can be understood that the lithographic printing plate precursors obtained from the image recording material of the invention are of no problem in the transfer properties as compared with that of Comparative Example 2.

Examples 28 to 30 and Comparative Examples 5 to 7

On the substrate C was applied the following coating solution 7 for recording layer by using a wire bar and dried at 115° C. for 45 seconds by a hot-air drying device to form a recording layer. There were thus obtained lithographic printing plate precursors. The coverage after drying was within the range of from 1.2 to 1.3 $g/m^2$.

(Coating Solution 7 for Recording Layer)

| | |
|---|---|
| Alkali-soluble polymer (compound name and its addition amount are shown in Table 6) | |
| Infrared ray absorber (IR-5): | 0.10 g |
| Radical generator (S-1 as described below): | 0.45 g |
| Radical polymerizable compound (compound name and its addition amount are shown in Table 6) | |
| Long-chain alkyl group-containing polymer (as shown in Table 6): | 0.023 g |
| Naphthalenesulfonate of Victoria Pure Blue: | 0.04 g |
| Fluorine-based surfactant (MEGAFACE F176 (solids content: 20% by weight), manufactured by DAINIPPON INK AND CHEMICALS INCORPORATED): | 0.01 g |
| p-Methoxyphenol: | 0.001 g |
| Methyl ethyl ketone: | 9.0 g |
| Methanol: | 10.0 g |
| 1-Methoxy-2-propanol: | 8.0 g |

TABLE 6

Formulations and evaluation results of Examples 28 to 30 and Comparative Examples 5 to 7

| | Long-chain alkyl group-containing polymer | Alkali-soluble polymer (content) | Radical polymerizable compound (content) | Printing resistance (× 10,000) | Load at which scarred residual film generated (g) |
|---|---|---|---|---|---|
| Example 28 | A | P-1 (1.0 g) | DPHA (1.0 g) | 5.1 | 100 |
| Example 29 | A | P-1 (1.0 g) | U-2 (1.0 g) | 5.2 | 120 |
| Example 30 | A | P-2 (1.2 g) | U-2 (1.0 g) | 5.2 | 110 |
| Comparative Example 5 | Nil | P-1 (1.0 g) | DPHA (1.0 g) | 5.0 | 10 |
| Comparative Example 6 | Nil | P-1 (1.0 g) | U-2 (1.0 g) | 5.1 | 15 |
| Comparative Example 7 | Nil | P-2 (1.2 g) | U-2 (1.0 g) | 5.0 | 15 |

The structures of the alkali-soluble polymers as used in the foregoing Examples and Comparative Examples are shown below.

P-1

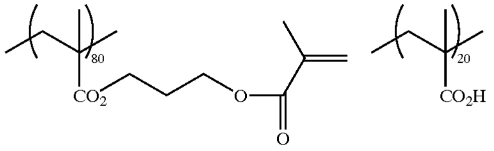

Mw 95,000

P-2

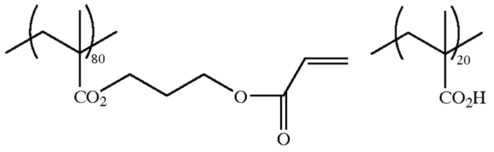

Mw 99,000

-continued

P-3

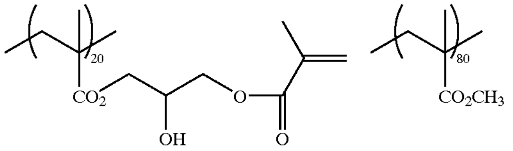

Mw 95,000

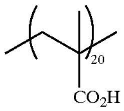

P-4

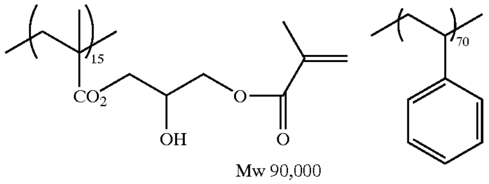

Mw 90,000

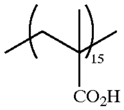

Similarly, the structures of the radical generators as used in the foregoing Examples and Comparative Examples are shown below.

(S-1)

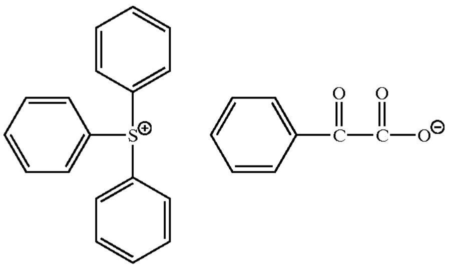

(S-2)

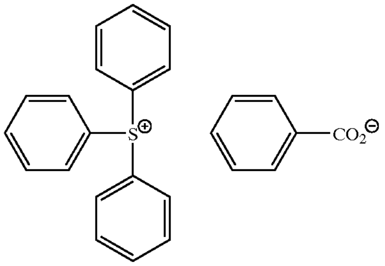

Similarly, the structures of the radical polymerizable compounds as used in the foregoing Examples and Comparative Examples are shown below.

(DPHA)

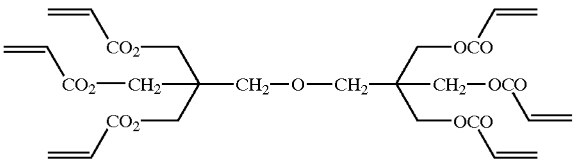

-continued (U-2)

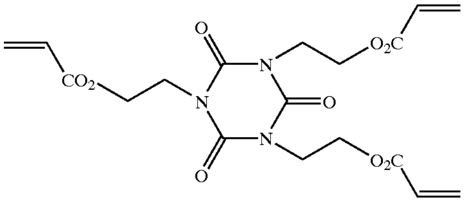

Each of the thus obtained lithographic printing plate precursors was exposed under conditions of an output of 6.5 W, an outer drum rotation speed of 81 rpm, a printing plate energy of 188 $mJ/cm^2$, and a degree of resolution of 2,400 dpi by Trendsetter 3244VFS (manufactured by CREO) mounted with a water-cooling type 40-W infrared semiconductor laser.

The exposed lithographic printing plate precursor was developed by using an automatic processor, STABLON 900NP (manufactured by FUJI PHOTO FILM CO., LTD.). The following (D-1) was used as the developing solution to be charged, and the following (D-2) was used as the development replenisher. The development was carried out at a developing bath temperature of 30° C. for a development time of 12 seconds. The replenisher was automatically added so as to adjust the conductivity of the developing solution in the development bath of the automatic processor at a constant level. Further, a solution of FN-6 (manufactured by FUJI PHOTO FILM CO., LTD.) diluted with water (1:1) was used as the finisher.

| | |
|---|---|
| (Developing solution (D-1)) | |
| Potassium hydroxide: | 3 g |
| Potassium hydrogencarbonate: | 1 g |
| Potassium carbonate: | 2 g |
| Sodium sulfite: | 1 g |
| Polyethylene glycol mononaphthyl ether: | 150 g |
| Sodium dibutylnaphthalenesulfonate: | 50 g |
| Tetrasodium ethylenediaminetetraacetate: | 8 g |
| Water: | 785 g |
| (Developing replenisher (D-2)) | |
| Potassium hydroxide: | 6 g |
| Potassium carbonate: | 2 g |
| Sodium sulfite: | 1 g |
| Polyethylene glycol mononaphthyl ether: | 150 g |
| Sodium dibutylnaphthalenesulfonate: | 50 g |
| Potassium hydroxyethanediphosphonate: | 4 g |
| Silicon TSA-731 (manufactured by TOSHIBA SILICONE): | 0.1 g |
| Water: | 786.9 g |

<Evaluation of Printing Resistance>

Next, printing was carried out by using a printing machine, LITHRONE (manufactured by KOMORI CORPORATION). The printing resistance was evaluated by visually measuring to how volume the printing could be carried out while keeping the sufficient ink concentration. The results are shown in Table 6.

<Evaluation of Scratch Resistance>

The lithographic printing plate precursor having the recording layer applied thereonto was evaluated for the scratch resistance. Using Scratching TESTER HEIDON-14 (manufactured by HEIDON) as an instrument and a 0.4-mm R diamond stylus as a scratching stylus, the surface of the recording layer was scratched at a rate of 400 mm/min. while changing a load on the stylus. The scratched precursor was subjected to the foregoing development treatment, and the load when the residual film was visually observed was evaluated. As the load was large, the scratched residual film hardly generated, i.e., the scratch resistance was superior. The results are shown in Table 6.

It can be understood from Table 6 that the lithographic printing plate precursors of Examples 28 to 30 using the image recording material of the invention as the recording layer are superior in the scratch resistance to those of Comparative Examples 5 to 7 not containing the long-chain alkyl group-containing polymer and are good in the printing resistance. Further, in any of the samples, no abrasion was observed during the exposure.

Examples 31 to 38

Lithographic printing plate precursors were prepared in the same manner as in Example 29, except that the long-chain alkyl group-containing polymer A as used in Example 29 was replaced by each of long-chain alkyl group-containing polymers B to I as shown in Table 7. These precursors were evaluated in the same manners as in Example 29. The results are shown in Table 7.

TABLE 7

Examples 31 to 38

| | Long-chain alkyl group-containing polymer | Alkali-soluble polymer (content) | Radical polymerizable compound (content) | Printing resistance (× 10,000) | Load at which scarred residual film generated (g) |
|---|---|---|---|---|---|
| Example 31 | B | P-1 (1.0 g) | U-2 (1.0 g) | 5.2 | 100 |
| Example 32 | C | P-1 (1.0 g) | U-2 (1.0 g) | 5.3 | 120 |
| Example 33 | D | P-1 (1.0 g) | U-2 (1.0 g) | 5.1 | 120 |
| Example 34 | E | P-1 (1.0 g) | U-2 (1.0 g) | 5.2 | 120 |
| Example 35 | F | P-1 (1.0 g) | U-2 (1.0 g) | 5.2 | 110 |
| Example 36 | G | P-1 (1.0 g) | U-2 (1.0 g) | 5.3 | 100 |
| Example 37 | H | P-1 (1.0 g) | U-2 (1.0 g) | 5.2 | 110 |
| Example 38 | I | P-1 (1.0 g) | U-2 (1.0 g) | 5.2 | 120 |

Examples 39 to 40 and Comparative Examples 8 to 9

On the aluminum substrate C was applied the following coating solution for subbing layer and dried in an atmosphere at 80° C. for 30 seconds. The coverage after drying was 10 $mg/M^2$.

| (Coating solution for subbing layer) | |
|---|---|
| 2-Aminoethylphosphonic acid: | 0.5 g |
| Methanol: | 40 g |
| Pure water: | 60 g |

Thereafter, the following coating solution 8 for recording layer was applied on the foregoing support having the subbing layer formed thereon by using a wire bar and dried at 115° C. for 45 seconds by a hot-air drying device. There were thus obtained lithographic printing plate precursors. The coverage after drying was within the range of from 1.2 to 1.3 g/$m^2$.

| (Coating solution 8 for recording layer) | |
|---|---|
| Alkali-soluble polymer (compound name and its addition amount are shown in Table 8) | |
| Infrared ray absorber (IR-8): | 0.08 g |
| Radical generator (S-2 as described above): | 0.30 g |
| Radical polymerizable compound (compound name and its addition amount are shown in Table 8) | |
| Long-chain alkyl group-containing polymer (as shown in Table 8): | 0.023 g |
| Naphthalenesulfonate of Victoria Pure Blue: | 0.04 g |
| Fluorine-based surfactant (MEGAFACE F176 (solids content: 20% by weight), manufactured by DAINIPPON INK AND CHEMICALS INCORPORATED): | 0.01 g |
| N-Nitroso-N-phenylhydroxylamine aluminum: | 0.001 g |
| Methyl ethyl ketone: | 9.0 g |
| Methanol: | 10.0 g |
| 1-Methoxy-2-propanol: | 8.0 g |

TABLE 8

Examples 38 to 39 and Comparative Examples 8 to 9

| | | | | Printing resistance and staining properties in non-image portion | | |
|---|---|---|---|---|---|---|
| | Long-chain alkyl group-containing polymer | Alkali-soluble polymer (content) | Radical polymerizable compound (content) | No forced lapsing | Lapsing at 60° C. for 3 days | Lapsing at 45° C. and at a humidity of 75% |
| Example 39 | A | P-3 (1.0 g) | DPHA (1.0 g) | 70,000 No stain | 70,000 No stain | 70,000 No stain |
| Example 40 | A | P-4 (1.0 g) | U-2 (1.0 g) | 71,000 No stain | 71,000 No stain | 71,000 No stain |
| Comparative Example 8 | Nil | P-3 (1.0 g) | U-2 (1.0 g) | 70,000 No stain | 70,000 Stained | 70,000 Stained |
| Comparative Example 9 | Nil | P-4 (1.0 g) | DPHA (1.0 g) | 70,000 No stain | 70,000 Stained | 70,000 Stained |

The obtained lithographic printing plate precursors were subjected to forced lapsing (preservation under forced conditions), and then compared and evaluated with those as not subjected to forced lapsing. The forced lapsing conditions were the preservation at 60° C. for 3 days and the preservation at 45° C. and at a relative humidity of 75% for 3 days.

The exposure was carried out under the same conditions as in Examples 28 to 30 and Comparative Examples 5 to 7. Further, the development was carried out by using an automatic processor, STABLON 900NP (manufactured by FUJI PHOTO FILM CO., LTD.). The developing solution was a solution of DP-4 (manufactured by FUJI PHOTO FILM CO., LTD.) diluted with water (1:8) for both the solution to be charged and the replenisher. The development was carried out at a developing bath temperature of 30° C. for a development time of 12 seconds. The replenisher was automatically added so as to adjust the conductivity of the developing solution in the development bath of the automatic processor at a constant level. Further, a solution of FN-6 (manufactured by FUJI PHOTO FILM CO., LTD.) diluted with water (1:1) was used as the finisher.

The obtained lithographic printing plate precursors were printed and evaluated for the printing resistance and staining properties in the same manners as in Examples 28 to 30 and Comparative Examples 5 to 7. The results are shown in Table 8.

It can be understood from Table 8 that the lithographic printing plate precursors of Examples 39 to 40 using the image recording material of the invention as the recording layer are not reduced in the printing resistance and staining properties in the non-image portion and exhibit superior lapsing stability even after the preservation in a high-temperature and high-humidity environment, as compared with those of Comparative Examples 8 to 9.

Examples 41 to 48

Lithographic printing plate precursors were prepared in the same manner as in Example 40, except that the long-chain alkyl group-containing polymer A as used in Example 40 was replaced by each of long-chain alkyl group-containing polymers B to I as shown in Table 9. These precursors were evaluated in the same manners as in Example 40. The results are shown in Table 9.

TABLE 9

Examples 41 to 48

| | Long-chain alkyl group-containing polymer | Alkali-soluble polymer (content) | Radical polymerizable compound (content) | Printing resistance and staining properties in non-image portion: No forced lapsing | Lapsing at 60° C. for 3 days | Lapsing at 45° C. and at a humidity of 75% |
|---|---|---|---|---|---|---|
| Example 41 | B | P-4 (1.0 g) | U-2 (1.0 g) | 71,000 No stain | 71,000 No stain | 70,000 No stain |
| Example 42 | C | P-4 (1.0 g) | U-2 (1.0 g) | 72,000 No stain | 72,000 No stain | 72,000 No stain |
| Example 43 | D | P-4 (1.0 g) | U-2 (1.0 g) | 71,000 No stain | 71,000 No stain | 71,000 No stain |
| Example 44 | E | P-4 (1.0 g) | U-2 (1.0 g) | 71,000 No stain | 71,000 No stain | 71,000 No stain |
| Example 45 | F | P-4 (1.0 g) | U-2 (1.0 g) | 71,000 No stain | 71,000 No stain | 71,000 No stain |
| Example 46 | G | P-4 (1.0 g) | U-2 (1.0 g) | 72,000 No stain | 72,000 No stain | 72,000 No stain |
| Example 47 | H | P-4 (1.0 g) | U-2 (1.0 g) | 71,000 No stain | 71,000 No stain | 71,000 No stain |
| Example 48 | I | P-4 (1.0 g) | U-2 (1.0 g) | 72,000 No stain | 72,000 No stain | 72,000 No stain |

Examples 49 to 50 and Comparative-Examples 10 to 11

On the aluminum substrate C was applied the following coating solution 9 for recording layer by using a wire bar and dried at 115° C. for 45 seconds by a hot-air drying device. There were thus obtained lithographic printing plate precursors. The coverage after drying was within the range of from 1.2 to 1.3 g/m$^2$.

| (Coating solution 9 for recording layer) | |
|---|---|
| Alkali-soluble polymer (compound name and its addition amount are shown in Table 10) | |
| Infrared ray absorber (IR-9): | 0.10 g |
| Radical generator (S-1 as described above): | 0.50 g |
| Long-chain alkyl group-containing polymer (as shown in Table 10): | 0.023 g |
| Naphthalenesulfonate of Victoria Pure Blue: | 0.04 g |
| Fluorine-based surfactant (MEGAFACE F176 (solids content: 20% by weight), manufactured by DAINIPPON INK AND CHEMICALS INCORPORATED): | 0.01 g |
| Methyl ethyl ketone: | 9.0 g |
| Methanol: | 10.0 g |
| 1-Methoxy-2-propanol: | 8.0 g |

TABLE 10

Examples 49 to 50 and Comparative Examples 10 to 11

| | Long-chain alkyl group-containing polymer | Alkali-soluble polymer (content) | Printing resistance | Load at which scarred residual film generated |
|---|---|---|---|---|
| Example 49 | A | P-1 (1.0 g) | 80,000 | 100 g |
| Example 50 | A | P-2 (1.2 g) | 83,000 | 100 g |
| Comparative Example 10 | Nil | P-1 (1.0 g) | 81,000 | 20 g |
| Comparative Example 11 | Nil | P-2 (1.2 g) | 82,000 | 20 g |

Each of the thus obtained lithographic printing plate precursors was exposed under conditions of an output of 9 W, an outer drum rotation speed of 210 rpm, a printing plate energy of 100 mJ/cm$^2$, and a degree of resolution of 2,400 dpi by Trendsetter 3244VFS (manufactured by CREO) mounted with a water-cooling type 40-W infrared semiconductor laser.

The exposed lithographic printing plate precursor was developed by using an automatic processor, STABLON 900NP (manufactured by FUJI PHOTO FILM CO., LTD.). The developing solution was a solution of DN-3C (manufactured by FUJI PHOTO FILM CO., LTD.) diluted with water (1:1) for both the solution to be charged and the replenisher. The development was carried out at a developing bath temperature of 30° C. Further, a solution of FN-6 (manufactured by FUJI PHOTO FILM CO., LTD.) diluted with water (1:1) was used as the finisher.

Next, printing was carried out by using a printing machine, SOR-KR (manufactured by HEIDERBERG). The printing resistance was evaluated by measuring to how volume the printing could be carried out while keeping the sufficient ink concentration. Further, the scratch resistance was evaluated in the same manner as in Examples 28 to 30 and Comparative Examples 5 to 7.

It can be understood from Table 10 that the lithographic printing plate precursors of Examples 49 to 50 using the image recording material of the invention as the recording layer achieve superior scratch resistance and keep superior printing resistance, as compared with those of Comparative Examples 10 to 11 not containing the long-chain alkyl group-containing polymer.

Examples 51 to 58

Lithographic printing plate precursors were prepared in the same manner as in Example 49, except that the long-chain alkyl group-containing polymer A as used in Example 49 was replaced by each of long-chain alkyl group-containing polymers B to I as shown in Table 11. These precursors were evaluated in the same manners as in Example 49. The results are shown in Table 11.

TABLE 11

Examples 51 to 58

| | Long-chain alkyl group-containing polymer | Alkali-soluble polymer (content) | Printing resistance | Load at which scarred residual film generated |
|---|---|---|---|---|
| Example 51 | B | P-1 (1.0 g) | 81,000 | 100 g |
| Example 52 | C | P-1 (1.0 g) | 82,000 | 110 g |
| Example 53 | D | P-1 (1.0 g) | 81,000 | 100 g |
| Example 54 | E | P-1 (1.0 g) | 82,000 | 90 g |
| Example 55 | F | P-1 (1.0 g) | 83,000 | 100 g |
| Example 56 | G | P-1 (1.0 g) | 83,000 | 100 g |
| Example 57 | H | P-1 (1.0 g) | 82,000 | 110 g |
| Example 58 | I | P-1 (1.0 g) | 81,000 | 110 g |

(Evaluation of Conveying Properties of Lithographic Printing Plate Precursor)

Thirty lithographic printing plate precursors of Example 28 were laminated and installed in a plate feeder. Then, the laminated precursors were automatically continuously exposed and developed, and then discharged into a stocker. During the operation of the device, neither adhesion of the lithographic printing plate precursors to each other nor poor conveyance caused by the adhesion was observed. Accordingly, it was understood that the lithographic printing plate precursors had good slipperiness, and the transfer of the slipping agent into the back surface of the support was inhibited. Further, the same results were obtained in the evaluation of conveying properties with respect to the lithographic printing plate precursors of Examples 29 to 34.

As is evident from the foregoing Examples, the lithographic printing plate precursors using the image recording material of the invention as the recording layer (lithographic printing plate precursors of the invention) were superior in the scratch resistance, printing resistance and slipperiness and exhibited a superior effect to inhibit the transfer of the scratch resistance-improving material (material to lower the dynamic coefficient of friction).

Synthesis Example 3-1:

Synthesis of Long-Chain Alkyl Group-Containing Polymer 3-A

In a 1,000-mL three-necked flask equipped with a condenser and a stirrer was charged 59 g of 1-methoxy-2-propanol and heated at 80° C. To the heated 1-methoxy-2-propanol was added dropwise a solution consisting of 42.0 g of stearyl n-methacrylate, 16.0 g of methacrylic acid, 0.714 g of a polymerization initiator, V-601 (manufactured by WAKO PURE CHEMICAL INDUSTRIES, LTD.), and 59 g of 1-methoxy-2-propanol over 2.5 hours under a nitrogen gas stream, and the mixture was allowed to react at 80° C. for an additional 2 hours. The reaction mixture was cooled to room temperature and then poured into 1,000 mL of water. After decantation, the mixture was rinsed with methanol, and the resulting liquid product was dried in vacuo to obtain 73.5 g of a long-chain alkyl group-containing polymer 3-A as described below. This product had a weight average molecular weight of 66,000 as reduced into polystyrene as a standard substance by the gel permeation chromatography (GPC).

Synthesis Example 3-2:

Synthesis of Long-Chain Alkyl Group-Containing Polymer 3-B

In a 1,000-mL three-necked flask equipped with a condenser and a stirrer was charged 56.0 g of 1-methoxy-2-propanol and heated at 80° C. To the heated 1-methoxy-2-propanol was added dropwise a solution consisting of 50.9 g of dodecyl n-methacrylate, 4.3 g of methacrylic acid, 0.576 g of a polymerization initiator, V-601 (manufactured by WAKO PURE CHEMICAL INDUSTRIES, LTD.), and 56.0 g of 1-methoxy-2-propanol over 2.5 hours under a nitrogen gas stream, and the mixture was allowed to react at 80° C. for an additional 2 hours. The reaction mixture was cooled to room temperature and then poured into 1,000 mL of water. After decantation, the mixture was rinsed with methanol, and the resulting liquid product was dried in vacuo to obtain 58.2 g of a long-chain alkyl group-containing polymer 3-B as described below. This product had a weight average molecular weight of 60,000 as reduced into polystyrene as a standard substance by the gel permeation chromatography (GPC).

Long-Chain Alkyl Group-Containing Polymer 3-A

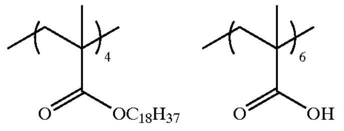

Weight average molecular weight: 66,000

Long-Chain Alkyl Group-Containing Polymer 3-B

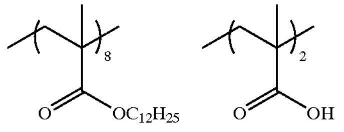

Weight average molecular weight: 60,000

Synthesis Examples 3—3 to 3-9

Syntheses of Long-Chain Alkyl Group-Containing Polymers 3-C to 3-I

Using the long-chain alkyl group-containing monomer and the hydrophilic monomer as shown in Table 3-1, long-chain alkyl group-containing polymers 3-C to 3-I according to the invention were synthesized in the same manner as in Synthesis Example 3-1 or Synthesis Example 3-2. Further, the molecular weight was measured by GPC. The measurement results are shown in Table 3-1.

TABLE 3-1

| Long-chain alkyl group-containing polymer | Long-chain alkyl group-containing compound (mole ratio) | Monomer (mole ratio) | Weight average molecular weight |
|---|---|---|---|
| 3-C | 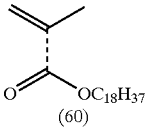 (60) | 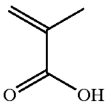 (40) | 65000 |
| 3-D | 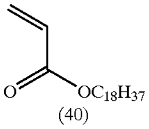 (40) | 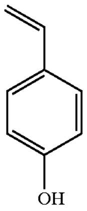 (60) | 65000 |
| 3-E | 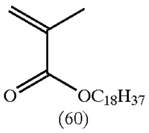 (60) | 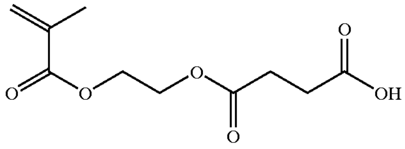 (40) | 68000 |
| 3-F | 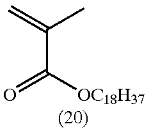 (20) | 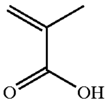 (80) | 60000 |
| 3-G | 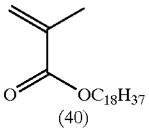 (40) | 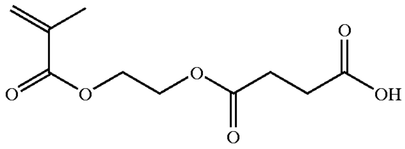 (60) | 68000 |
| 3-H | 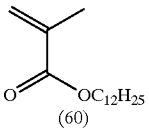 (60) | 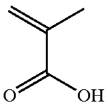 (40) | 60000 |
| 3-I | 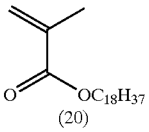 (20) | 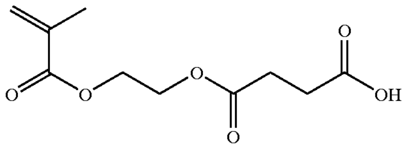 (80) | 68000 |

[Preparation of Support]

Using a 0.3 mm-thick aluminum sheet as defined according to JIS-A-1050, supports 3-A, 3-B, 3-C and 3-D were prepared by treatment comprising a combination of the following steps.

(a) Mechanical Roughening Treatment:

The surface of the aluminum sheet was subjected to mechanical roughening by a rotating roller-shaped nylon brush while supplying a suspension comprising a polishing agent (silica sand) and water and having a specific gravity of 1.12 as a polishing slurry liquid. The polishing agent had a mean particle size of 8 μm and a maximum particle size of 50 μm. The nylon brush was made of nylon 6/10 and had a filling length of 50 mm and a filling diameter of 0.3 mm. The nylon brush was one prepared by boring a ϕ300 mm-stainless steel cylinder and tightly filling fillings in the bores. Three rotating brushes were used. A distance between two supporting rollers (ϕ200 mm) in the lower portion of the brush was 300 mm. The brush rollers were pressed to the aluminum sheet until a load of a driving motor to rotate the brushes became 7 kW plus with respect to the load before pressing. The rotation direction of the brushes was identical with the movement direction of the aluminum sheet. The number of revolution of the brushes was 200 rpm.

(b) Alkali-Etching Treatment:

The resulting aluminum sheet was subjected to etching treatment by spraying an NaOH aqueous solution (concentration: 26% by weight, aluminum ion concentration: 6.5% by weight) at a temperature of 70° C., to dissolve the aluminum sheet in an amount of 6 g/m$^2$, followed by rinsing with well water by spraying.

(c) Desmut Treatment:

The aluminum sheet was subjected to desmut treatment by spraying an aqueous solution having a nitric acid concentration of 1% by weight (containing 0.5% by weight of an aluminum ion) at a temperature of 30° C. and then rinsed with water by spraying. As the nitric acid aqueous solution used for the desmut, was used a waste liquor in the step of undergoing electrochemical roughening using an alternating current in the nitric acid aqueous solution.

(d) Electrochemical Roughening Treatment:

The aluminum sheet was continuously subjected to electrochemical roughening treatment using an alternating current voltage of 60 Hz. At this time, the electrolyte was an aqueous solution of 10.5 g/L of nitric acid (containing 5 g/L of an aluminum ion) at a temperature of 50° C. The electrochemical roughening treatment was carried out by using as an alternating current source waveform a trapezoidal rectangular wave alternating current having a time TP, when the current value reached a peak from zero, of 0.8 msec and a duty ratio of 1:1 and using a carbon electrode as a counter electrode. Ferrite was used as an auxiliary anode. An electrolysis vessel as used was of a radial cell type.

The current density was 30 A/dm$^2$ in terms of the peak value of electric current, and the quantity of electricity was 220 C/dm$^2$ in terms of the total sum of the quantity of electricity when the aluminum sheet was the anode. To the auxiliary anode was divided 5% of the electric current flown from the electric source.

The resulting aluminum sheet was rinsed with well water by spraying.

(e) Alkali-Etching Treatment:

The aluminum sheet was subjected to etching treatment at 32° C. with a solution having a sodium hydroxide concentration of 26% by weight and an aluminum ion concentration of 6.5% by weight by spraying and dissolved in an amount of 0.20 g/M$^2$. Thus, a smut component mainly composed of aluminum hydroxide as formed at the time of the first part electrochemical roughening using an alternating current was removed, and an edge portion of a formed pit was dissolved so that the edge portion was made smooth. Thereafter, the resulting aluminum sheet was rinsed with well water by spraying.

(f) Desmut Treatment:

The aluminum sheet was subjected to desmut treatment by spraying an aqueous solution having a nitric acid concentration of 15% by weight (containing 4.5% by weight of an aluminum ion) at a temperature of 30° C. and then rinsed with well water by spraying. As the nitric acid aqueous solution used for the desmut, was used a waste liquor in the step of undergoing electrochemical roughening using an alternating current in the nitric acid aqueous solution.

(g) Electrochemical Roughening Treatment:

The aluminum sheet was continuously subjected to electrochemical roughening treatment using an alternating current voltage of 60 Hz. At this time, the electrolyte was an aqueous solution of 7.5 g/L of hydrochloric acid (containing 5 g/L of an aluminum ion) at a temperature of 35° C. The electrochemical roughening treatment was carried out by using a rectangular wave alternating current as an alternating current source waveform and by using a carbon electrode as a counter electrode. Ferrite was used as an auxiliary anode. An electrolysis vessel as used was of a radial cell type.

The current density was 25 A/dm$^2$ in terms of the peak value of electric current, and the quantity of electricity was 50 C/dm$^2$ in terms of the total sum of the quantity of electricity when the aluminum sheet was the anode.

The resulting aluminum sheet was rinsed with well water by spraying.

(h) Alkali-Etching Treatment:

The aluminum sheet was subjected to etching treatment at 32° C. with a solution having a sodium hydroxide concentration of 26% by weight and an aluminum ion concentration of 6.5% by weight by spraying and dissolved in an amount of 0.10 g/m$^2$. Thus, a smut component mainly composed of aluminum hydroxide as formed at the time of the first part electrochemical roughening using an alternating current was removed, and an edge portion of a formed pit was dissolved so that the edge portion was made smooth. Thereafter, the resulting aluminum sheet was rinsed with well water by spraying.

(i) Desmut Treatment:

The aluminum sheet was subjected to desmut treatment by spraying an aqueous solution having a sulfuric acid concentration of 25% by weight (containing 0.5% by weight of an aluminum ion) at a temperature of 60° C. and then rinsed with well water by spraying.

(j) Anodic Oxidation Treatment:

Sulfuric acid was used as an electrolyte. The electrolyte had a sulfuric acid concentration of 170 g/L (containing 0.5% by weight of an aluminum ion) and a temperature of 43° C. Thereafter, the aluminum sheet was rinsed with well water by spraying.

An electric current density was about 30 A/dm$^2$, and a final oxidized film amount was 2.7 g/m$^2$.

(k) Treatment with Alkali Metal Silicate:

The aluminum support obtained by the anodic oxidation treatment was subjected to treatment with an alkali metal silicate (silicate treatment) by immersing it into a treatment tank containing an aqueous solution of 1% by weight of No. 3 sodium silicate at a temperature of 30° C. Thereafter, the aluminum sheet was rinsed with well water by spraying. An amount of the silicate as attached was 3.8 mg/m$^2$.

<Support 3-A>

The respective steps (a) to (k) were carried out in order, and the etching amount in the step (e) was 3.4 g/m$^2$. There was thus prepared a support 3-A.

<Support 3-B>

The same respective steps as in the preparation of the support 3-A were followed in order, except for omitting the steps (g), (h) and (i). There was thus prepared a support 3-B.

<Support 3-C>

The same respective steps as in the preparation of the support A were followed in order, except for omitting the steps (a), (g), (h) and (i). There was thus prepared a support 3-C.

<Support 3-D>

The same respective steps as in the preparation of the support 3-A were followed in order, except that the steps (a), (d), (e) and (f) and that the total sum of the quantity of electricity was 450 C/dm$^2$. There was thus prepared a support 3-D.

On each of the thus obtained supports 3-A, 3-B, 3-C and 3-D was subsequently provided the following undercoat layer.

(Formation of Undercoat Layer)

On the thus obtained aluminum support after the treatment with alkali metal silicate was applied an undercoat solution having the following composition and dried at 80° C. for 15 seconds. The coverage after drying was 18 mg/$m^2$.

| <Composition of coating solution for undercoat layer> | |
|---|---|
| High-molecular compound as described below: | 0.3 g |
| Methanol: | 100 g |
| Water: | 1.0 g |

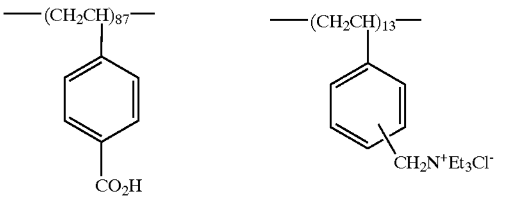

Weight average molecular weight: 18,000

[Positive-Working Lithographic Printing Plate Precursor]

[Example 3-1]

On the obtained support 3-B was applied the following coating solution 3-1 for recording layer at a coverage of 1.0 g/$m^2$ and dried at 140° C. for 50 seconds by PERFECT OVEN PH200 (manufactured by TABAI) while setting Wind Control at 7, to form a recording layer. There was thus obtained a positive-working lithographic printing plate precursor of Example 3-1.

| <Coating solution 3-1 for recording layer> | |
|---|---|
| Long-chain alkyl group-containing polymer 3-A: | 0.28 g |
| m,p-Cresol novolak (m/p molar ratio: 6/4, weight average molecular weight: 3,500, content of unreacted cresol: 0.5% by weight): | 0.474 g |
| Specified copolymer 3-1 (having a composition as set forth below): | 2.37 g |
| Infrared ray absorber, IR-1 (having a structure as set forth below): | 0.155 g |
| 2-Methoxy-4-(N-phenylamino)benzenediazonium hexafluorophosphate: | 0.03 g |
| Tetrahydrophthalic anhydride: | 0.19 g |
| Ethyl Violet in which the counter ion is substituted with a 6-hydroxy-β-naphthalene-sulfonic acid ion: | 0.05 g |
| Fluorine-based surfactant (MEGAFACE F176PF (solids content: 20% by weight), manufactured by DAINIPPON INK AND CHEMICALS INCORPORATED): | 0.035 g |
| p-Toluenesulfonic acid: | 0.008 g |
| Bis-p-hydroxyphenyl sulfone: | 0.063 g |
| γ-Butyrolactone: | 13 g |
| Methyl ethyl ketone: | 24 g |
| 1-Methoxy-2-propanol: | 11 g |

-Specified Copolymer 3-1-

N-(p-aminosulfonylphenyl) methacrylamide/ethyl methacrylate/acrylonitrile (mole %: 32/43/25), weight average molecular weight: 53,000, which can be synthesized by the method as described in JP-A-11-288093.

IR-1

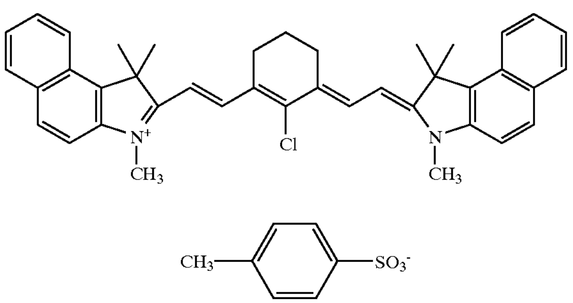

[Example 3-2]

On the obtained support 3-B was applied the following coating solution 3-2 for recording layer at a coverage after drying of 1.8 g/$m^2$ and dried under the same conditions as in Example 3-1, to form a recording layer. There was thus obtained a lithographic printing plate precursor of Example 3-2.

| <Coating solution 3-2 for recording layer> | |
|---|---|
| Long-chain alkyl group-containing polymer 3-A: | 0.09 g |
| Novolak resin (resin (3-B)) (m/p-cresol molar ratio: 6/4, weight average molecular weight: 7,000, content of unreacted cresol: 0.5% by weight): | 0.90 g |
| Ethyl methacrylate/isobutyl meth-acrylate/methacrylic acid copolymer (mole %: 35/35/30): | 0.10 g |
| Infrared ray absorber, IR-1 (having a structure as set forth above): | 0.1 g |
| Phthalic anhydride: | 0.05 g |
| p-Toluenesulfonic acid | 0.002 g |
| Ethyl Violet in which the counter ion is substituted with a 6-hydroxy-β-naphthalene-sulfonic acid ion: | 0.02 g |
| Fluorine-based polymer (DEFENSA F-176 (solids content: 20% by weight), manufactured by DAINIPPON INK AND CHEMICALS INCORPORATED): | 0.015 g |
| Fluorine-based polymer (DEFENSA MCF-312 (solids content: 30% by weight), manufactured by DAINIPPON INK AND CHEMICALS INCORPORATED): | 0.035 g |
| Methyl ethyl ketone: | 12 g |

[Examples 3—3 to 3-10]

Lithographic printing plate precursors of Examples 3—3 to 3-10 were obtained in the same manner as in Example 3-1, except that the kind of the support was changed to one set forth in Table 3-5 and that in the coating solution 3-1 for recording layer of Example 3-1, the long-chain alkyl group-containing polymer 3-A was replaced by each of the long-chain alkyl group-containing polymers as shown in Table 3-2.

TABLE 3-2

| | Example No. | | | | | | | |
|---|---|---|---|---|---|---|---|---|
| | 3-3 | 3-4 | 3-5 | 3-6 | 3-7 | 3-8 | 3-9 | 3-10 |
| Long-chain alkyl group- | 3-B | 3-C | 3-D | 3-E | 3-F | 3-G | 3-H | 3-I |

TABLE 3-2-continued

| | Example No. | | | | | | | |
|---|---|---|---|---|---|---|---|---|
| | 3-3 | 3-4 | 3-5 | 3-6 | 3-7 | 3-8 | 3-9 | 3-10 |
| containing polymer No. | | | | | | | | |

Comparative Example 3-1

A lithographic printing plate precursor of Comparative Example 3-1 was obtained in the same manner as in Example 3-1, except that in the coating solution 3-1 for recording layer of Example 3-1, the long-chain alkyl group-containing polymer was not added.

Comparative Example 3-2

A lithographic printing plate precursor of Comparative Example 3-2 was obtained in the same manner as in Example 3-2, except that in the coating solution 3-2 for recording layer of Example 3-2, the long-chain alkyl group-containing polymer was not added.

Example 3-11

On the support 3-A was applied the following coating solution 3—3 for recording layer at a coverage after drying of 2.0 g/m$^2$ and dried at 130° C. for 50 seconds by PERFECT OVEN PH200 (manufactured by TABAI) while setting Wind Control at 7. Thereafter, the following coating solution 3-4 for recording layer was applied at a coverage of 0.40 g/m$^2$ and dried at 140° C. for one minute. There was thus obtained a lithographic printing plate precursor having a double-layered structure of Example 3-11.

| | |
|---|---|
| <Coating solution 3-3 for recording layer> | |
| N-(4-Aminosulfonylphenyl) methacrylamide/acrylonitrile/methyl methacrylate copolymer (mole %: 36/34/30, weight average molecular weight: 50,000, acid value: 2.65): | 2.133 g |
| Infrared ray absorber, IR-1 (having a structure as set forth above): | 0.134 g |
| 4,4'-Bishydroxyphenyl sulfone: | 0.126 g |
| Tetrahydrophthalic anhydride: | 0.190 g |
| p-Toluenesulfonic acid: | 0.008 g |
| 3-Methoxy-4-diazodiphenylamine hexafluorophosphate: | 0.032 g |
| Ethyl Violet in which the counter ion is substituted with a 6-hydroxy-β-naphthalene-sulfonic acid ion: | 0.781 g |
| MEGAFACE F176 (a coating surface-improving fluorine-based surfactant (solids content: 20% by weight), manufactured by DAINIPPON INK AND CHEMICALS INCORPORATED): | 0.035 g |
| Methyl ethyl ketone: | 25.41 g |
| 1-Methoxy-2-propanol: | 12.97 g |
| γ-Butyrolactone: | 13.18 g |
| <Coating solution 3-4 for recording layer> | |
| m,p-Cresol novolak (m/p molar ratio: 6/4, weight average molecular weight: 4,500, content of unreacted cresol: 0.8% by weight): | 0.3479 g |
| Infrared ray absorber, IR-1 (having a structure as set forth above): | 0.0192 g |
| 30 weight % MEK solution of ethyl methacrylate/isobutyl methacrylate/acrylic acid copolymer (mole %: 37/37/26): | 0.1403 g |

-continued

| | |
|---|---|
| Long-chain alkyl group-containing polymer 3-A: | 0.034 g |
| MAGAFACE F176 (20% by weight) (a fluorine-based surfactant manufactured by DAINIPPON INK AND CHEMICALS INCORPORATED): | 0.022 g |
| MAGAFACE MCF-312 (30% by weight) (a fluorine-based surfactant manufactured by DAINIPPON INK AND CHEMICALS INCORPORATED): | 0.011 g |
| Methyl ethyl ketone: | 13.07 g |
| 1-Methoxy-2-propanol: | 7.7 g |

Example 3-12

A lithographic printing plate precursor having a double-layered structure of Example 3-12 was obtained in the same manner as in Example 3-11, except that the coating solution 3—3 for recording layer was replaced by a coating solution 3-5 for recording layer having the following composition and that the coating solution 3-4 for recording layer was replaced by a coating solution 3-6 for recording layer.

| | |
|---|---|
| <Coating solution 3-5 for recording layer> | |
| N-(4-Aminosulfonylphenyl) methacrylamide/acrylonitrile/ methyl methacrylate copolymer (mole %: 36/34/30, weight average molecular weight: 50,000, acid value: 2.65): | 2.133 g |
| Infrared ray absorber, IR-1 (having a structure as set forth above): | 0.109 g |
| 4,4'-Bishydroxyphenyl sulfone: | 0.126 g |
| Tetrahydrophthalic anhydride: | 0.190 g |
| p-Toluenesulfonic acid: | 0.008 g |
| 3-Methoxy-4-diazodiphenylamine hexafluoro-phosphate: | 0.030 g |
| Ethyl Violet in which the counter ion is substituted with a 6-hydroxy-β-naphthalene-sulfonic acid ion: | 0.100 g |
| MEGAFACE F176 (a fluorine-based surfactant (solids content: 20% by weight), manufactured by DAINIPPON INK AND CHEMICALS INCORPORATED): | 0.035 g |
| Methyl ethyl ketone: | 25.38 g |
| 1-Methoxy-2-propanol: | 13.0 g |
| γ-Butyrolactone: | 13.2 g |
| <Coating solution 3-6 for recording layer> | |
| m,p-Cresol novolak (m/p molar ratio: 6/4, weight average molecular weight: 4,500, content of unreacted cresol: 0.8% by weight): | 0.3478 g |
| Infrared ray absorber, IR-1 (having a structure as set forth above): | 0.0192 g |
| Long-chain alkyl group-containing polymer 3-A: | 0.034 g |
| Ammonium compound as used in Example 2 of JP-A-2001-398047: | 0.0115 g |
| MAGAFACE F176 (20% by weight) (a fluorine-based surfactant manufactured by DAINIPPON INK AND CHEMICALS INCORPORATED): | 0.022 g |
| Methyl ethyl ketone: | 13.07 g |
| 1-Methoxy-2-propanol: | 6.79 g |

Examples 3-13 to 3-20

Lithographic printing plate precursors of Examples 3-13 to 3-20 were obtained in the same manner as in Example 3-11, except that the kind of the support was changed to one set forth in Table 3-5 and that in the coating solution 3-4 for recording layer of Example 3-11, the long-chain alkyl group-containing polymer 3-A was replaced by each of the long-chain alkyl group-containing polymers as shown in Table 3—3.

TABLE 3-3

| | Example No. | | | | | | | |
|---|---|---|---|---|---|---|---|---|
| | 3-13 | 3-14 | 3-15 | 3-16 | 3-17 | 3-18 | 3-19 | 3-20 |
| Long-chain alkyl group-containing polymer No. | 3-B | 3-C | 3-D | 3-E | 3-F | 3-G | 3-H | 3-I |

Examples 3-21 to 3-28

Lithographic printing plate precursors of Examples 3-21 to 3-28 were obtained in the same manner as in Example 3-12, except that the kind of the support was changed to one set forth in Table 3-5 and that in the coating solution 3-6 for recording layer of Example 3-12, the long-chain alkyl group-containing polymer 3-A was replaced by each of the long-chain alkyl group-containing polymers as shown in Table 3-4.

TABLE 3-4

| | Example No. | | | | | | | |
|---|---|---|---|---|---|---|---|---|
| | 3-21 | 3-22 | 3-23 | 3-24 | 3-25 | 3-26 | 3-27 | 3-28 |
| Long-chain alkyl group-containing polymer No. | 3-B | 3-C | 3-D | 3-E | 3-F | 3-G | 3-H | 3-I |

Comparative Example 3—3

A lithographic printing plate precursor of Comparative Example 3—3 was obtained in the same manner as in Example 3-11, except that the support 3-A was changed to the support 3-B and that in the coating solution 3-4 for recording layer of Example 3-11, the long-chain alkyl group-containing polymer was not added.

[Evaluation of Lithographic Printing Plate Precursors of Examples 3-1 to 3-28 and Comparative Examples 3-1 to 3—3]

(Evaluation of Shape of Fine Protrusions Present on the Surface of Recording Layer)

The surface of the recording layer of the lithographic printing plate precursor thus obtained was observed by an electron microscope. As a result, it was confirmed that fine protrusions were uniformly formed over the entire surface. Next, the particle size of the particles forming the fine protrusions was measured by the electron microscopic observation. The measurement was carried out with respect to 20 places, to determine a mean particle size. The mean particle size is shown in Table 3-5.

(Evaluation of Scratch Resistance)

Each of the obtained lithographic printing plate precursors was scratched using a scratching tester (manufactured by HEIDON) while applying a load on a sapphire stylus (tip diameter: 1.0 mm). Immediately thereafter, the resulting lithographic printing plate precursor was developed at a liquid temperature of 30° C. for a development time of 12 seconds using a PS processor, LP940H (manufactured by FUJI PHOTO FILM CO., LTD.) charged with a developing solution, DT-2 (diluted in a ratio of 1:8, manufactured by FUJI PHOTO FILM CO., LTD.) and a finisher, FG-1 (diluted in a ratio of 1:1, manufactured by FUJI PHOTO FILM CO., LTD.). At this time, the developing solution had a conductivity of 43 mS/cm. The load when the scratches could not be visually observed was defined as a value of scratch resistance. As the numerical value is large, the scratch resistance is evaluated to be superior. The results are shown in Table 3-5.

(Evaluation of Development Latitude)

Each of the obtained lithographic printing plate precursors was preserved under conditions of a temperature of 25° C. and a relative humidity of 50% for 5 days and then imagewise drawn with a test pattern by Trendsetter 3244 (manufactured by CREO) under conditions of an infrared laser beam intensity of 9.0 W and a drum rotation speed of 150 rpm.

Thereafter, the amount of water of each of the following alkaline developing solutions 3-A and 3-B was changed to vary a dilution ratio, thereby preparing developing solutions having a varied conductivity. The developing solution was charged in a PS processor, 900H (manufactured by FUJI PHOTO FILM CO., LTD.), and the exposed lithographic printing plate precursor was developed at a liquid temperature of 30° C. for a development time of 22 seconds. At this time, a difference between a highest conductivity and a lowest conductivity, as exhibited by the developing solution with which the development was well carried out without elution of the image portion and staining and coloration caused by a residual film of the photo-sensitive layer due to poor development, was evaluated as the development latitude. As the numerical value is large, the development latitude is evaluated to be superior. The results are shown in Table 3-5.

| | |
|---|---|
| <Composition of alkaline developing solution 3-A> | |
| $SiO_2 \cdot K_2O$ ($K_2O/SiO_2$ = 1/1 (molar ratio)): | 4.0 weight % |
| Citric acid: | 0.5 weight % |
| Polyethylene glycol lauryl ether (weight average molecular weight: 1,000): | 0.5 weight % |
| Water: | 95.0 weight % |
| <Composition of alkaline developing solution 3-B> | |
| D-Sorbitol: | 2.5 weight % |
| Sodium hydroxide: | 0.85 weight % |
| Polyethylene glycol lauryl ether (weight average molecular weight: 1,000): | 0.5 weight % |
| Water: | 96.15 weight % |

(Evaluation of Sensitivity)

Each of the obtained lithographic printing plate precursors was imagewise drawn with a test pattern by Trendsetter 3244VFS (manufactured by CREO) while changing the exposure energy. Thereafter, the exposed lithographic printing plate precursor was developed with an alkaline developing solution having an intermediate (average) conductivity between the highest conductivity and the lowest conductivity in the foregoing evaluation of development latitude, as exhibited by the developing solution with which the development was well carried out without elution of the image portion and staining and coloration caused by a residual film of the photo-sensitive layer due to poor development, and an exposure amount (beam intensity at a drum rotation speed of 150 rpm) by which the non-image portion could be developed with this developing solution was measured and defined as a sensitivity. As the numerical value is small, the sensitivity is evaluated to be superior.

TABLE 3-5

| | Long-chain alkyl group-containing polymer | Development latitude (mS/cm) | | Sensitivity (W) | | Scratch resistance (g) | Particle size of surface protrusions (μm) | Support |
|---|---|---|---|---|---|---|---|---|
| | | Developing solution 3-A | Developing solution 3-B | Developing solution 3-A | Developing solution 3-B | | | |
| Example 3-1 | 3-A | 6 | 7 | 5.5 | 5.5 | 8 | 0.5 | 3-B |
| Example 3-2 | 3-A | 6 | 6.5 | 5.5 | 5.5 | 8 | 0.5 | 3-B |
| Example 3-3 | 3-B | 6 | 6.5 | 5.0 | 5.0 | 9 | 0.8 | 3-A |
| Example 3-4 | 3-C | 6 | 7 | 5.5 | 5.0 | 9 | 0.8 | 3-B |
| Example 3-5 | 3-D | 6 | 7 | 5.5 | 5.5 | 8 | 0.5 | 3-C |
| Example 3-6 | 3-E | 6 | 6.5 | 5.5 | 5.5 | 8 | 0.5 | 3-D |
| Example 3-7 | 3-F | 6 | 6.5 | 5.5 | 5.5 | 7 | 0.3 | 3-B |
| Example 3-8 | 3-G | 6 | 7 | 5.5 | 5.5 | 7 | 0.3 | 3-B |
| Example 3-9 | 3-H | 6 | 7 | 5.5 | 5.5 | 6 | 0.1 | 3-B |
| Example 3-10 | 3-I | 7 | 7 | 5.5 | 5.5 | 6 | 0.1 | 3-B |
| Example 3-11 | 3-A | 7 | 7.5 | 5.5 | 5.5 | 10 | 0.5 | 3-A |
| Example 3-12 | 3-A | 7 | 8.0 | 5.5 | 6.0 | 10 | 0.5 | 3-A |
| Example 3-13 | 3-B | 7 | 7.5 | 5.5 | 6.0 | 12 | 0.8 | 3-B |
| Example 3-14 | 3-C | 7 | 7.5 | 5.5 | 5.5 | 12 | 0.8 | 3-C |
| Example 3-15 | 3-D | 7 | 7.5 | 5.5 | 5.5 | 10 | 0.5 | 3-B |
| Example 3-16 | 3-E | 7 | 7.5 | 5.5 | 5.5 | 11 | 0.5 | 3-B |
| Example 3-17 | 3-F | 7 | 7.5 | 5.5 | 6.0 | 9 | 0.3 | 3-B |
| Example 3-18 | 3-G | 7 | 7.5 | 5.5 | 5.5 | 9 | 0.3 | 3-B |
| Example 3-19 | 3-H | 8 | 7.5 | 5.5 | 5.5 | 8 | 0.1 | 3-B |
| Example 3-20 | 3-I | 8 | 7.5 | 5.5 | 5.5 | 8 | 0.1 | 3-B |
| Example 3-21 | 3-B | 8 | 8.0 | 5.5 | 6.0 | 12 | 0.8 | 3-B |
| Example 3-22 | 3-C | 8 | 8.0 | 5.5 | 5.5 | 12 | 0.8 | 3-C |
| Example 3-23 | 3-D | 8 | 8.0 | 5.5 | 5.5 | 10 | 0.5 | 3-B |
| Example 3-24 | 3-E | 8 | 8.0 | 5.5 | 6.0 | 11 | 0.5 | 3-B |
| Example 3-25 | 3-F | 8 | 8.0 | 5.5 | 5.5 | 9 | 0.3 | 3-B |
| Example 3-26 | 3-G | 8 | 8.0 | 5.5 | 5.5 | 9 | 0.3 | 3-B |
| Example 3-27 | 3-H | 8 | 8.0 | 5.5 | 6.0 | 8 | 0.1 | 3-B |
| Example 3-28 | 3-I | 8 | 8.0 | 5.5 | 5.5 | 8 | 0.1 | 3-B |
| Comparative Example 3-1 | Not added | 6 | 6.5 | 6.5 | 6.5 | 2 | Nil | 3-B |
| Comparative Example 3-2 | Not added | 7 | 7.5 | 7.0 | 7.0 | 3 | Nil | 3-B |
| Comparative Example 3-3 | Not added | 7.5 | 7.5 | 7.0 | 7.0 | 5.0 | Nil | 3-B |

As is clear from Table 3-5, it was confirmed that in the lithographic printing plate precursors of Examples 3-1 to 3-28, to each of which the image recording material of the invention was applied, fine protrusions were formed on the surface of the recording layer. Further, it was noted that the lithographic printing plate precursors of Examples 3-1 to 3-28 were superior in the scratch resistance and sensitivity as compared with those of Comparative Examples 3-1 to 3—3, which did not contain the long-chain alkyl group-containing polymer. Moreover, it was confirmed that the lithographic printing plate precursors of Examples 3-1 to 3-28 exhibited good development latitude, hardly generated a residual film in the non-image portion, and hardly caused a reduction of the density in the image portion.

According to the invention, by using an image recording material having good scratch resistance and wide development latitude and freed from the problem of the transfer to rollers and a protective paper (laminated paper) and the back surface of a support during the manufacture or conveying and by using the image recording material as a recording layer, it is possible to provide a lithographic printing plate precursor for infrared laser for direct plate-making having the same properties.

This application is based on Japanese Patent application JP 2002-332267, filed Nov. 15, 2002, Japanese Patent application JP 2002-283417, filed Sep. 27, 2002, and Japanese Patent application JP 2003-1923, filed Jan. 8, 2003 the entire contents of those are hereby incorporated by reference, the same as if set forth at length.

What is claimed is:

1. A lithographic printing plate precursor comprising a support and a recording layer, the recording layer comprising (a) an infrared ray absorber, (c) a water-insoluble and alkali-soluble resin, and (d) a polymer having a structural unit represented by the following formula (IV):

(IV)

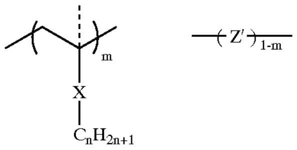

wherein a bond represented by a broken line means that a methyl group or a hydrogen atom is present in an end terminal thereof, X represents a divalent linking group, Z' represents a divalent hydrophilic group, m is from 0.2 to 0.95 and n represents an integer of from 6 to 40, a solubility of the recording layer in an alkaline aqueous solution increasing upon exposure with infrared laser.

* * * * *